US012684777B2

(12) United States Patent
Fujimura et al.

(10) Patent No.: US 12,684,777 B2
(45) Date of Patent: Jul. 14, 2026

(54) THREE-DIMENSIONAL MEMORY DEVICE CONTAINING PHOSPHORUS-DOPED SILICON OXIDE ION-GETTERING STRUCTURES AND METHODS OF FORMING THE SAME

(71) Applicant: WESTERN DIGITAL TECHNOLOGIES, INC., San Jose, CA (US)

(72) Inventors: Nobuyuki Fujimura, Yokkaichi (JP); Tadashi Nakamura, Yokkaichi (JP); Satoshi Shimizu, Yokkaichi (JP); Takumi Moriyama, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 394 days.

(21) Appl. No.: 18/479,432

(22) Filed: Oct. 2, 2023

(65) Prior Publication Data
US 2025/0113486 A1      Apr. 3, 2025

(51) Int. Cl.
| | |
|---|---|
| *H10B 43/27* | (2023.01) |
| *H10B 80/00* | (2026.01) |
| *H10W 90/00* | (2026.01) |
| *H10W 80/00* | (2026.01) |

(52) U.S. Cl.
CPC ............. *H10B 43/27* (2023.02); *H10B 80/00* (2023.02); *H10W 90/00* (2026.01); *H10W 80/211* (2026.01); *H10W 80/312* (2026.01); *H10W 80/327* (2026.01); *H10W 90/792* (2026.01)

(58) Field of Classification Search
CPC ......... H10B 43/27; H10B 80/00; H01L 24/08; H01L 24/80; H01L 25/0657; H01L 25/18; H10L 25/50; H10W 90/00
See application file for complete search history.

(56) References Cited

U.S. PATENT DOCUMENTS

| | | |
|---|---|---|
| 8,102,694 B2 | 1/2012 | Herner et al. |
| 8,766,414 B2 | 7/2014 | Herner et al. |
| 9,023,719 B2 | 5/2015 | Pachamuthu et al. |

(Continued)

OTHER PUBLICATIONS

ISR-WO—Notification of Transmittal of The International Search Report and Written Opinion of the International Searching Authority for International Patent Application No. PCT/US2024/031417, mailed Sep. 12, 2024, 11 pages.

(Continued)

*Primary Examiner* — Michael Jung
(74) *Attorney, Agent, or Firm* — THE MARBURY LAW GROUP PLLC

(57) ABSTRACT
A three-dimensional memory device includes a pair of alternating stacks of insulating layers and electrically conductive layers, where the pair of alternating stacks are laterally spaced from each other by a lateral isolation trench, memory openings vertically extending through a respective alternating stack of the pair of alternating stacks, memory opening fill structures located in a respective one of the memory openings and including a respective vertical semiconductor channel and a respective vertical stack of memory elements, and a lateral isolation trench fill structure located in the lateral isolation trench. Phosphorus-doped silicon oxide portions are located within or on sidewalls of the lateral isolation trench at levels of the insulating layers.

18 Claims, 52 Drawing Sheets

(56) References Cited

U.S. PATENT DOCUMENTS

| | | | |
|---|---|---|---|
| 9,230,979 | B1 | 1/2016 | Pachamuthu et al. |
| 9,460,931 | B2 | 10/2016 | Pachamuthu et al. |
| 9,524,976 | B2 | 12/2016 | Pachamuthu et al. |
| 9,576,967 | B1 | 2/2017 | Kimura et al. |
| 9,659,956 | B1 | 5/2017 | Pachamuthu et al. |
| 9,754,958 | B2 | 9/2017 | Pachamuthu et al. |
| 9,842,851 | B2 | 12/2017 | Pachamuthu et al. |
| 10,685,978 | B1 | 6/2020 | Lu et al. |
| 10,685,979 | B1 | 6/2020 | Lu et al. |
| 10,748,925 | B1 | 8/2020 | Tsutsumi et al. |
| 10,748,927 | B1 | 8/2020 | Tsutsumi et al. |
| 10,804,282 | B2 | 10/2020 | Baraskar et al. |
| 10,903,222 | B2 | 1/2021 | Sakakibara et al. |
| 10,943,917 | B2 | 3/2021 | Iwai et al. |
| 10,964,715 | B2 | 3/2021 | Kakazu et al. |
| 11,088,252 | B2 | 8/2021 | Kasai |
| 11,101,284 | B2 | 8/2021 | Pachamuthu et al. |
| 11,302,714 | B2 | 4/2022 | Cui et al. |
| 11,387,166 | B2 | 7/2022 | Kitazawa |
| 11,552,100 | B2 | 1/2023 | Cui et al. |
| 11,600,634 | B2 | 3/2023 | Cui et al. |
| 2015/0076580 | A1 | 3/2015 | Pachamuthu et al. |
| 2015/0279857 | A1 | 10/2015 | Kim et al. |
| 2016/0218059 | A1* | 7/2016 | Nakada ................. H10B 41/27 |
| 2016/0358933 | A1* | 12/2016 | Rabkin ............... H10D 64/037 |
| 2017/0125437 | A1 | 5/2017 | Pachamuthu et al. |
| 2017/0125438 | A1 | 5/2017 | Pachamuthu et al. |
| 2020/0251479 | A1 | 8/2020 | Sakakibara et al. |
| 2020/0251486 | A1 | 8/2020 | Tsutsumi et al. |
| 2020/0251488 | A1* | 8/2020 | Iwai ....................... H10B 43/27 |
| 2020/0395408 | A1* | 12/2020 | Takahashi ........... H10B 63/845 |
| 2021/0159149 | A1 | 5/2021 | Kitazawa |
| 2022/0028890 | A1 | 1/2022 | Xia et al. |
| 2022/0045091 | A1 | 2/2022 | Cui et al. |
| 2023/0240070 | A1 | 7/2023 | Funayama et al. |
| 2024/0260266 | A1* | 8/2024 | Hosoda ................. H10B 43/10 |
| 2024/0349500 | A1* | 10/2024 | Zhou ..................... H10B 43/27 |

OTHER PUBLICATIONS

Eldridge, J.M et al., "Sodium Ion Drift through Phosphosilicate Glass—$SiO_2$ Films," *Journal of The Electrochemical Society*, vol. 118, No. 6, p. 986, (1976), DOI: 10.1149/1.2408238.

Endoh et al., "Novel Ultra High-Density Memory with a Stacked-Surrounding Gate Transistor (S-SGT) Structured Cell," IEDM Proc. (2001) 33-36.

Hermansen, C. et al., "Structure-topology-property correlations of sodium phosphosilicate glasses," *Journal Chemistry Phys.*, vol. 143, No. 6, p. 064510 (2015), https://doi.org/10.1063/1.4928330.

http://www.enigmatic-consulting.com/semiconductor_processing/selected_shorts/Gettering.html, viewed on Oct. 2, 2023.

Miyabe, D. et al., "Structure and formation mechanism of six-fold coordinated silicon in phosphosilicate glasses," *Physical Review B*, vol. 71, No. 17, pp. 1-4, DOI:10.1103/PhysRevB.71.172202.

IPRP-WO—Notification Concerning International Preliminary Report on Patentability and Written Opinion of the International Searching Authority for International Patent Application No. PCT/US2024/031417, mailed Apr. 9, 2026, 7 pages.

* cited by examiner

THREE-DIMENSIONAL MEMORY DEVICE CONTAINING PHOSPHORUS-DOPED SILICON OXIDE ION-GETTERING STRUCTURES AND METHODS OF FORMING THE SAME

FIELD

The present disclosure relates generally to the field of semiconductor devices, and particularly to a three-dimensional memory device including phosphorus-doped silicon oxide ion-gettering structures around lateral isolation trenches and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes a pair of alternating stacks of insulating layers and electrically conductive layers, where the pair of alternating stacks are laterally spaced from each other by a lateral isolation trench, memory openings vertically extending through a respective alternating stack of the pair of alternating stacks, memory opening fill structures located in a respective one of the memory openings and including a respective vertical semiconductor channel and a respective vertical stack of memory elements, and a lateral isolation trench fill structure located in the lateral isolation trench. Phosphorus-doped silicon oxide portions are located within or on sidewalls of the lateral isolation trench at levels of the insulating layers.

According to another aspect of the present disclosure, a method of forming a three-dimensional memory device is provided. The method comprises: forming two alternating stacks of insulating layers and electrically conductive layers, wherein the two alternating stacks are laterally spaced from each other by a lateral isolation trench; forming memory openings through each of the two alternating stacks; forming memory opening fill structures comprising a respective vertical semiconductor channel and a respective vertical stack of memory elements in the respective memory openings; forming phosphorus-doped silicon oxide portions within or on sidewalls of the lateral isolation trench at levels of the insulating layers; and forming a lateral isolation trench fill structure in the lateral isolation trench.

DETAILED DESCRIPTION

Figure 1:
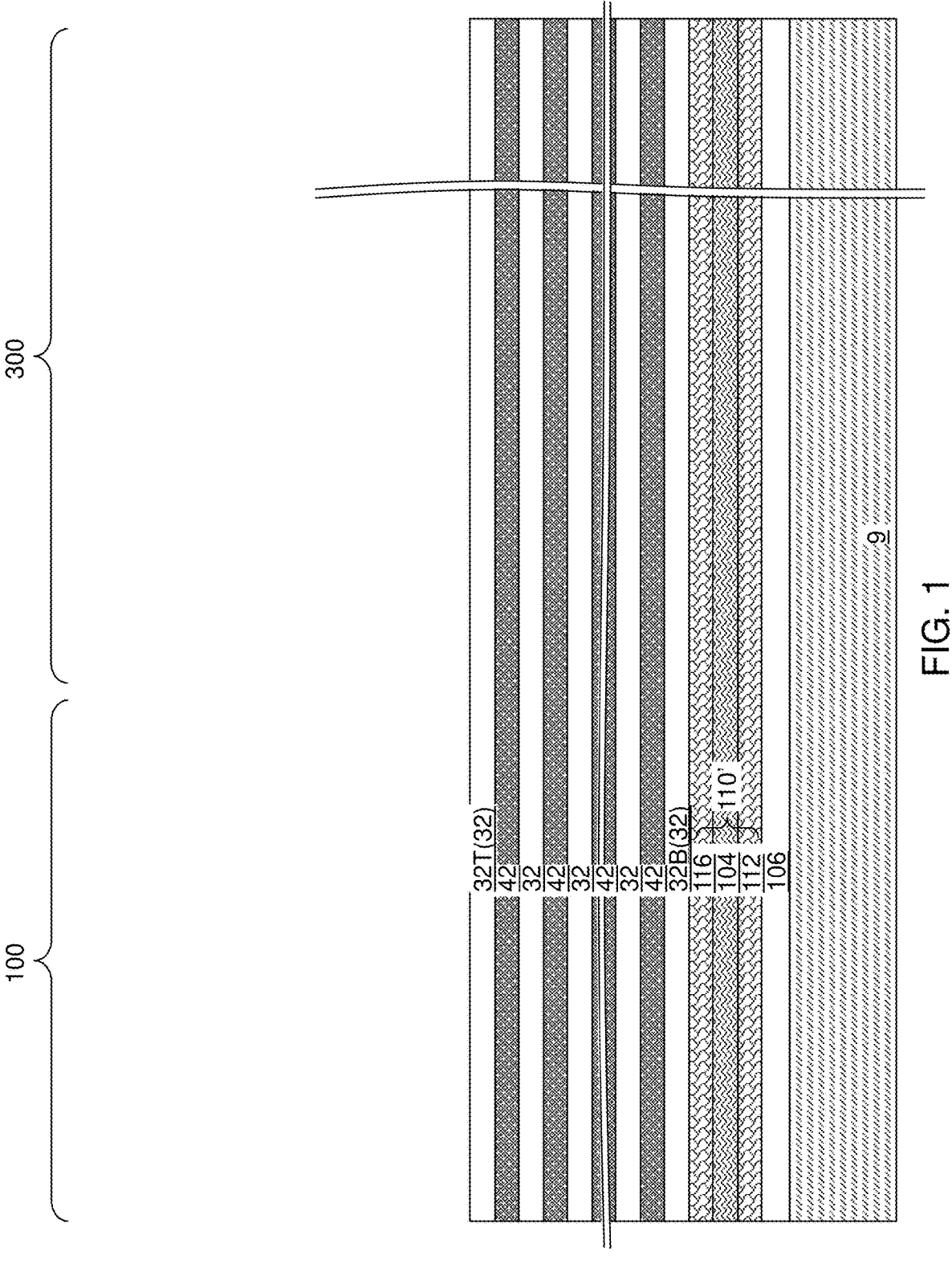
FIG. 1 is a schematic vertical cross-sectional view of a first exemplary structure for forming a memory die after formation of a stopper insulating layer, in-process source-level material layers, and an alternating stack of insulating layers and sacrificial material layers over a carrier substrate according to a first embodiment of the present disclosure.

As discussed above, the embodiments of the present disclosure are directed to a three-dimensional semiconductor device including phosphorus-doped or both phosphorus and carbon-doped silicon oxide ion-gettering structures around lateral isolation trenches, and methods for manufacturing the same, the various aspects of which are described below. Embodiments of the disclosure can be employed to form various structures including a multilevel memory structure, non-limiting examples of which include semiconductor devices such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to a first embodiment of the present disclosure is illustrated. The first exemplary structure comprises a carrier substrate 9, which may be a semiconductor substrate or a conductive substrate. For example, the carrier substrate 9 may comprise a commercially available silicon wafer. Alternatively, the carrier substrate 9 may comprise any material that may be removed selective the materials of insulating layers 32 and dielectric material portions to be subsequently formed.

An insulating material layer can be formed on a top surface of the carrier substrate 9. The insulating material layer can be subsequently employed as a stopping material layer for a process that removes the carrier substrate 9, and is herein referred to as a stopper insulating layer 106, or as a backside pad dielectric layer. If a polishing process such as a chemical mechanical polishing process is employed to subsequently remove the carrier substrate 9, the stopper insulating layer 106 may be subsequently employed as a polishing stopper material layer. If an etch process such as a wet etch process is employed to subsequently remove the carrier substrate 9, the stopper insulating layer 106 may be subsequently employed as an etch stop material layer. In one embodiment, the stopper insulating layer 106 comprises a dielectric material such as undoped silicate glass, a doped silicate glass, or silicon nitride. The thickness of the stopper insulating layer 106 may be in a range from 50 nm to 600 nm, such as from 100 nm to 300 nm, although lesser and greater thicknesses may also be employed.

In-process source-level material layers 110' can be formed over the stopper insulating layer 106. The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, an optional lower sacrificial liner (not shown), a source-level sacrificial layer 104, an optional upper sacrificial liner (not shown), and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

In one embodiment, the first conductivity type may be p-type, and the second conductivity type may be n-type. In one embodiment, the lower source-level semiconductor layer 112 and the upper source-level semiconductor layer 116 may include arsenic or phosphorus atoms as n-type dopants. The atomic concentration of arsenic or phosphorus atoms in the lower source-level semiconductor layer 112 and the upper source-level semiconductor layer 116 may be independently in a range from $1.0\times10^{18}/cm^3$ to $1.0\times10^{20}/cm^3$, such as from $5.0\times10^{18}/cm^3$ to $5.0\times10^{20}/cm^3$, although lesser and greater atomic concentrations may also be employed.

The source-level sacrificial layer 104 includes a sacrificial material that may be removed selective to the lower sacrificial liner (or selective to the lower source-level semiconductor layer 112) and the upper sacrificial liner (or selective to the upper source-level semiconductor layer 116). In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used. The lower sacrificial liner (if present) and the upper sacrificial liner (if present) include materials that may function as an etch stop material during removal of the source-level sacrificial layer 104. For example, the lower sacrificial liner and the upper sacrificial liner may include silicon oxide, silicon nitride, and/or a dielectric metal oxide. In one embodiment, each of the lower sacrificial liner and the upper sacrificial liner may include a silicon oxide layer having a thickness in a range from 2 nm to 30 nm, although lesser and greater thicknesses may also be used.

An alternating stack of first material layers and second material layers can be formed over the in-process source-level material layers 110'. In an alternative embodiment, the in-process source-level material layers 110' and the stopper insulating layer 106 may be omitted, and the alternating stack is formed directly on a surface of the carrier substrate 9. In another alternative embodiment described below with respect to FIG. 20, a peripheral circuit is formed on the same substrate as the alternating stack. For example, the peripheral circuit may comprise word line driver regions, bit line driver regions, sense amplifier regions, input/output buffer regions, etc. In this alternative embodiment, a separate logic die containing the peripheral circuit described below with respect to FIG. 16 may be omitted. In this alternative embodiment, the alternating stack may be deposited on the in-process source-level material layers 110' or the in-process source-level material layers 110' may be omitted, and the alternating stack may be deposited on the stopper insulating layer 106.

In the alternating stack, the first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the in-process source-level material layers 110'. The insulating layers 32 comprise an insulating material such as undoped silicate glass or a doped silicate glass, and the sacrificial material layers 42 comprise a sacrificial material, such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is an insulating layer 32 that is most proximal to the carrier substrate 9 is herein referred to as a bottommost insulating layer 32B.

Each of the insulating layers 32 other than the topmost insulating layer 32T may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32T may have a thickness of about one half of the thickness of other insulating layers 32.

The first exemplary structure comprises a memory array region 100 in which a three-dimensional array of memory elements is to be subsequently formed, and a contact region 300 in which layer contact via structures contacting word lines are to be subsequently formed.

Figure 2:
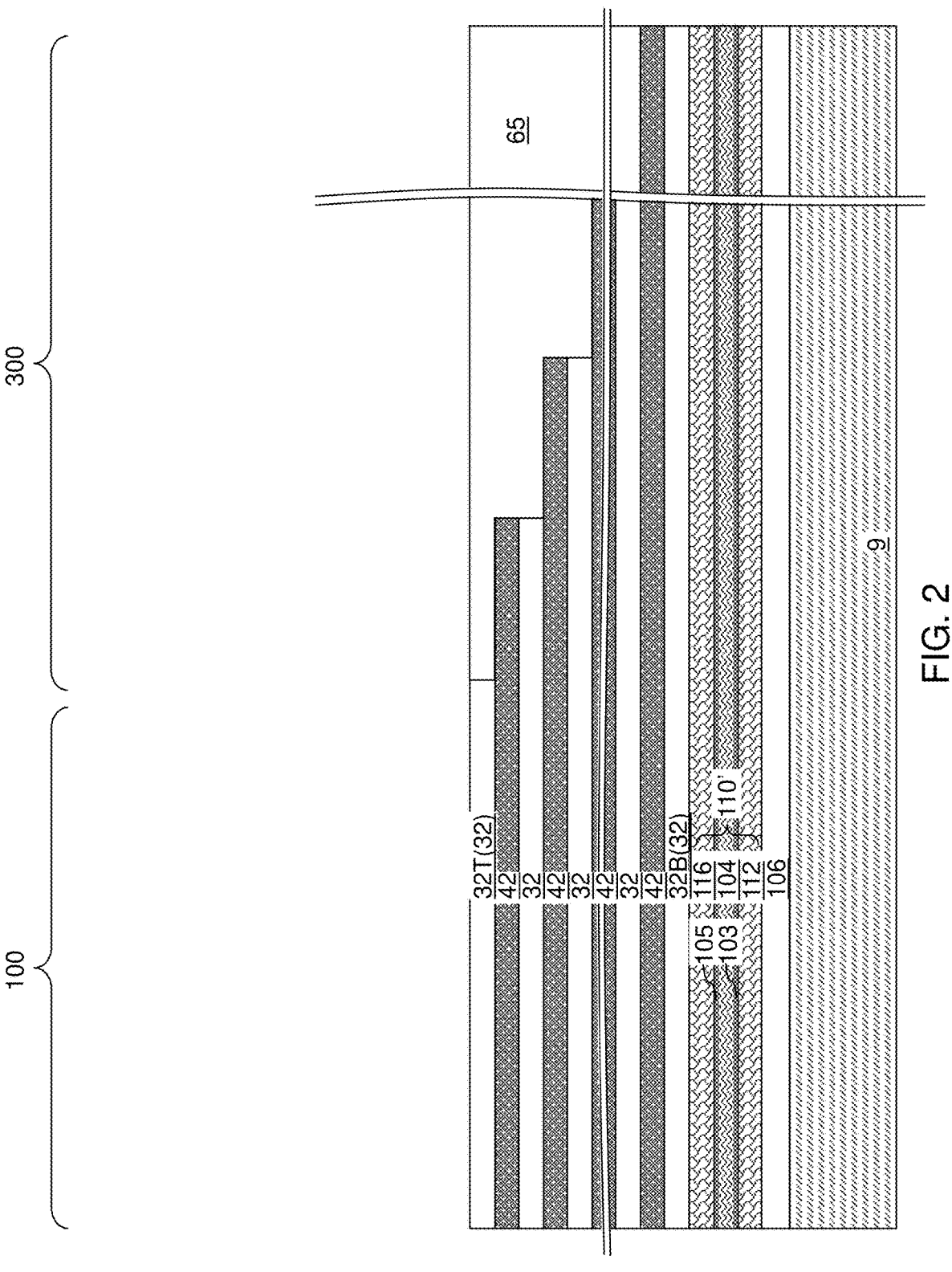
FIG. 2 is a schematic vertical cross-sectional view of the first exemplary structure after formation of stepped surfaces and a retro-stepped dielectric material portion according to the first embodiment of the present disclosure.

Referring to FIG. 2, stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the in-process source-level material layers 110'. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures (not shown) can be formed through the topmost insulating layer 32T and a subset of the sacrificial material layers 42 located at drain-select-levels. The drain-select-level isolation structures can be formed, for example, by forming drain-select-level lateral isolation trenches and filling the drain-select-level lateral isolation trenches with a dielectric material such as silicon oxide. Excess portions of the dielectric material can be removed from above the top surface of the topmost insulating layer 32T.

Figure 3A:
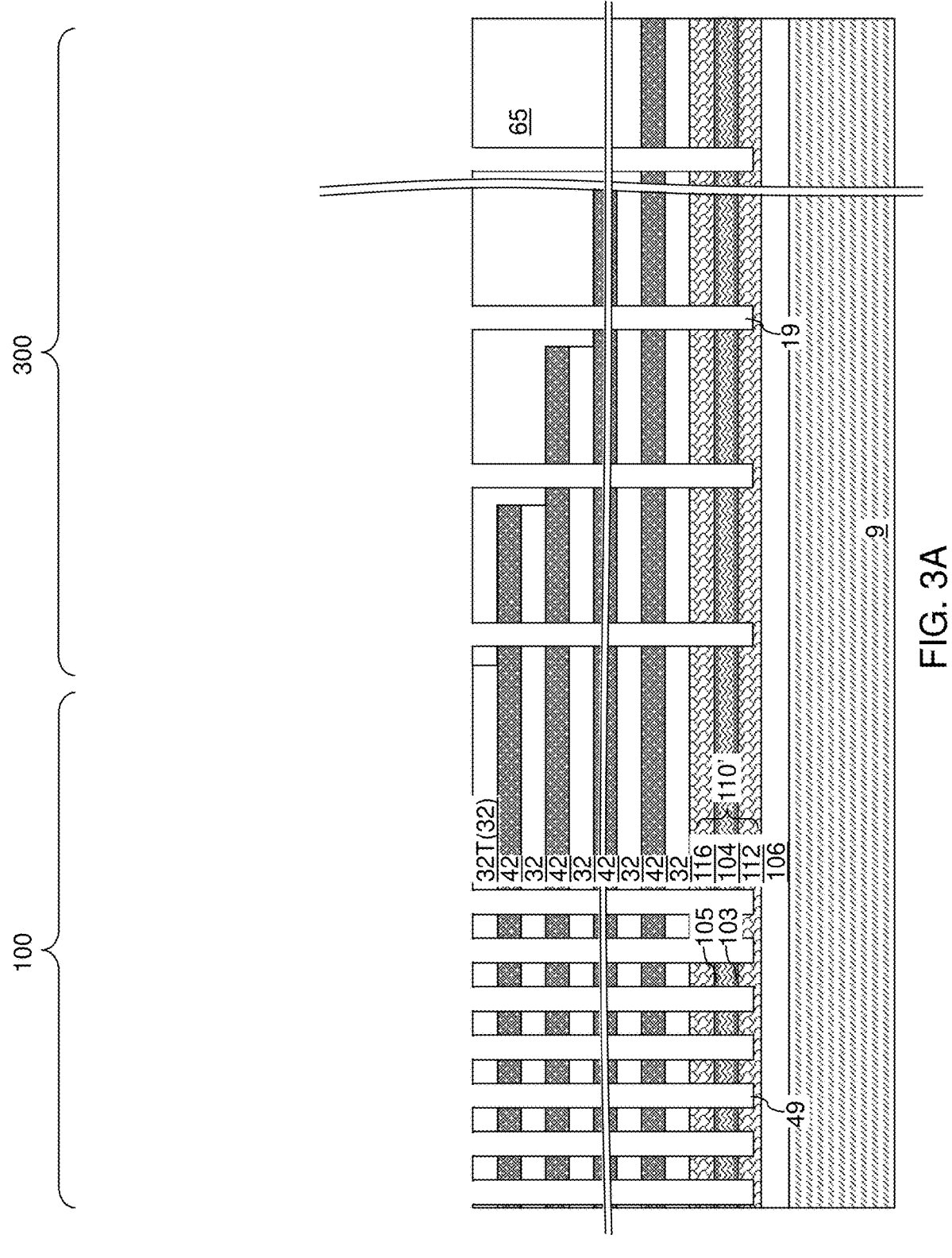
FIG. 3A is a schematic vertical cross-sectional view of the first exemplary structure after forming memory openings and support openings according to the first embodiment of the present disclosure.
Figure 3B:
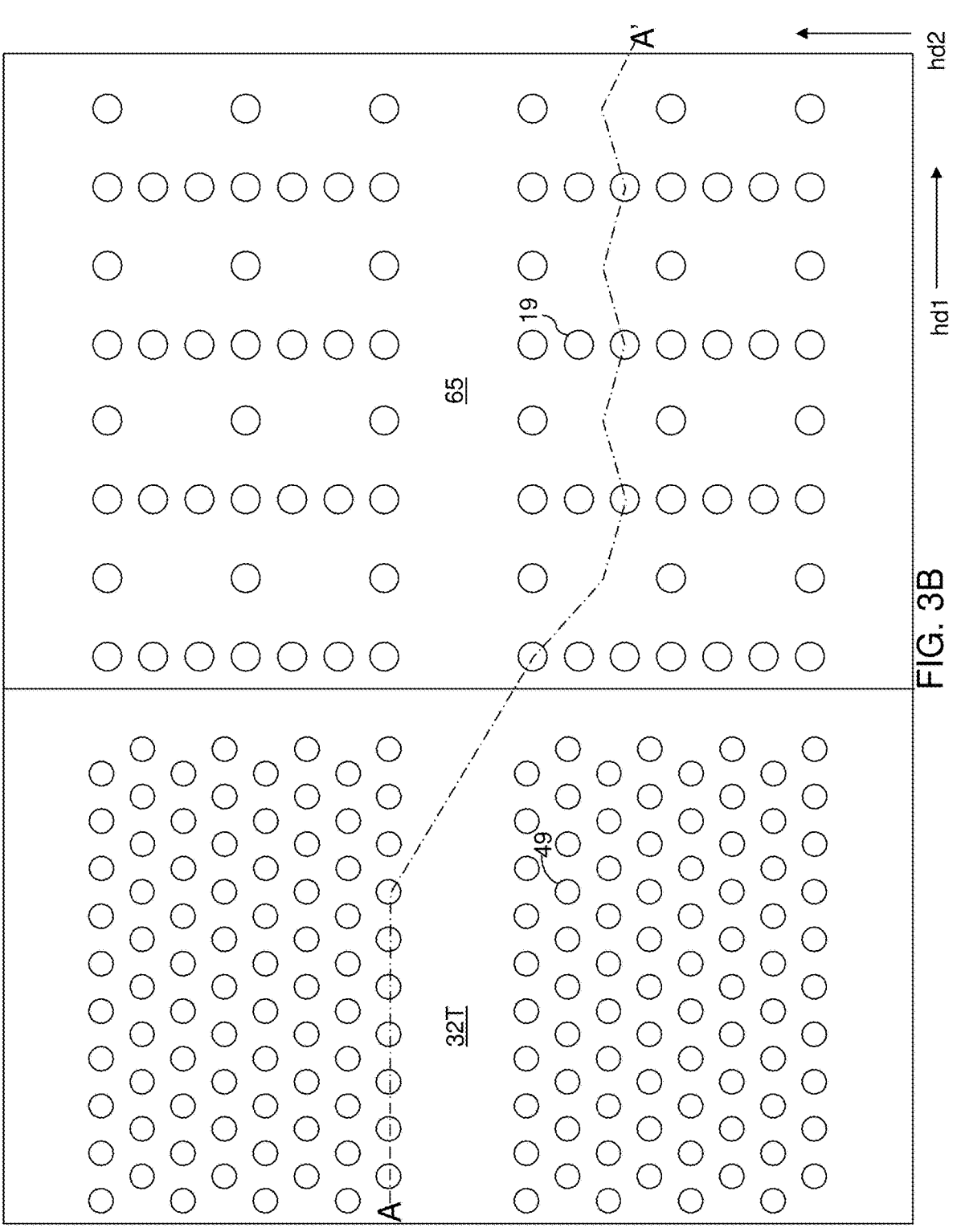
FIG. 3B is a top-down view of the first exemplary structure of FIG. 3A. The vertical plane A-A' is the cut plane of the vertical cross-sectional view of FIG. 3A.

Referring to FIGS. 3A-3C, an etch mask layer (not shown) can be formed over the alternating stack (32, 42), and can be lithographically patterned to form various openings therein. An anisotropic etch process can be performed to transfer the pattern of the openings in the etch mask layer through the alternating stack (32, 42). Various openings can be formed through the alternating stack (32, 42). The various openings may comprise memory openings 49 that are formed in the memory array region 100 and support openings 19 that are formed in the contact region 300. Each of the memory openings 49 and the support openings 19 can vertically extend through the alternating stack (32, 42) and into the in-process source-level material layers 110' In one embodiment, bottom surfaces of the memory openings 49 and the support openings 19 may be formed within the lower source-level semiconductor layer 112 or at an interface between the lower source-level semiconductor layer and the stopper insulating layer 106.

The support openings 19 may have a diameter in a range from 60 nm to 400 nm, such as from 120 nm to 300 nm, although lesser and greater thicknesses may be employed. The memory openings 49 may have a diameter in a range from 60 nm to 400 nm, such as from 120 nm to 300 nm, although lesser and greater thicknesses may be employed.

In one embodiment, the memory array region 100 may be laterally spaced apart from the contact region 300 along a first horizontal direction hd1. The memory openings 49 may comprise rows of memory openings 49 that are arranged along the first horizontal direction hd1 and laterally spaced apart along a second horizontal direction hd2 that is perpendicular to the first horizontal direction hd2. Multiple clusters of memory openings 49, each containing a respective two-dimensional periodic array of memory openings 49, may be formed in the memory array region 100. The clusters of memory openings 49 may be laterally spaced apart along the second horizontal direction hd2.

Figure 4:
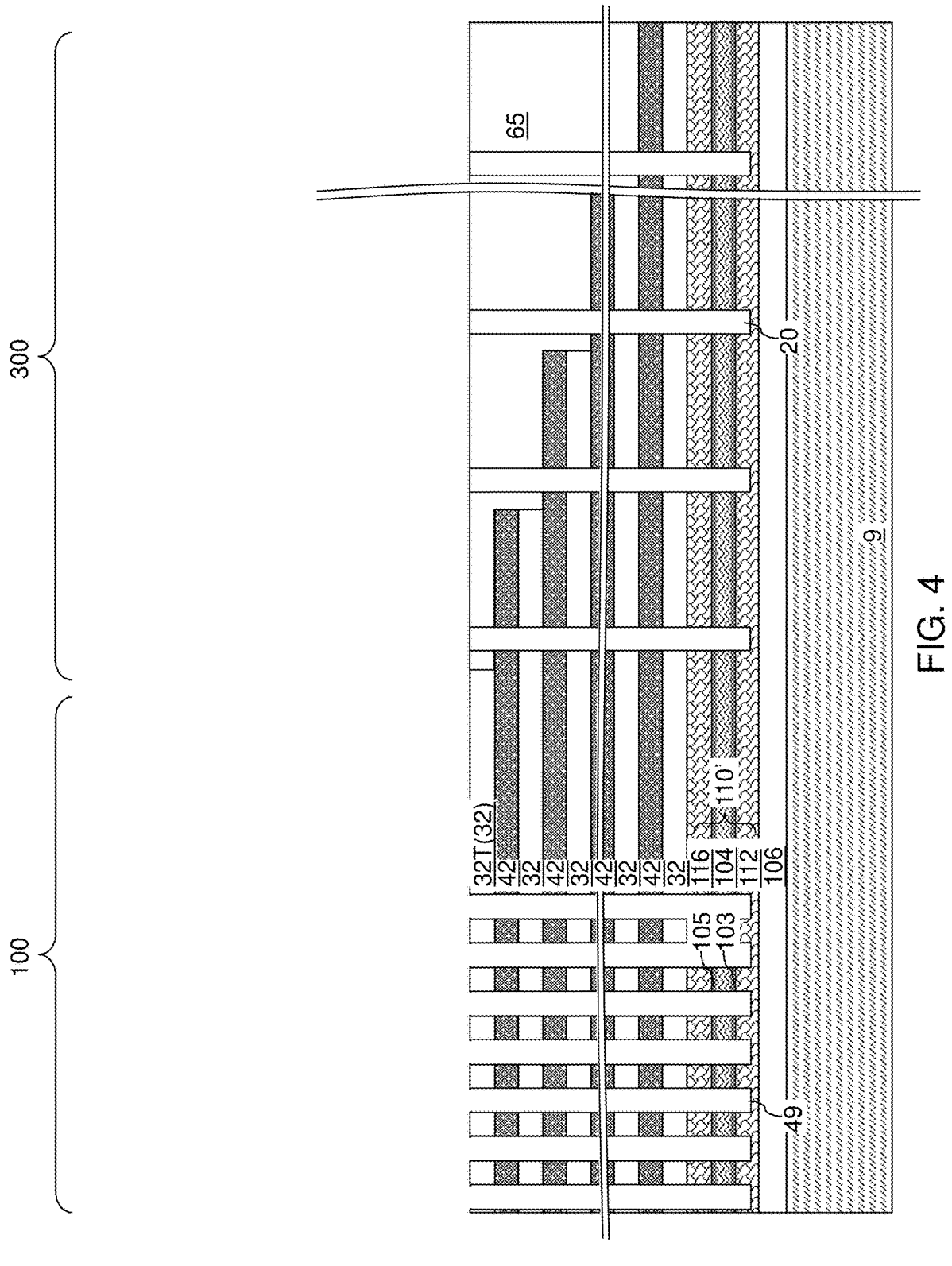
FIG. 4 is a schematic vertical cross-sectional view of the first exemplary structure after formation of support pillar structures according to the first embodiment of the present disclosure.

Referring to FIG. 4, an optional etch stop liner (not shown) and a sacrificial fill material (not shown) can be deposited in the memory openings 49 and the support openings. The optional etch stop liner (if present) comprises a thin dielectric material layer comprising silicon oxide, silicon nitride, or a dielectric metal oxide and having a thickness in a range from 1 nm to 6 nm. The sacrificial fill material may comprise a carbon-based material (such as amorphous carbon or diamond-like carbon), a semiconductor material (such as amorphous silicon or polysilicon), a dielectric fill material (such as borosilicate glass or organosilicate glass), or a polymer material. Excess portions of the sacrificial fill material can be removed from above the horizontal plane including the topmost layer of the alternating stack (32, 42) by a planarization process such as an etch back process. Remaining portions of the sacrificial fill material that fill the memory openings 49 and the support openings 19 constitute sacrificial memory opening fill structures (not shown) and sacrificial support opening fill structures (not shown).

A photoresist layer (not shown) can be applied over the alternating stack (32, 42) and the retro-stepped dielectric material portion 65, and can be lithographically patterned to cover the memory array region 100 without covering the contact region 300. The sacrificial support opening fill structures and portions of the optional etch stop liner in the contact region 300 can be removed selective to the materials of the retro-stepped dielectric material portion 65 and the alternating stack (32, 42). For example, an etch process or an ashing process may be employed to remove the sacrificial support opening fill structures and portions of the optional etch stop liner in the contact region 300. The photoresist layer can be subsequently removed.

A dielectric fill material such as silicon oxide can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the retro-stepped dielectric material portion 65 during replacement of the sacrificial material layers 42 with electrically conductive layers.

Subsequently, the sacrificial memory opening fill structures and portions of the optional etch stop liner in the memory array region 100 can be removed selective to the materials of the retro-stepped dielectric material portion 65 and the alternating stack (32, 42). For example, an etch process or an ashing process may be employed to remove the sacrificial memory opening fill structures and portions of the optional etch stop liner in the memory array region 100. Voids are formed in the volumes of the memory openings 49.

FIGS. 5A-5D are sequential vertical cross-sectional views of a memory opening 49 during formation of a NAND string (e.g., a dummy NAND string or a data storage NAND string) which is referred to below as a "memory opening fill structure" 58 according to an embodiment of the present disclosure.

Figures 5A, 5B:
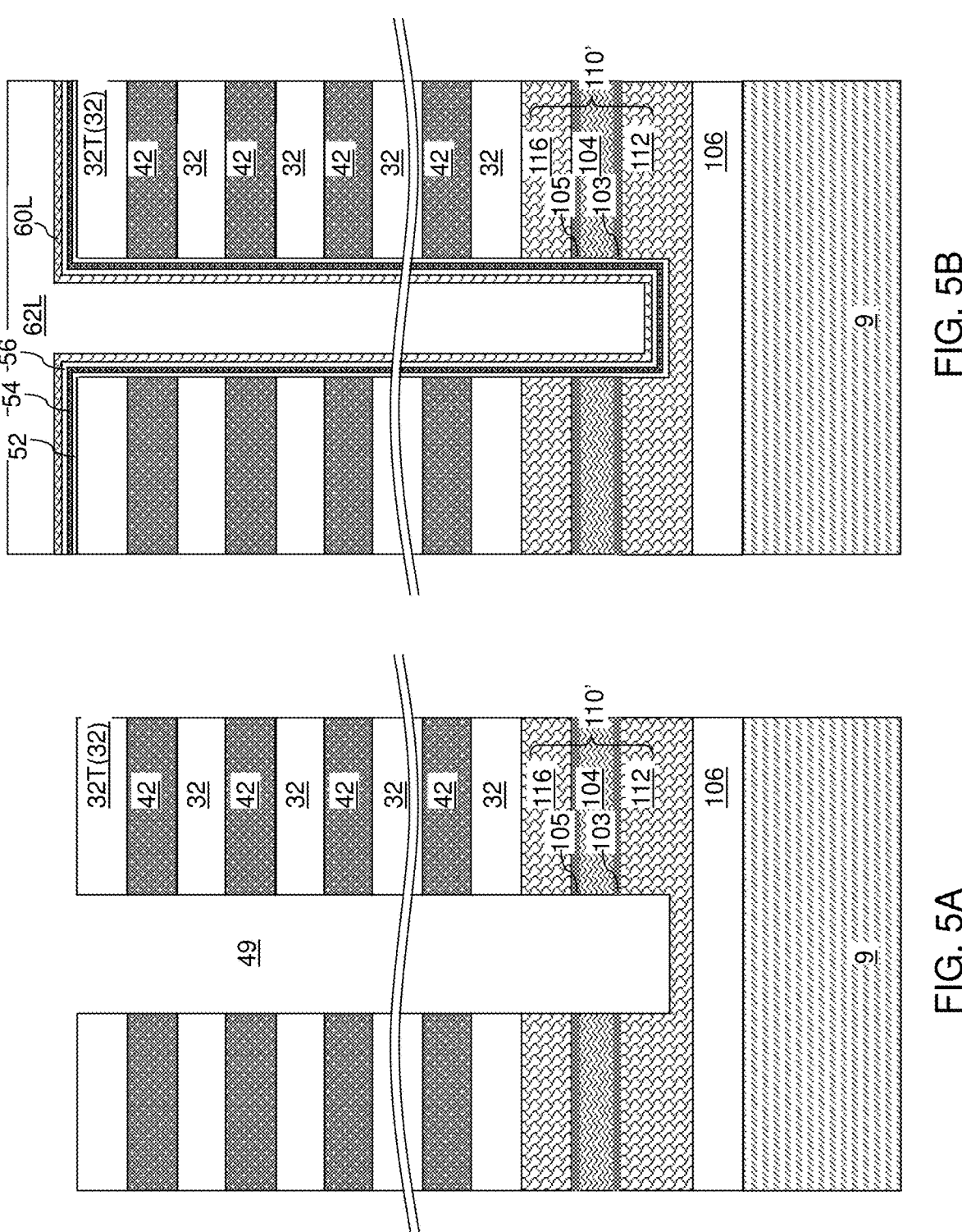
FIGS. 5A-5D are sequential vertical cross-sectional views of a memory opening during formation of a memory opening fill structure according to the first embodiments of the present disclosure.

Referring to FIG. 5A, a memory opening 49 is illustrated after the processing steps of FIG. 4.

Referring to FIG. 5B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride). In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0 \times 10^{13}/cm^3$ to $3.0 \times 10^{17}/cm^3$, such as $1.0 \times 10^{14}/cm^3$ to $3.0 \times 10^{16}/cm^3$, although lesser and greater atomic concentrations may also be employed. A dielectric core layer 62L comprising a dielectric fill material can be deposited in remaining volumes of the memory openings 49 and over the alternating stack (32, 42).

Figures 5C, 5D:
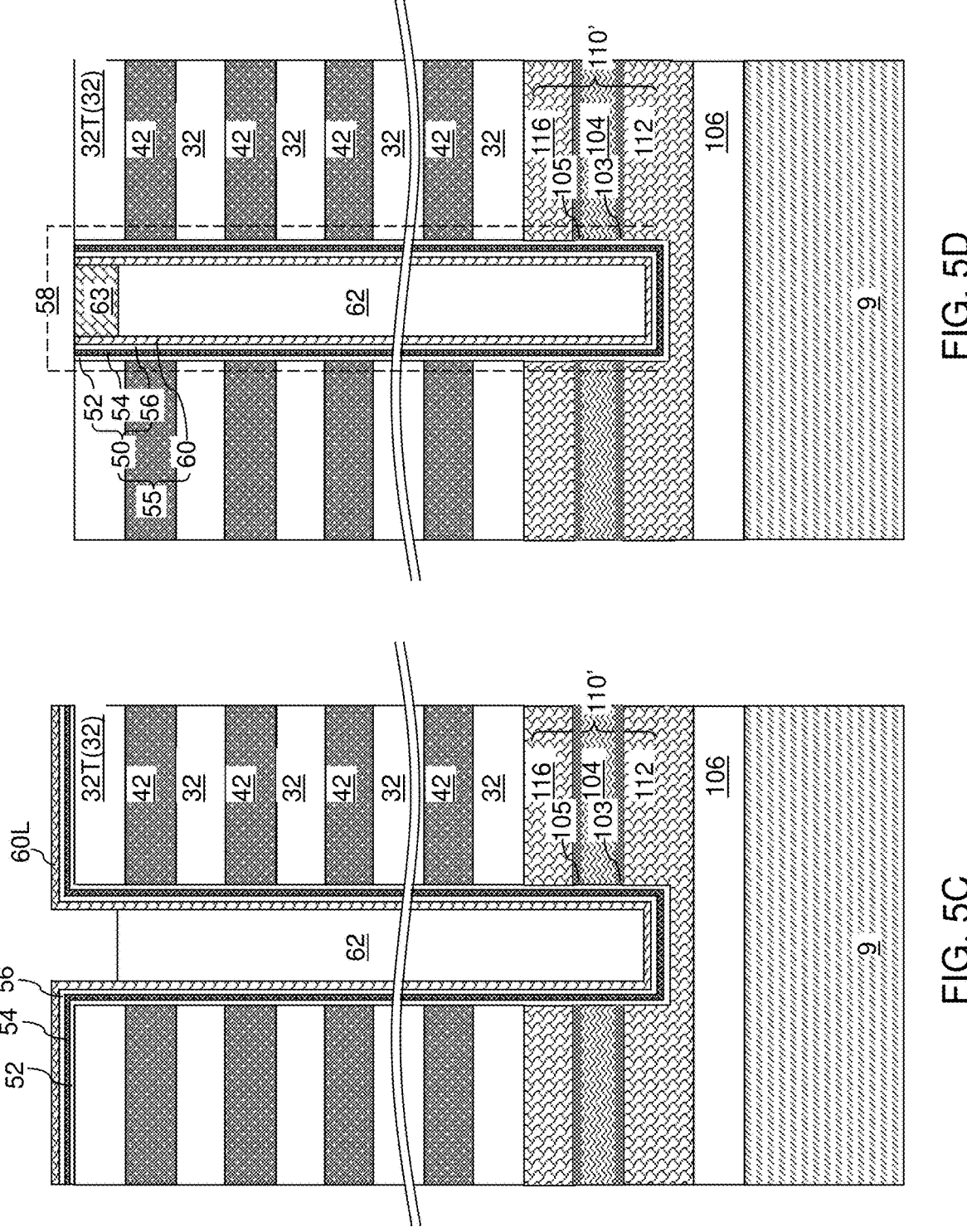

Referring to FIG. 5C, the dielectric core layer 62L can be vertically recessed such that each remaining portion of the dielectric core layer 62L has a top surface at, or about, the horizontal plane including the bottom surface of the topmost insulating layers 32T. Each remaining portion of the dielectric core layer 62L constitutes a dielectric core 62.

Referring to FIG. 5D, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel material layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel material layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42.

Figure 6A:
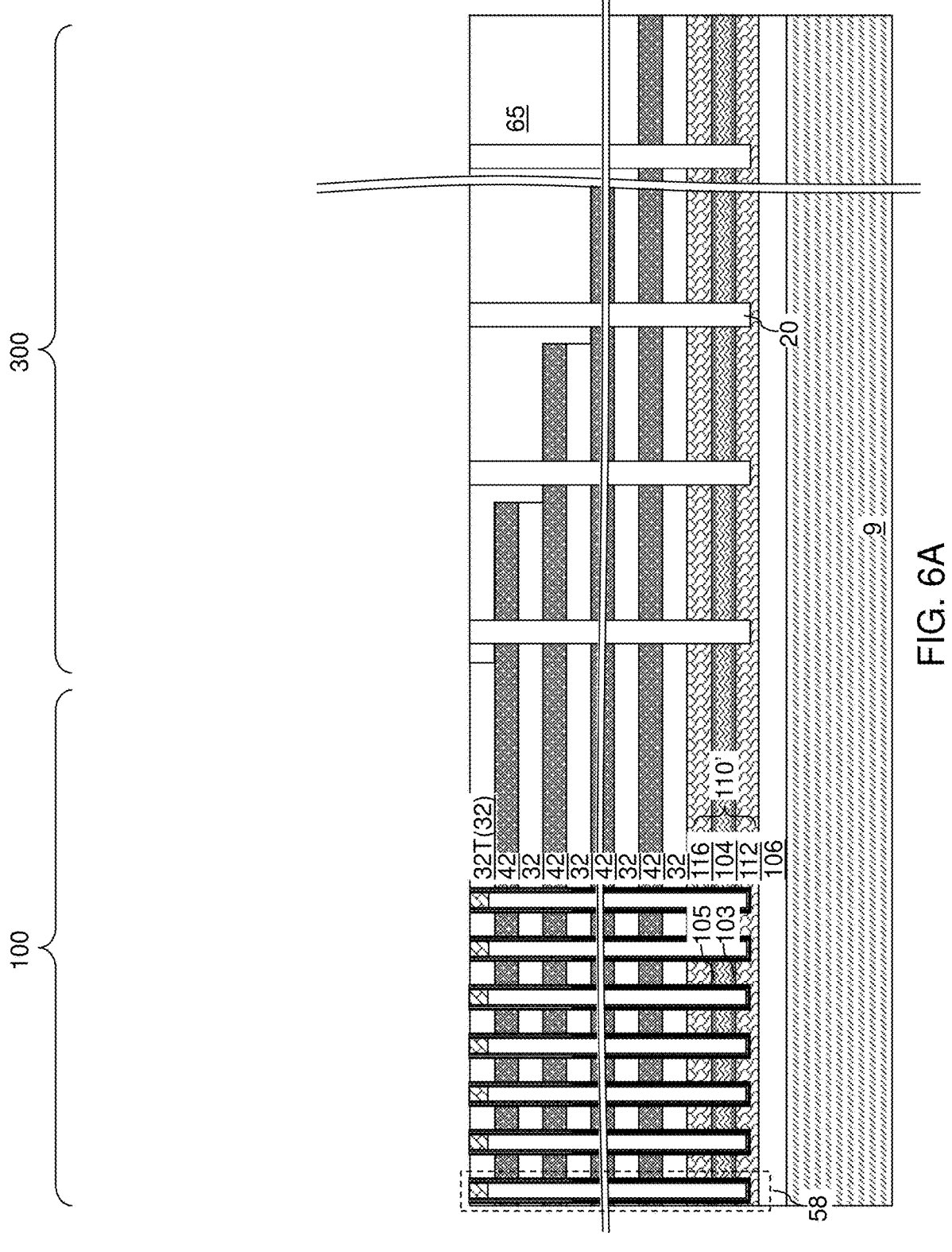
FIG. 6A is a vertical cross-sectional view of the first exemplary structure after formation of memory opening fill structures according to the first embodiment of the present disclosure.
Figure 6B:
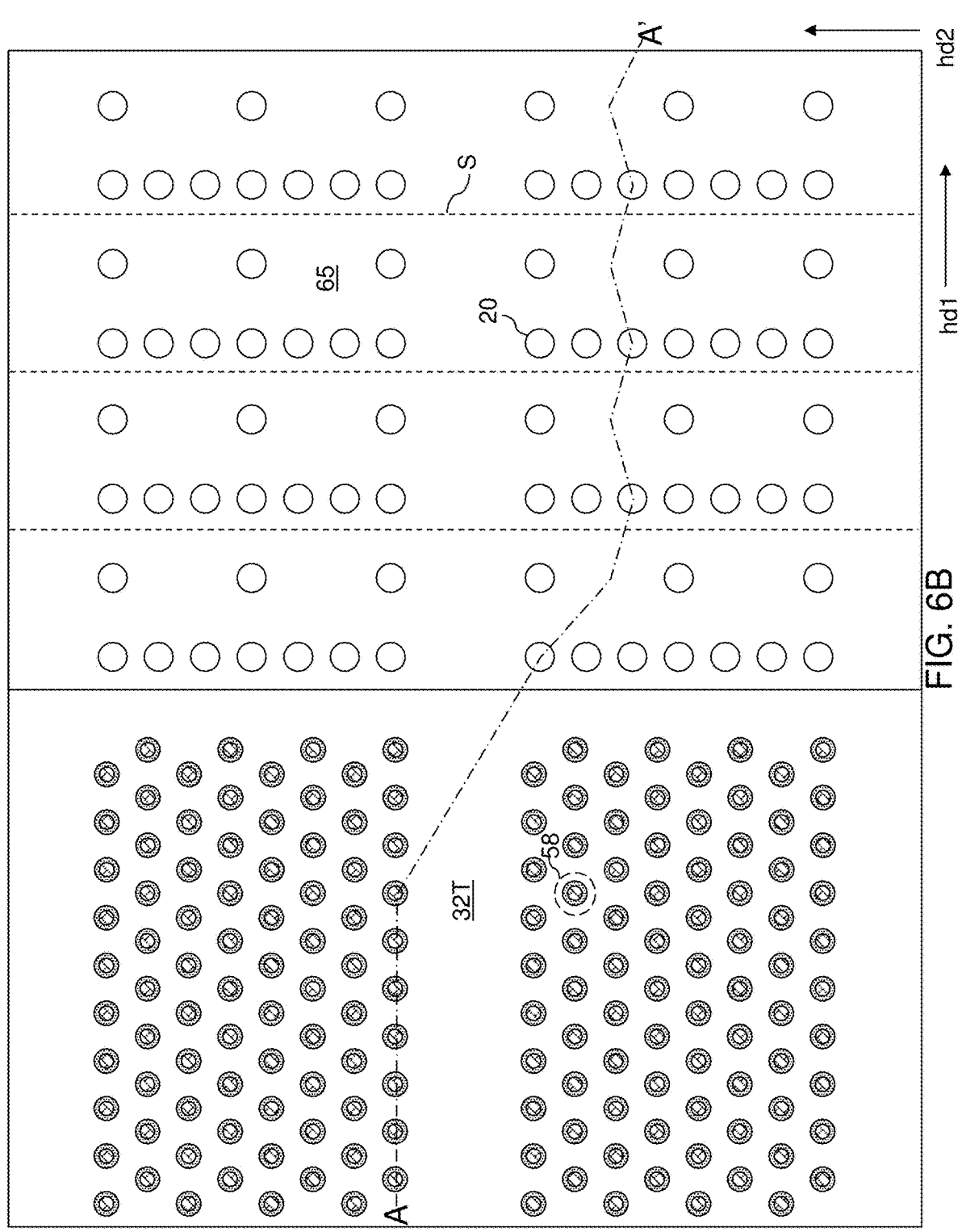
FIG. 6B is a top-down view of the first exemplary structure of FIG. 6A. The vertical plane A-A' is the cut plane of the vertical cross-sectional view of FIG. 6A.

Referring to FIGS. 6A and 6B, the first exemplary structure is illustrated after formation of memory opening fill structures 58 within the memory openings 49. Each of the memory opening fill structures 58 may comprise a memory film 50 and a vertical semiconductor channel 60. In summary, a combination of an alternating stack (32, 42) of insulating layers 32 and sacrificial material layers 42, memory openings 49 vertically extending through the alternating stack (32, 42), and memory opening fill structures 58 located in the memory openings 49 can be formed. Each of the memory opening fill structures 58 comprises a respective vertical stack of memory elements, such as portions of a memory material layer 54 located at levels of the sacrificial material layers 42.

Figure 7A:
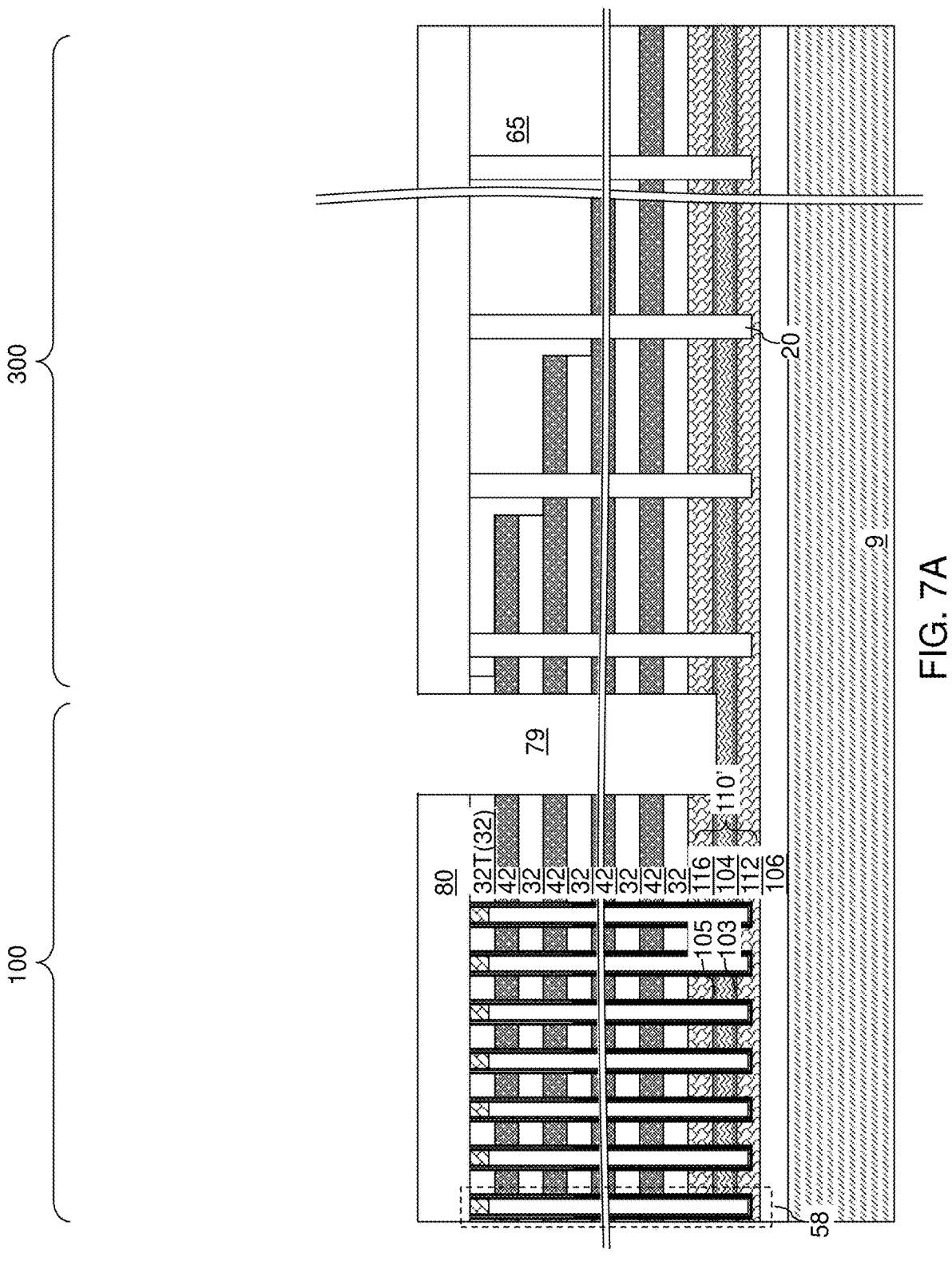
FIG. 7A is a vertical cross-sectional view of the first exemplary structure after formation of lateral isolation trenches according to the first embodiment of the present disclosure.
Figure 7B:
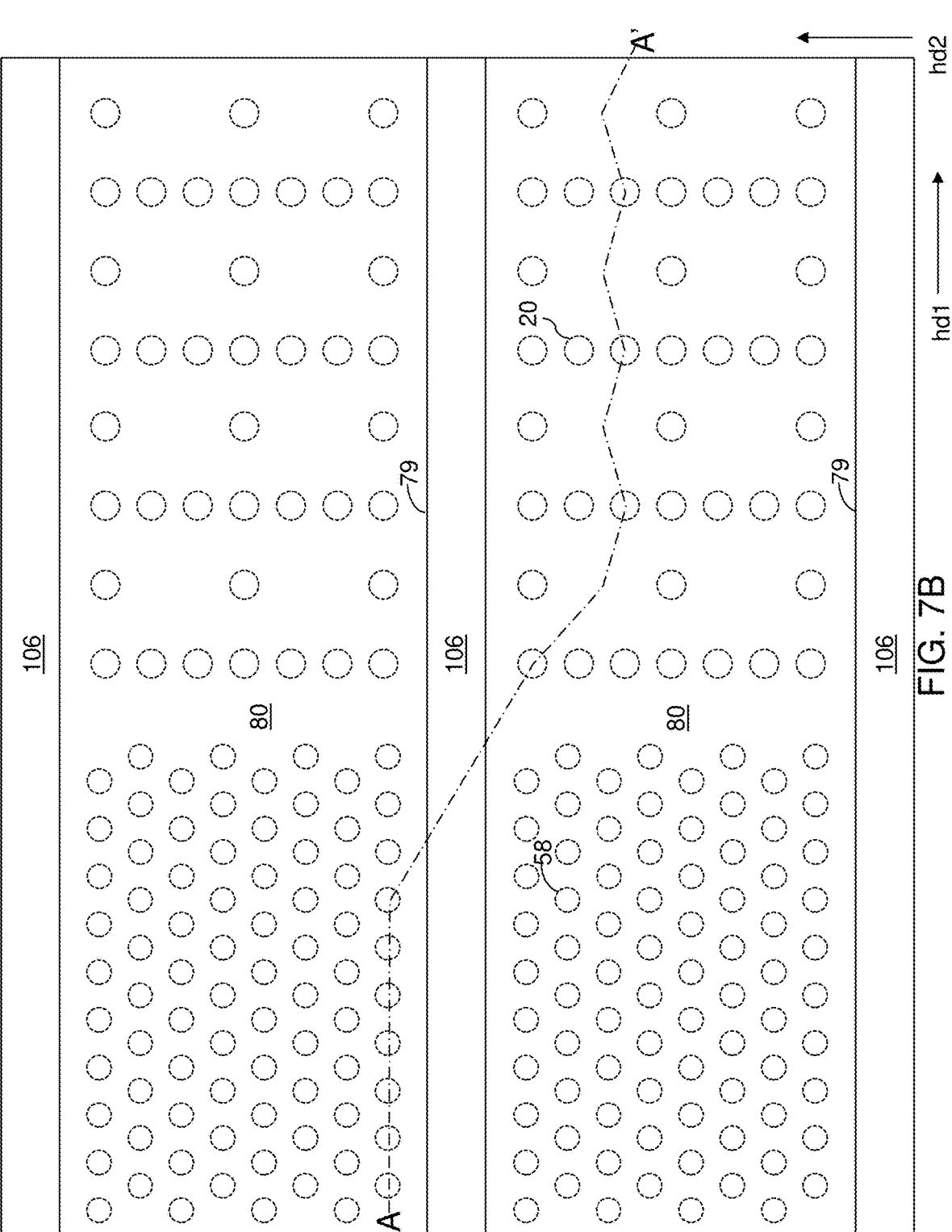
FIG. 7B is a top-down view of the first exemplary structure of FIG. 7A. The vertical plane A-A' is the cut plane of the vertical cross-sectional view of FIG. 7A.

Referring to FIGS. 7A and 7B, a dielectric material such as undoped silicate glass or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), the retro-stepped dielectric material portion 65, and the in-process source-level material layers 110'. Lateral isolation trenches 79 laterally extending along the first horizontal direction hd1 can be formed through the alternating stack (32, 42), the retro-stepped dielectric material portion 65, the contact-level dielectric layer 80, and the in-process source-level material layers 110'. Each of the lateral isolation trenches 79 may comprise a respective pair of lengthwise sidewalls that are parallel to the first horizontal direction hd1 and vertically extend from the stopper insulating layer 106 to the top surface of the contact-level dielectric layer 80. A top surface of the stopper insulating layer 106 can be physically exposed underneath each lateral isolation trench 79. The lateral isolation trenches 79 isolate adjacent memory blocks from each other along the second horizontal direction hd2. The photoresist layer can be subsequently removed, for example, by ashing.

Figure 8:
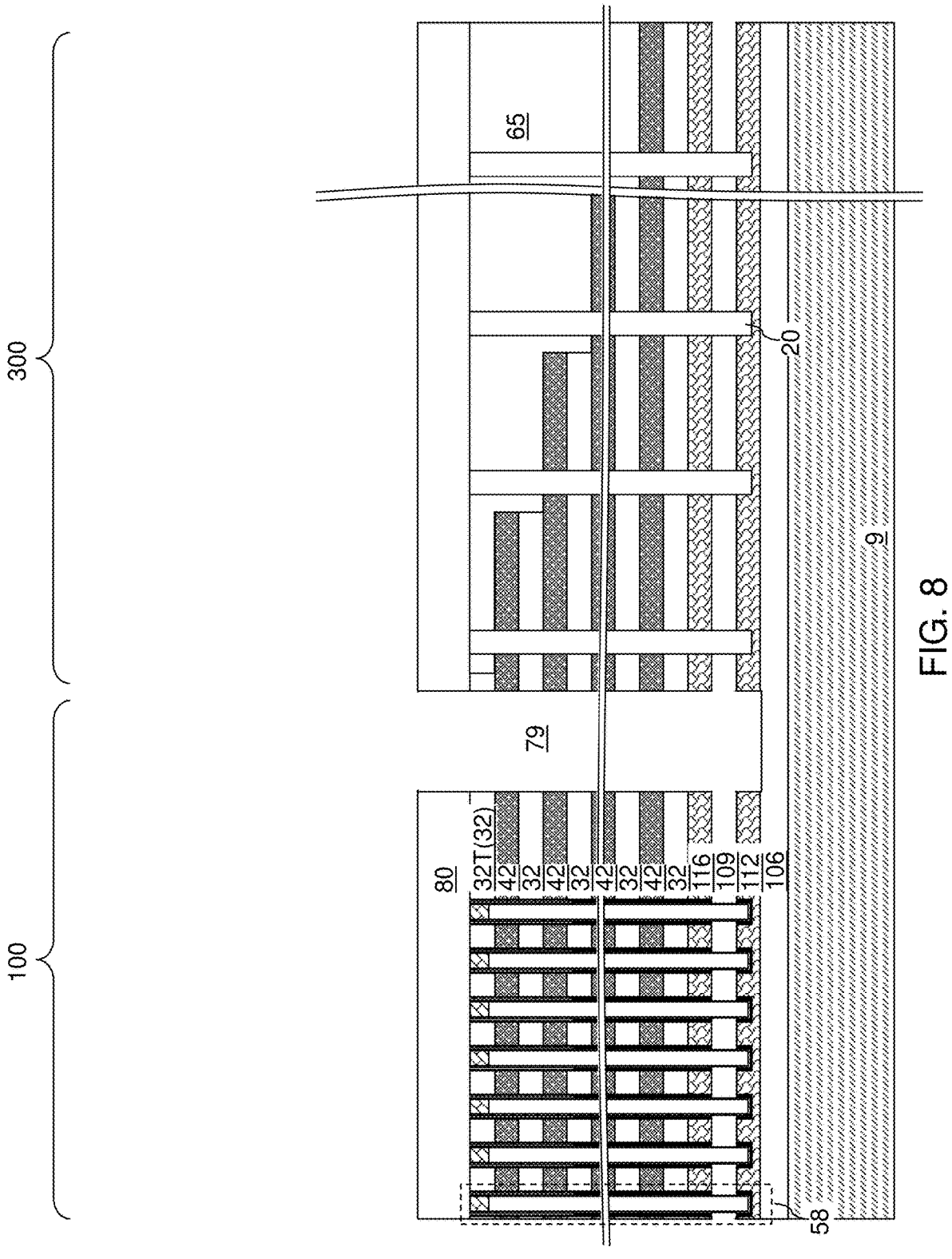
FIG. 8 is a vertical cross-sectional view of the first exemplary structure after formation of a source-level cavity according to the first embodiment of the present disclosure.

Referring to FIG. 8, an etchant that etches the material of the source-level sacrificial layer 104 selective to the materials of the alternating stack (32, 42), the contact-level dielectric layer 80, the retro-stepped dielectric material portion 65, the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stack (32, 42), the contact-level dielectric layer 80, the retro-stepped dielectric material portion 65, the lower source-level semiconductor layer 112, and the upper source-level semiconductor layer 116. A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the lateral isolation trenches 79. Specifically, even if sidewalls of the upper source-level semiconductor layer 116 are physically exposed or even if a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the first exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

A sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 9:
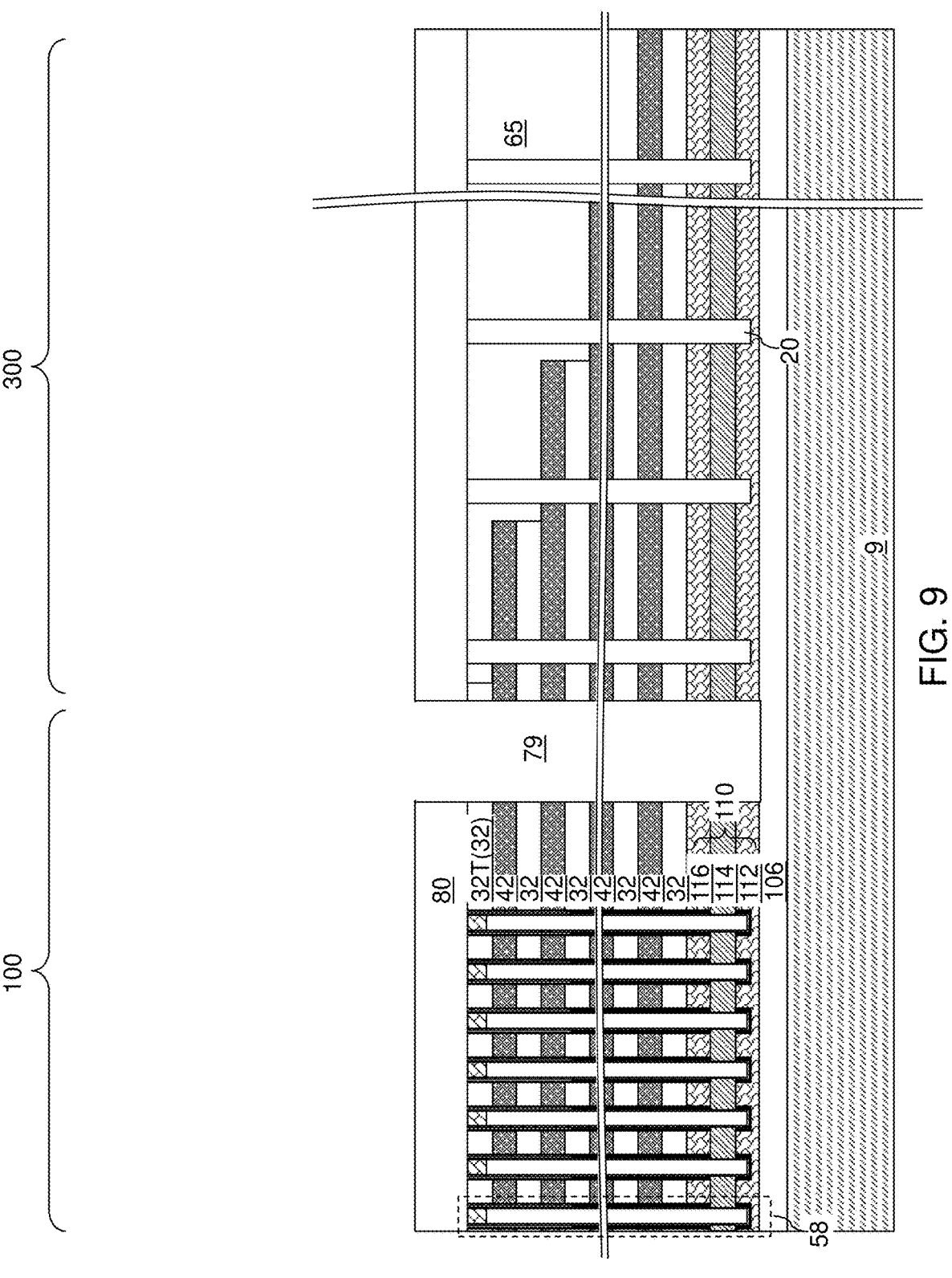
FIG. 9 is a vertical cross-sectional view of the first exemplary structure after formation of a source contact layer according to the first embodiment of the present disclosure.

Referring to FIG. 9, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114. The layer stack including the lower source-level semiconductor layer 112, the source contact layer 114, and the upper source-level semiconductor layer 116 constitutes a source layer 110, which replaces the in-process source-level material layers 110'. The source layer 110 contacts an end portion of each of the vertical semiconductor channels 60.

Figure 10:
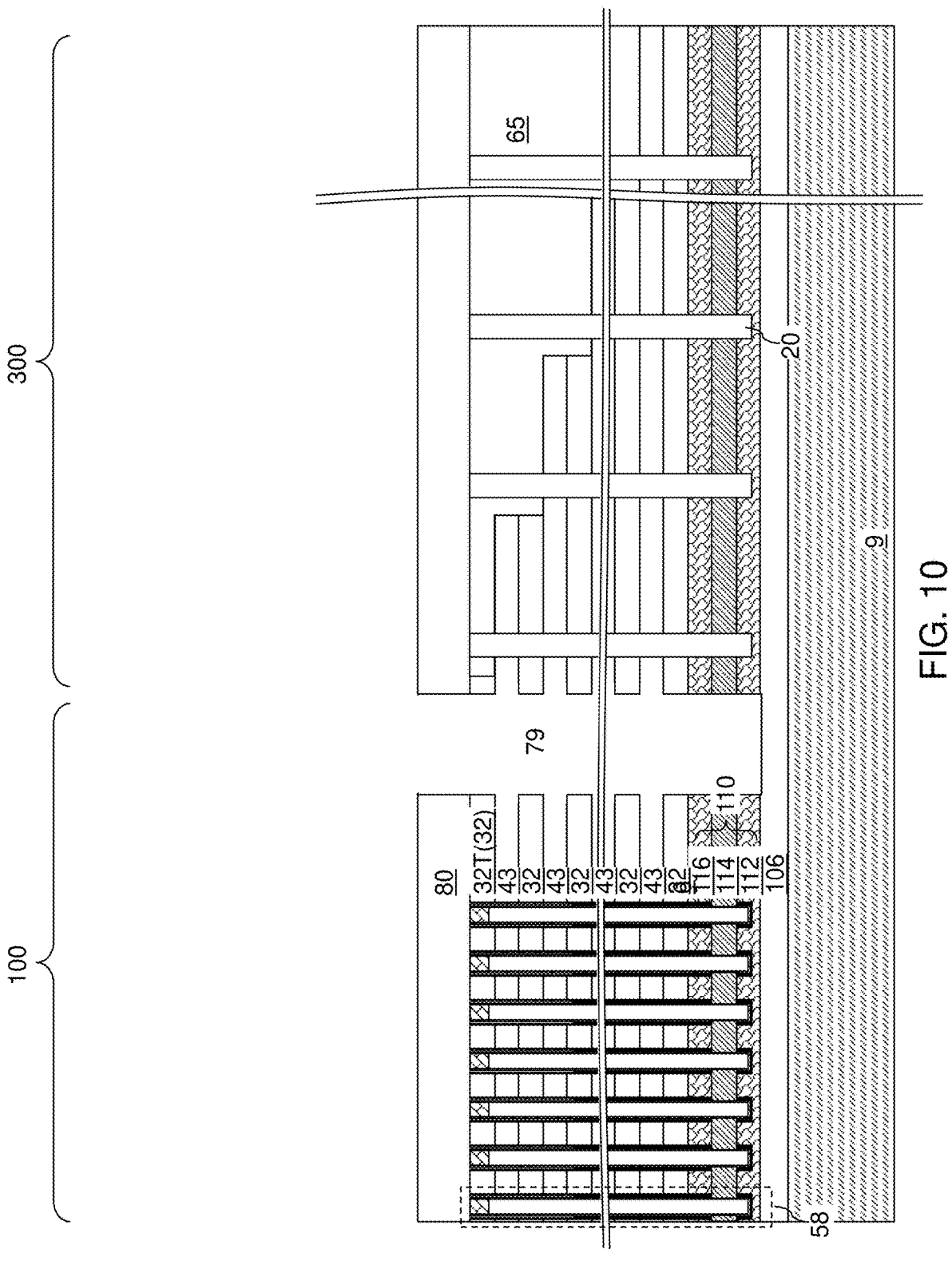
FIG. 10 is a vertical cross-sectional view of the first exemplary structure after formation of laterally-extending cavities according to the first embodiment of the present disclosure.

Referring to FIG. 10, an isotropic etch process can be performed to remove the sacrificial material layers 42 selective to the insulating layers 32, the stopper insulating layer 106, the memory opening fill structures 58, the sacrificial etch stop liners 71, and the source layer 110. Laterally-extending cavities 43 can be formed in volumes from which the sacrificial material layers 42 are removed. Sidewall surface segments of the memory opening fill structures 58 can be physically exposed to the laterally-extending cavities 43. In an illustrative example, if the sacrificial material layers 42 comprise silicon nitride, the isotropic etch process may comprise a wet etch process employing hot phosphoric acid, which is a process in which the first exemplary structure is immersed in phosphoric acid at or near the boiling point of the phosphoric acid. A suitable clean process may be performed as needed. In summary, the laterally-extending cavities 43 can be formed by removing the sacrificial material layers 42 selective to the insulating layers 32 and the memory opening fill structures 58.

FIGS. 11A-11D are sequential vertical cross-sectional views of a region of the first exemplary structure during formation of an outer blocking dielectric layer 44 and an electrically conductive layer 46 in each of the laterally-extending cavities 43 according to an embodiment of the present disclosure.

Figure 11A:
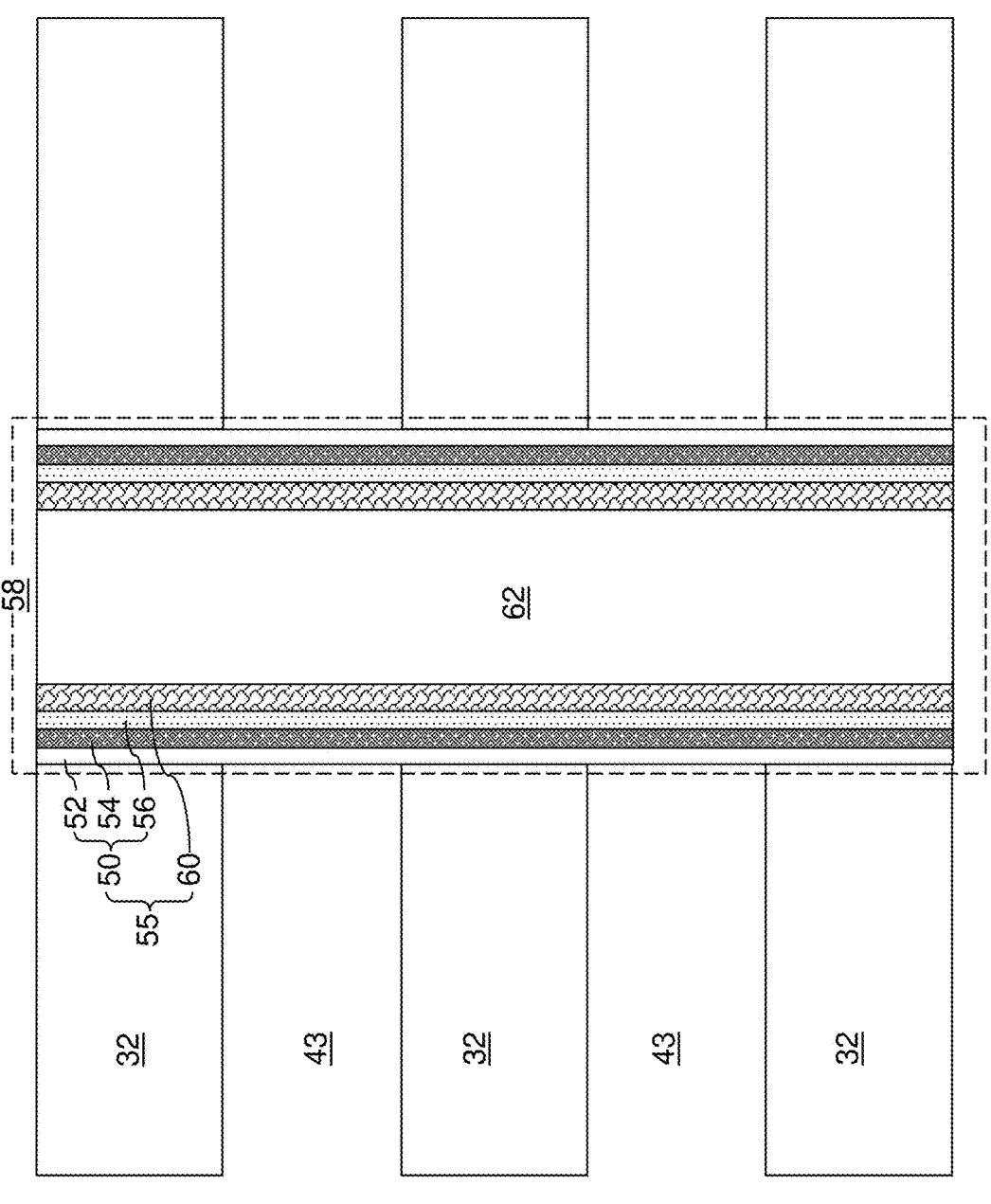
FIGS. 11A-11D are sequential vertical cross-sectional views of a region of the first exemplary structure during formation of an outer blocking dielectric layer, and an electrically conductive layer in each of the laterally-extending cavities according to the first embodiment of the present disclosure.

Referring to FIG. 11A, a region of the first exemplary structure is illustrated after the processing steps of FIG. 10. Cylindrical outer surface segments of each memory opening fill structure 58 and horizontally-extending surfaces of the insulating layers 32 can be exposed to the laterally-extending cavities 43.

Figure 11B:
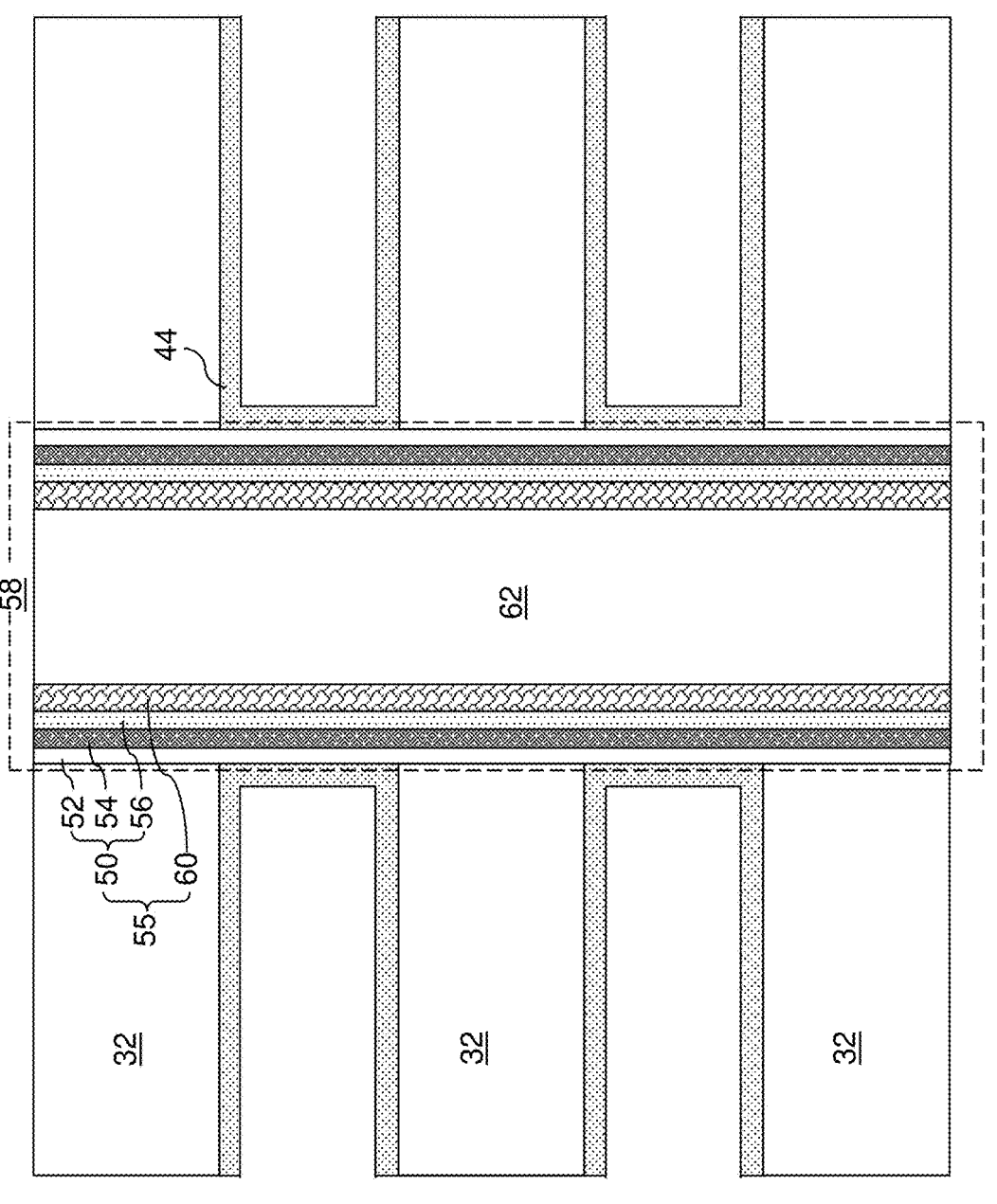

Referring to FIG. 11B, an outer blocking dielectric layer 44 is deposited in the laterally-extending cavities 43. The outer blocking dielectric layer 44 includes and/or consists essentially of a dielectric metal oxide material such as aluminum oxide. The outer blocking dielectric layer 44 can be deposited by a conformal deposition process, and may have a uniform thickness throughout. In one embodiment, an atomic layer deposition (ALD) process or a chemical vapor deposition (CVD) process may be employed to deposit the outer blocking dielectric layer 44. The outer blocking dielectric layer 44 may have a thickness in a range from 1 nm to 10 nm, such as from 2 nm to 5 nm, although lesser and greater thicknesses may also be employed. The outer blocking dielectric layer 44 can contact cylindrical surface segments of the memory opening fill structures 58.

Figure 11C:
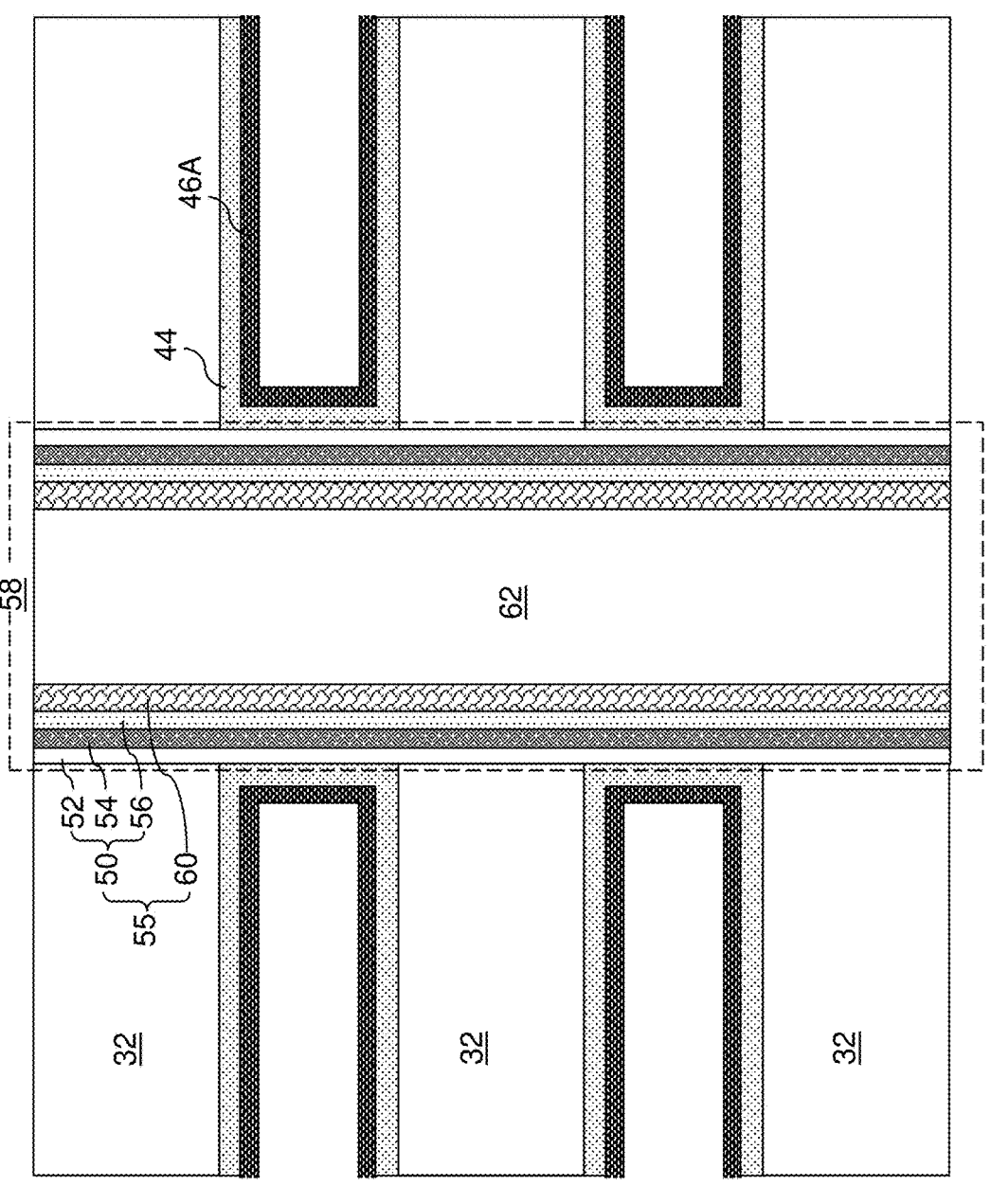

Referring to FIG. 11C, an electrically conductive tungsten nitride containing diffusion barrier layer 46A can be conformally deposited on the physically exposed surfaces of the outer blocking dielectric layer 44. The tungsten nitride containing diffusion barrier layer 46A may consist essentially of tungsten nitride or may comprise doped tungsten nitride, such as boron doped tungsten nitride (e.g., tungsten boronitride).

In one embodiment, the tungsten nitride containing diffusion barrier layer 46A may comprise and/or may consist essentially of stoichiometric tungsten nitride in which the atomic ratio between tungsten atoms and nitrogen atoms is 1:1. Alternatively, the tungsten nitride containing diffusion barrier layer 46A may comprise other atoms, such as boron atoms at an atomic percentage in a range from 1% to 40%, such as from 5% to 33%, although lesser and greater atomic percentages may also be employed. The tungsten nitride containing diffusion barrier layer 46A may be deposited by a conformal deposition process such as an atomic layer deposition process or a chemical vapor deposition process. The thickness of the tungsten nitride containing diffusion barrier layer 46A may be in a range from 1 nm to 8 nm, such as from 2 nm to 5 nm, although lesser and greater thicknesses may also be employed.

Figure 11D:
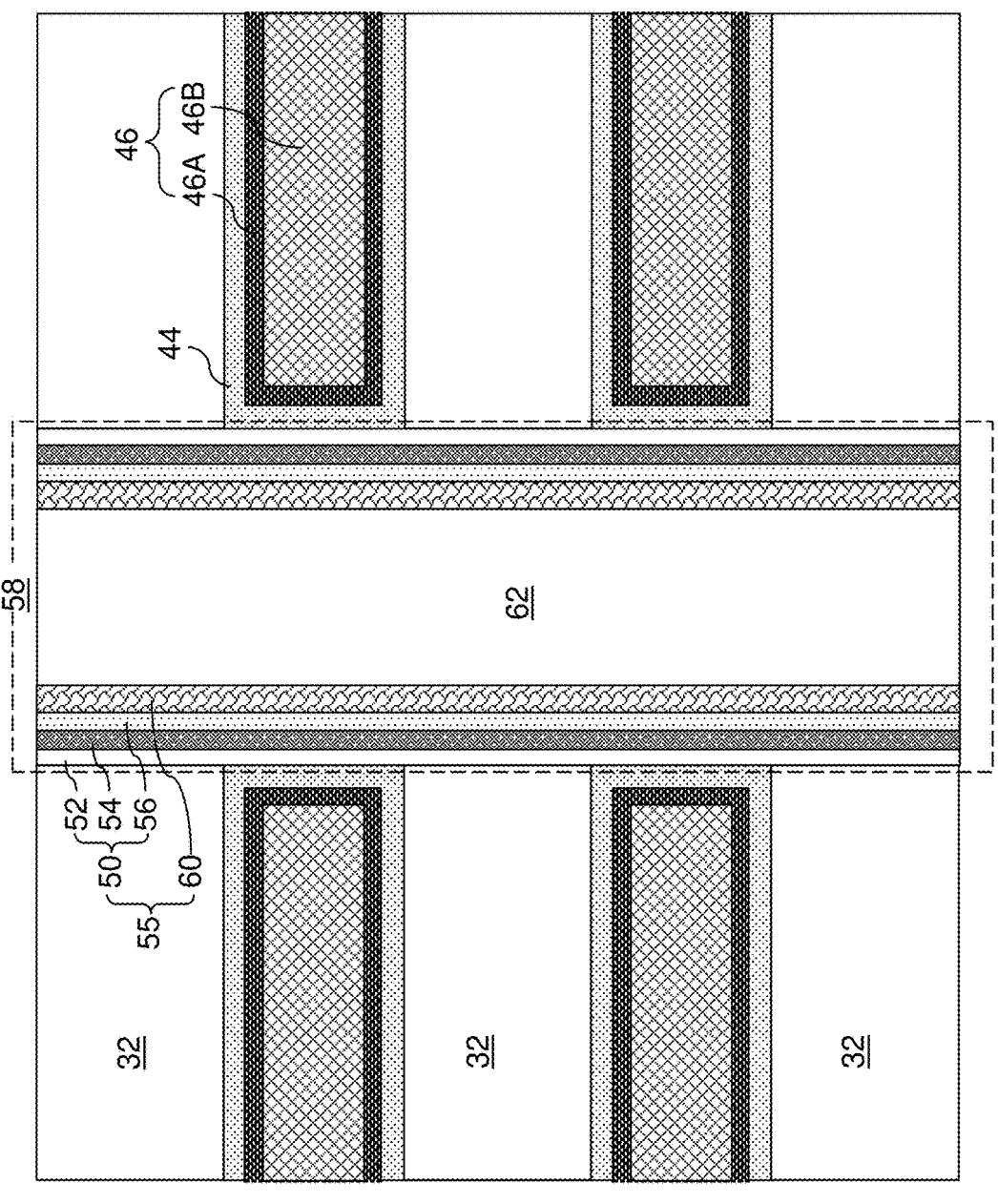
Figure 12:
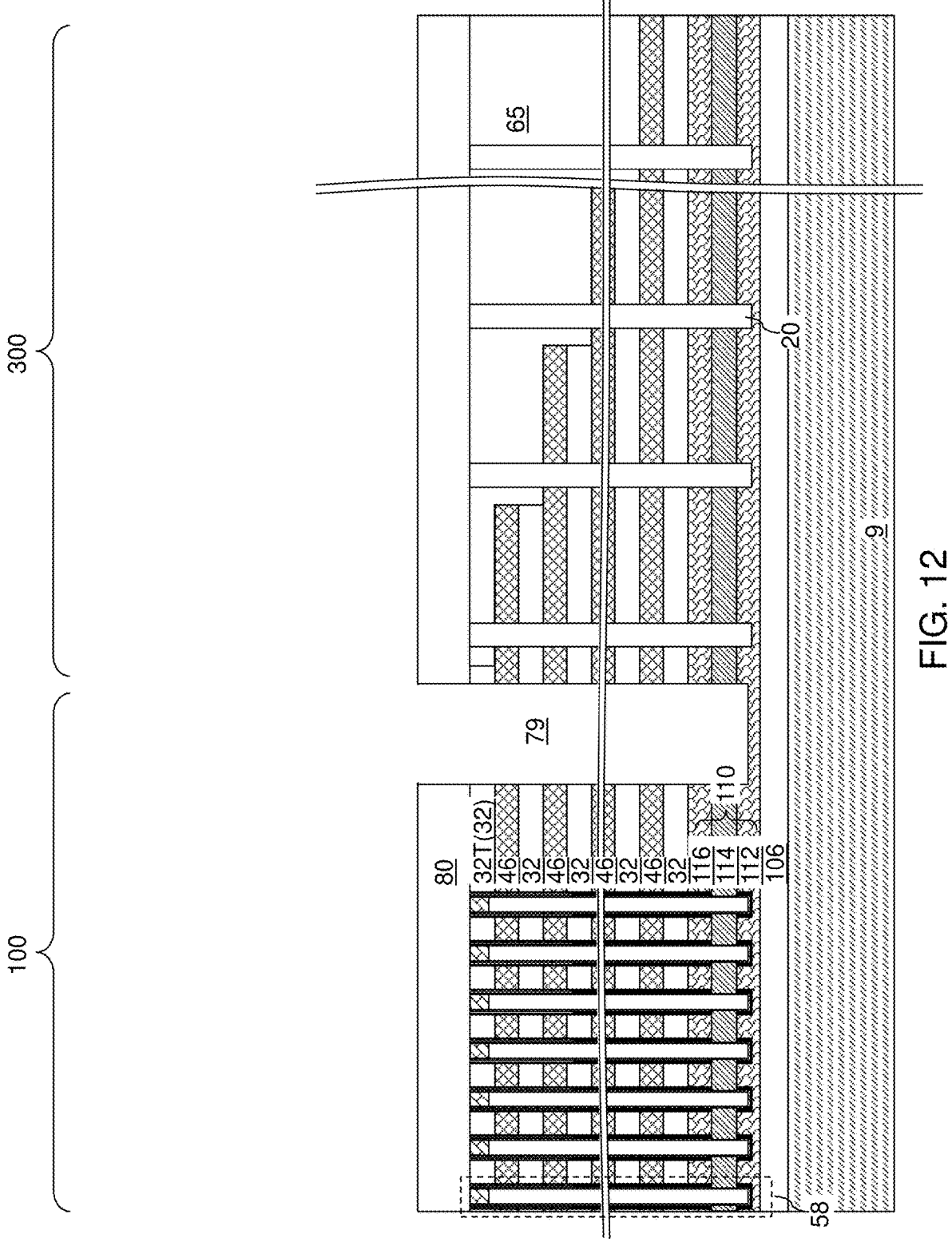
FIG. 12 is a vertical cross-sectional view of the first exemplary structure after formation of electrically conductive layers according to the first embodiment of the present disclosure.

Referring to FIGS. 11D and 12, a metal layer 46B including a metal at an atomic percentage greater than 95%, and/or greater than 99%, and/or greater than 99.8%, may be deposited in remaining volumes of the laterally-extending cavities 43. In one embodiment, the metal may comprise tungsten, molybdenum, ruthenium or cobalt. The metal layer 46B may be deposited by a conformal deposition process such as a chemical vapor deposition process, and can fill remaining volumes of the laterally-extending cavities 43. In one embodiment, the metal layer 46B comprises tungsten deposited on the tungsten nitride containing diffusion barrier layer 46A by a two-step process including forming a silicon or boron containing nucleation layer using a first $B_2H_6$ or silane ($SiH_4$) gas pre-treatment step followed by depositing a tungsten layer using tungsten hexafluoride or another suitable tungsten precursor in a second step. The tungsten precursor gas may optional also be provided during the first step.

An anisotropic etch process can be performed to remove portions of the metal layer 46B and the tungsten nitride containing diffusion barrier layer 46A and optionally the outer blocking dielectric layer 44 from inside the volumes of the lateral isolation trenches 79 and from above the contact-level dielectric layer 80. Each contiguous remaining portion of the combination of the metal layer 46B and the tungsten nitride containing diffusion barrier layer 46A located within a volume of a respective laterally-extending cavity 43 constitutes an electrically conductive layer 46. Each electrically conductive layer 46 can be spaced from the memory opening fill structures 58, a respective overlying one of the insulating layers 32, and a respective underlying one of the insulating layers 32 by the outer blocking dielectric layer 44. Alternating stacks (32, 46) of insulating layers 32 and electrically conductive layers 46 is thus formed. The alternating stacks (32, 46) of insulating layers 32 and electrically conductive layers 46 can be laterally spaced apart from each other along the second horizontal direction hd2 by the lateral isolation trenches 79.

In summary, multiple alternating stacks (32, 46) of insulating layers 32 and electrically conductive layers 46 can be formed over at least one semiconductor material layer (such as the source-level material layers 110). The multiple alternating stacks (32, 46) are laterally spaced from each other by lateral isolation trenches 79. Memory openings 49 vertically extend through a respective one of the two alternating stacks (32, 46). The memory opening fill structures 58 comprising a respective vertical stack of memory elements are located in the memory openings 49.

Figure 13:
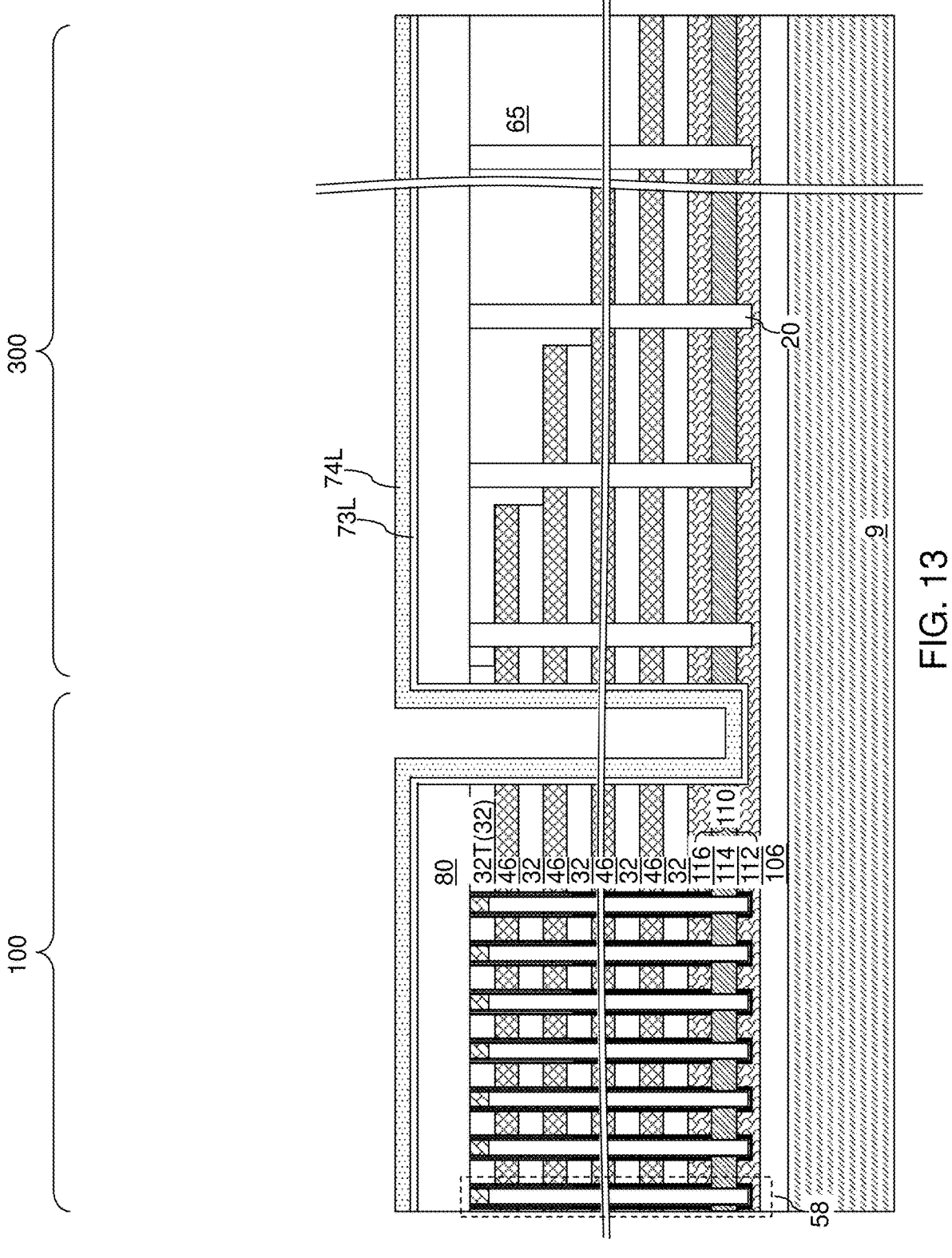
FIG. 13 is a vertical cross-sectional view of the first exemplary structure after formation of an optional insulating liner layer and a phosphorus-doped silicate glass layer according to the first embodiment of the present disclosure.

Referring to FIG. 13, an optional insulating liner layer 73L and a phosphorus-doped silicate glass layer (i.e., phosphorus doped silicon oxide layer, such as phosphosilicate glass (PSG)) 74L can be formed in the lateral isolation trenches 79 and over the contact-level dielectric layer 80. The insulating liner layer 73L, if employed, comprises an insulating material such as undoped silicate glass (i.e., undoped silicon oxide, such as $SiO_2$), silicon nitride, or a dielectric metal oxide material. The insulating liner layer 73L can be formed by a conformal deposition process, such as a chemical vapor deposition process or an atomic layer deposition process. The thickness of the insulating liner layer 73L may be in a range from 3 nm to 30 nm, such as from 6 nm 20 nm, although lesser and greater thicknesses may also be employed.

The phosphorus-doped silicate glass layer 74L comprises a phosphorus-doped silicate glass material having a material composition comprising silicon oxide doped with phosphorus atoms having a concentration of at least $1.0 \times 10^{20}/cm^3$, such as at an atomic percentage in a range from 0.1% to 15%, such as from 2% to 10%, and/or from 4% to 8%, although lesser and greater atomic percentages may also be employed. The phosphorus-doped silicate glass material may be deposited, for example, by a chemical vapor deposition process that is performed in a process chamber. The chemical vapor deposition process may utilize decomposition of an organic silicon oxide precursor, such as tetraethyl orthosilicate (TEOS), bis(trimethylsilyl) acetamide (BT-BAS), bis(trimethylsilyl) acetamide (TMOS), octamethyl-cyclotetrasiloxane (OMCTS), etc., or by flowing a silicon-containing precursor gas (such as silane or dichlorosilane) and an oxidant gas (such as oxygen or ozone) into a process chamber. A phosphorus-containing dopant gas, such as phosphine or $POCl_3$, may be flowed continuously or intermittently into the process chamber to in-situ dope the deposited silicate glass material with phosphorus atoms, thereby forming the phosphorus-doped silicate glass material. The chemical vapor deposition process may comprise plasma-enhanced chemical vapor deposition process or a low-pressure chemical vapor deposition process. Alternatively, atomic layer deposition or another deposition process may be used instead of chemical vapor deposition.

In case an organic precursor (e.g., TEOS) is used to deposit the phosphorus-doped silicate glass material, the deposited phosphorus-doped silicate glass material may comprise carbon atoms at an atomic percentage in a range from 0.0001% to 1.0%, such as from 0.001% to 0.1%. Further, the deposited phosphorus-doped silicate glass material may comprise hydrogen atoms at an atomic percentage in a range from 0.0005% to 5.0%, such as from 0.005% to 0.5%.

The phosphorus-doped silicate glass material of the phosphorus-doped silicate glass layer 74L may optionally include additional dopants atoms that are different from phosphorus, carbon, and/or hydrogen. In one embodiment, the phosphorus-doped silicate glass material of the phosphorus-doped silicate glass layer 74L may comprise borophosphosilicate glass (BPSG) containing boron atoms at an atomic concentration in a range from 0.001% to 10%, such as from 1% to 8%, and/or from 3% to 6%.

Generally, the phosphorus-doped silicate glass material of the phosphorus-doped silicate glass layer 74L includes phosphorus atoms as mobile-ion capture atoms, i.e., as gettering atoms that are used to capture mobile ions that drift into the phosphorus-doped silicate glass material. As such, presence of additional atoms, such as carbon atoms, hydrogen atoms, and boron atoms, does not affect the functionality of the phosphorus-doped silicate glass material of the phosphorus-doped silicate glass layer 74L as a mobile-ion capture material. Without wishing to be bound by a particular theory, it is believed that if carbon is present in the phosphorus-doped silicate glass layer 74L, then it may reduce or prevent phosphorus atoms from outdiffusing from the phosphorus-doped silicate glass layer 74L. This enhances the function of the phosphorus-doped silicate glass layer 74L as a mobile ion gettering material. The thickness of the phosphorus-doped silicate glass layer 74L is selected such that an unfilled laterally-extending cavity (which is herein referred to as a lateral isolation cavity) is present within each lateral isolation trench 79.

Figure 14:
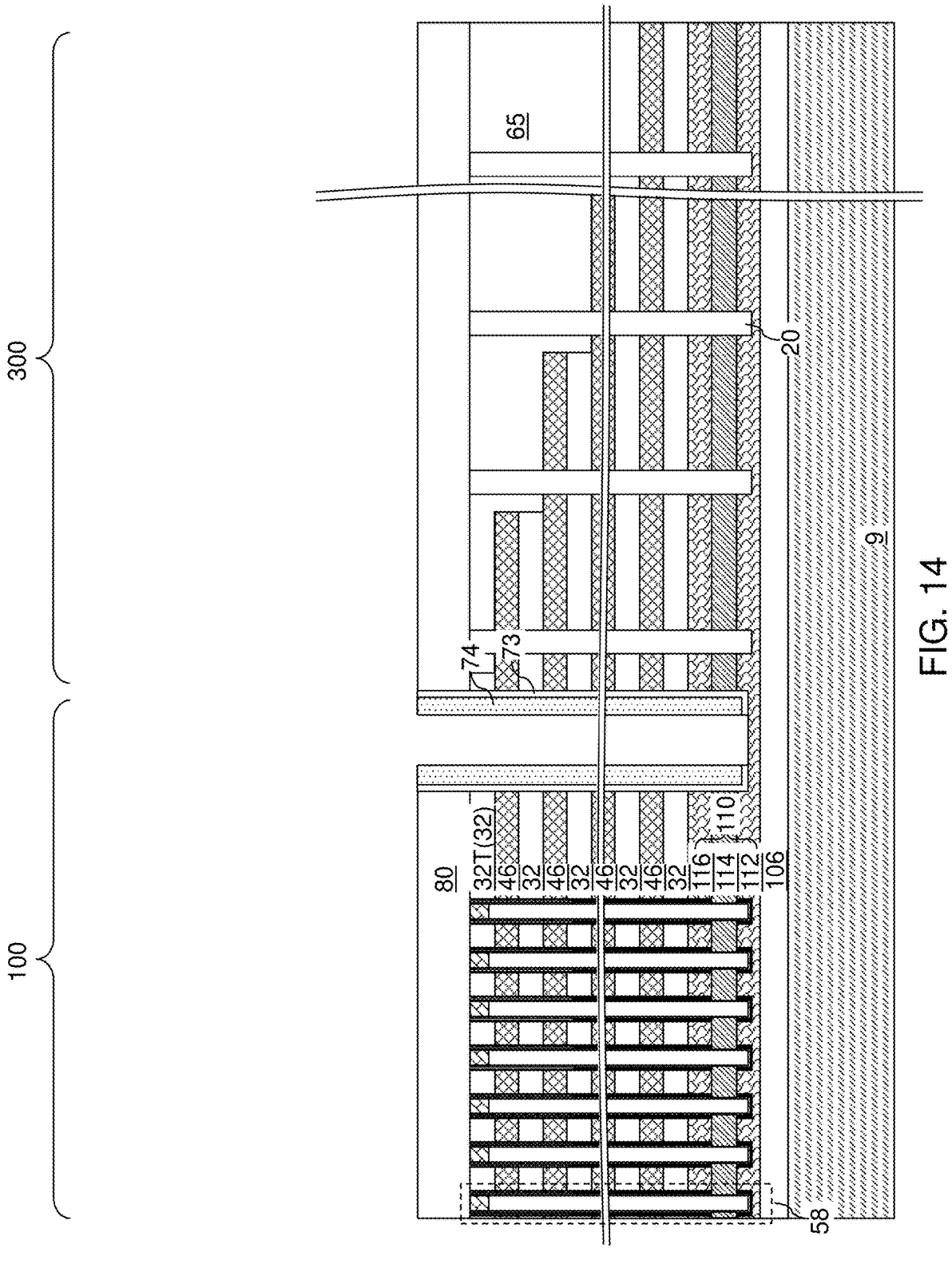
FIG. 14 is a vertical cross-sectional view of the first exemplary structure after formation of an insulating liner and a phosphorus-doped silicate glass spacer in each lateral isolation trench according to the first embodiment of the present disclosure.

Referring to FIG. 14, an anisotropic etch process can be performed to remove horizontally-extending portions of the phosphorus-doped silicate glass layer 74L and the optional insulating liner layer 73L. Each remaining vertically-extending portion of the phosphorus-doped silicate glass layer 74L located within a respective lateral isolation trench 79 comprises a phosphorus-doped silicate glass spacer 74. Each remaining portion of the insulating liner layer 73L located within a respective lateral isolation trench 79 comprises an insulating liner 73. An insulating liner 73 and a phosphorus-doped silicate glass spacer 74 can be formed in each lateral isolation trench 79.

Phosphorus-doped silicon oxide portions are formed in a peripheral region of each lateral isolation trench 79 at each level of the insulating layers 32. In this embodiment, the phosphorus-doped silicon oxide portions comprise portions of the continuous phosphorus-doped silicate glass spacer 74 located at levels of the insulating layers 32. The continuous phosphorus-doped silicate glass spacer 74 can vertically extend from a horizontal plane including a top surface of the contact-level dielectric layer 80 to at least one semiconductor material layer (such as the source-level material layers 110). Thus, phosphorus-doped silicon oxide portions (as embodied as portion of a phosphorus-doped silicate glass spacer 74) can be formed within each lateral isolation trench 79 at each level of the insulating layers 32.

Figure 15:
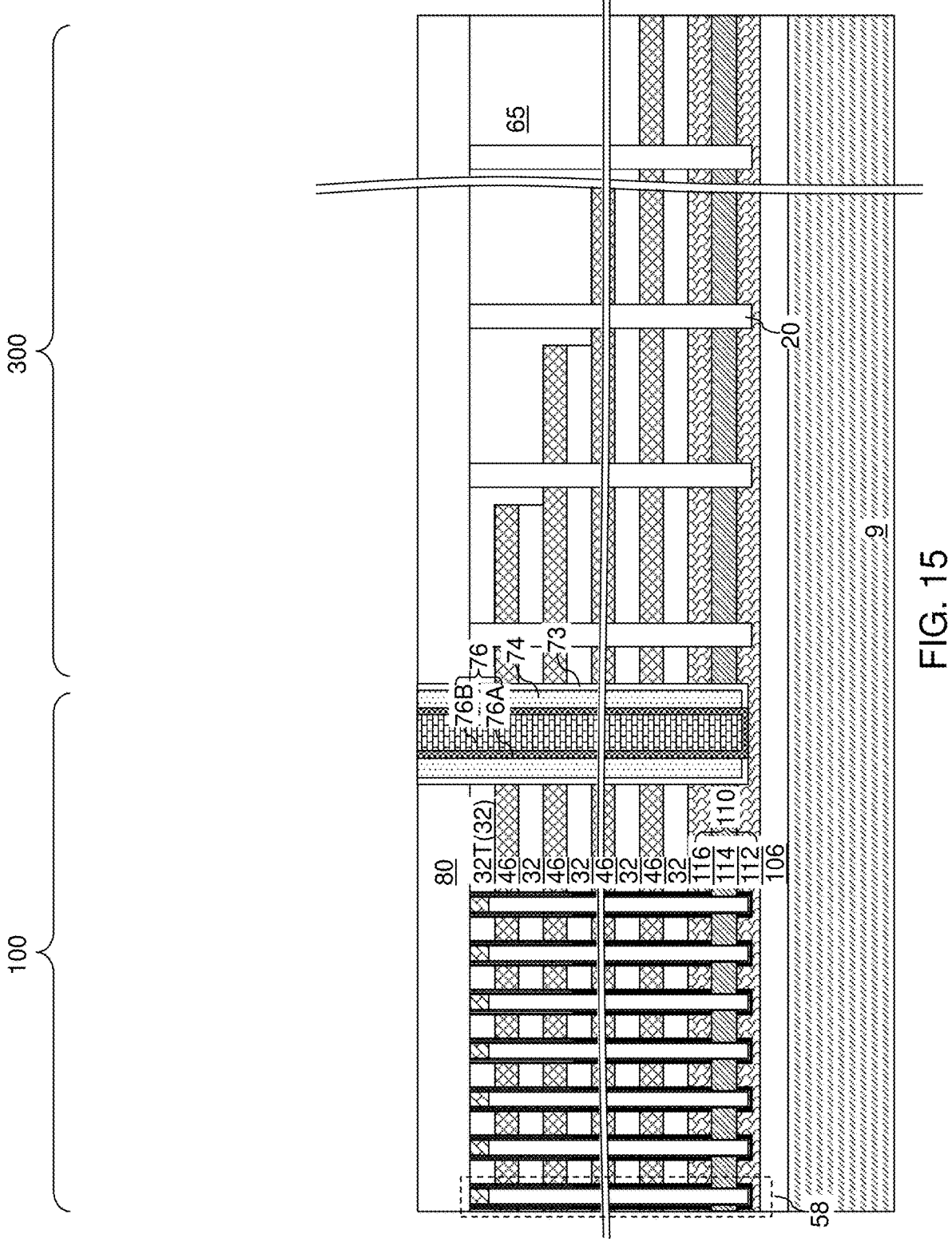
FIG. 15 is a vertical cross-sectional view of the first exemplary structure after formation of lateral isolation trench fill structures according to the first embodiment of the present disclosure.

Referring to FIG. 15, at least one conductive fill material, such as a combination of a metallic barrier material and a metallic fill material, can be deposited in remaining volumes of the lateral isolation trenches 79. Excess portions of the at least one conductive fill material can be removed from above the horizontal plane including the top surface of the contact-level dielectric layer 80 by a planarization process. The planarization process may comprise a chemical mechanical polishing process and/or a recess etch process. Each remaining portion of the at least one conductive fill material that remains in a lateral isolation trench constitutes a conductive fill structure 76. In one embodiment, each conductive fill structure 76 may comprise a metallic barrier liner 76A including a metallic barrier material, such as TiN, TaN, WN, MON, or a combination thereof, and a metal fill material portion 76B including a metal fill material, such as W, Ti, Ta, Co, Ru, Mo, Cu, etc.

The combination of all material portions filling a lateral isolation trench 79 constitutes a lateral isolation trench fill structure (73, 74, 76). In one embodiment, each lateral isolation trench fill structure (73, 74, 76) comprises a conductive fill structure 76 that is formed within and is laterally surrounded by the phosphorus-doped silicon oxide portions located at each level of the insulating layers 32. In this embodiment, the phosphorus-doped silicon oxide portions comprise portions of the continuous a phosphorus-doped silicate glass spacer 74. In one embodiment, the phosphorus-doped silicate glass spacers 74 in the lateral isolation trenches 79 may include a single opening therethrough, and may be topologically homeomorphic to a torus (i.e., may be continuously deformed into a torus without creating any new hole and without destroying any existing hole). Each conductive via structure 76 may be electrically connected to the at least one semiconductor material layer (such as the source-level material layers 110). In summary, each lateral isolation trench fill structure (73, 74, 76) may comprise an insulating spacer 74 and a conductive fill structure 76 that contact a top surface of the at least one semiconductor material layer (such as the source-level material layers 110).

Figure 16A:
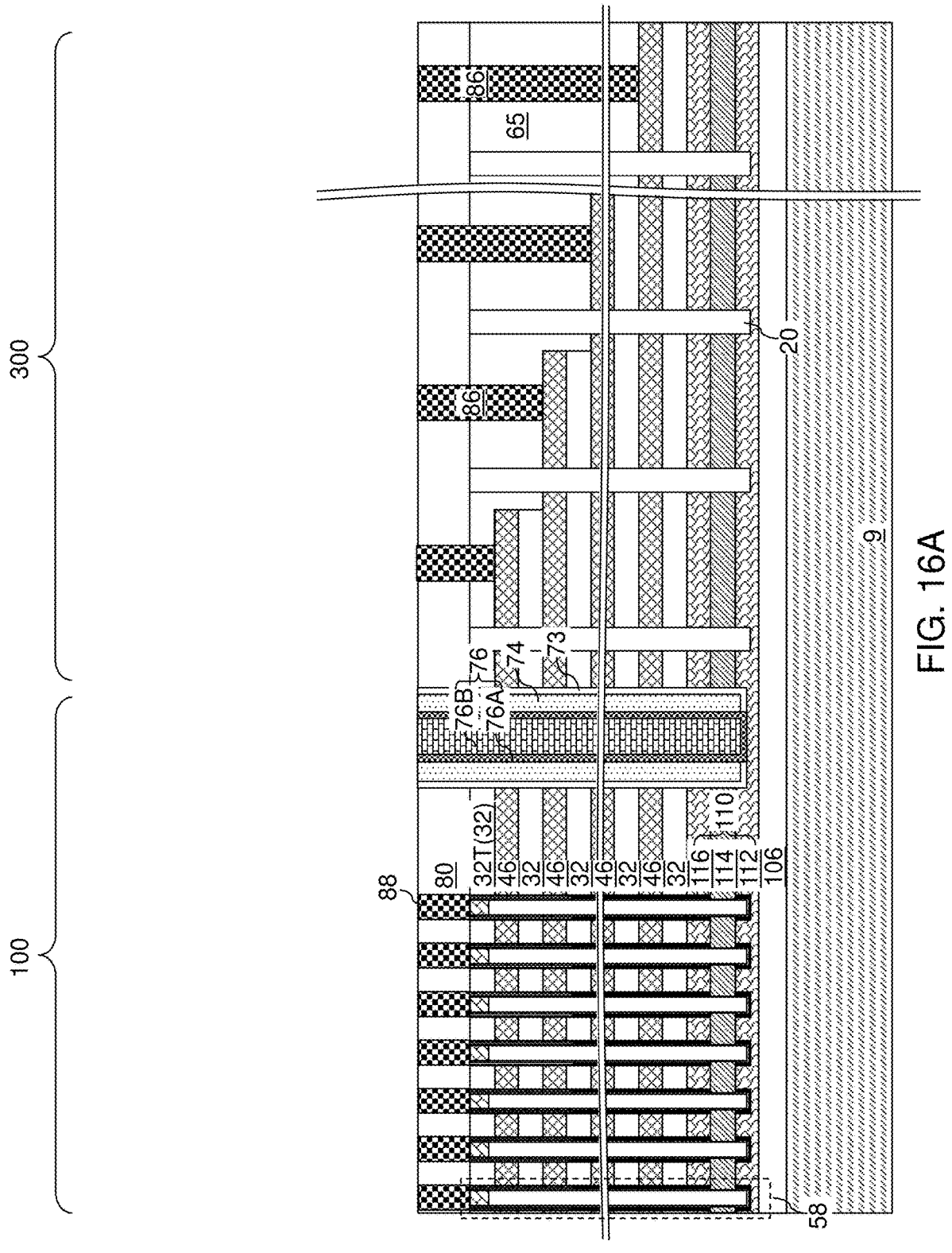
FIG. 16A is a vertical cross-sectional view of the first exemplary structure after formation of after formation of various contact via structures according to the first embodiment of the present disclosure.
Figure 16B:
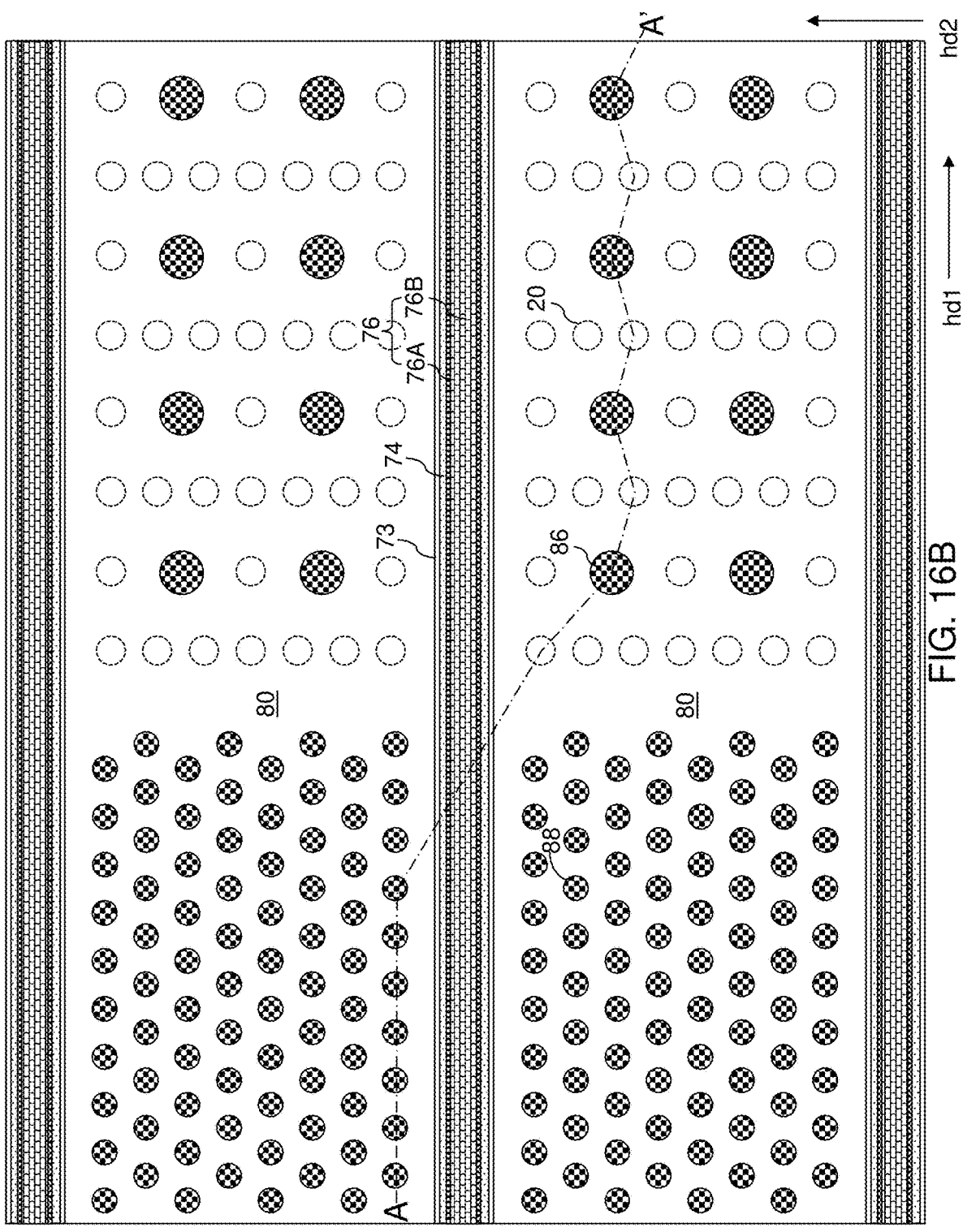
FIG. 16B is a top-down view of the first exemplary structure of FIG. 16A. The vertical plane A-A' is the cut plane of the vertical cross-sectional view of FIG. 16A.

Referring to FIGS. 16A and 16B, a photoresist layer (not shown) can be applied over the contact-level dielectric layer 80, and can be lithographically patterned to form openings over each of the memory opening fill structures 58 over the horizontally-extending surfaces of the stepped surfaces in the contact region. An anisotropic etch process can be performed to transfer the pattern of the openings in the photoresist layer through the contact-level dielectric layer 80 and the retro-stepped dielectric material portion 65. Drain contact via cavities can be formed through the contact-level dielectric layer 80 over the memory opening fill structures 58. Layer contact via structures can be formed through the contact-level dielectric layer 80 and the retro-stepped dielectric material portion 65 on a top surface of a respective one of the electrically conductive layers 46. The photoresist layer can be subsequently removed, for example, by ashing.

At least one conductive material, such as a combination of a metallic barrier material and a metallic fill material, can be deposited in the drain contact via cavities and the layer contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the drain contact via cavities constitute drain contact via structures 88 contacting a top surface of a respective one of the drain regions 63. Remaining portions of the at least one conductive material that fill the layer contact via cavities constitute layer contact via structures 86 contacting a top surface of a respective one of the electrically conductive layers 46.

Figure 17A:
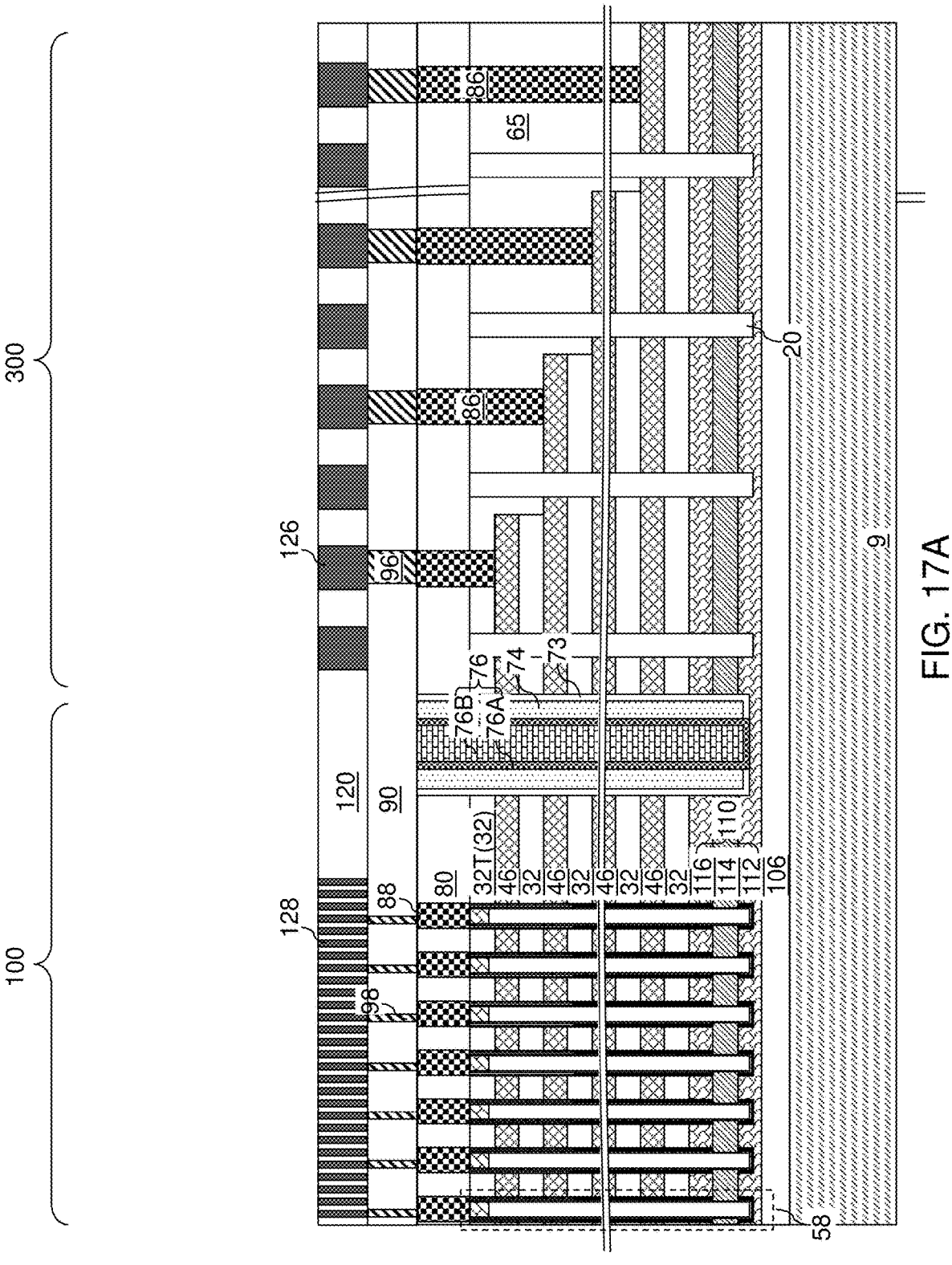
FIG. 17A is a vertical cross-sectional view of the first exemplary structure after formation of bit lines and bit-line-level metal lines according to the first embodiment of the present disclosure.
Figure 17B:
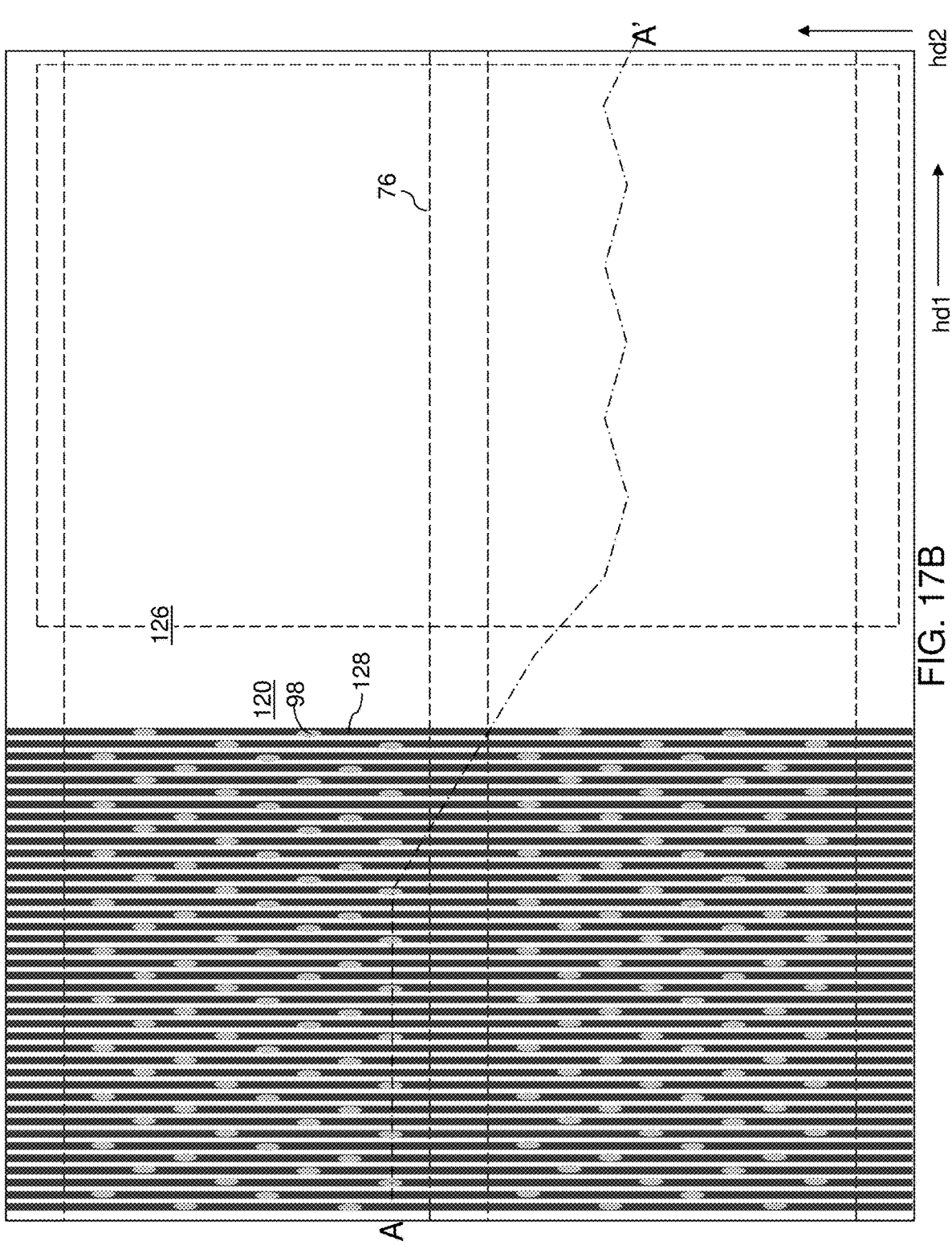
FIG. 17B is a top-down view of the first exemplary structure of FIG. 17A. The vertical plane A-A' is the cut plane of the vertical cross-sectional view of FIG. 17A.

Referring to FIGS. 17A and 17B, a connection-level dielectric layer 90 can be formed above the contact-level dielectric layer 80. Connection via cavities can be formed through the connection-level dielectric layer 90, and can be filled with at least one conductive material (which may comprise at least one metallic material) to form connection-level via structures (98, 96). The connection-level via structures (98, 96) comprise drain connection via structures 98 that contact a respective one of the drain contact via structures 88, and layer connection via structures 96 that contact a respective one of the layer contact via structures 86.

A bit-line-level dielectric layer 120 can be formed above the connection-level dielectric layer 90. Bit-line-level line cavities can be formed through the bit-line-level dielectric layer 120, and can be filled with at least one conductive material (which may comprise at least one metallic material) to form bit-line-level metal lines (128, 126). The bit-line-level metal lines may comprise bit lines 128 that laterally extend along the second horizontal direction hd2, and bit-line-level interconnect metal lines 126 (not individually shown) that can be employed to provide electrical connection to the layer connection via structures 96.

Figure 18:
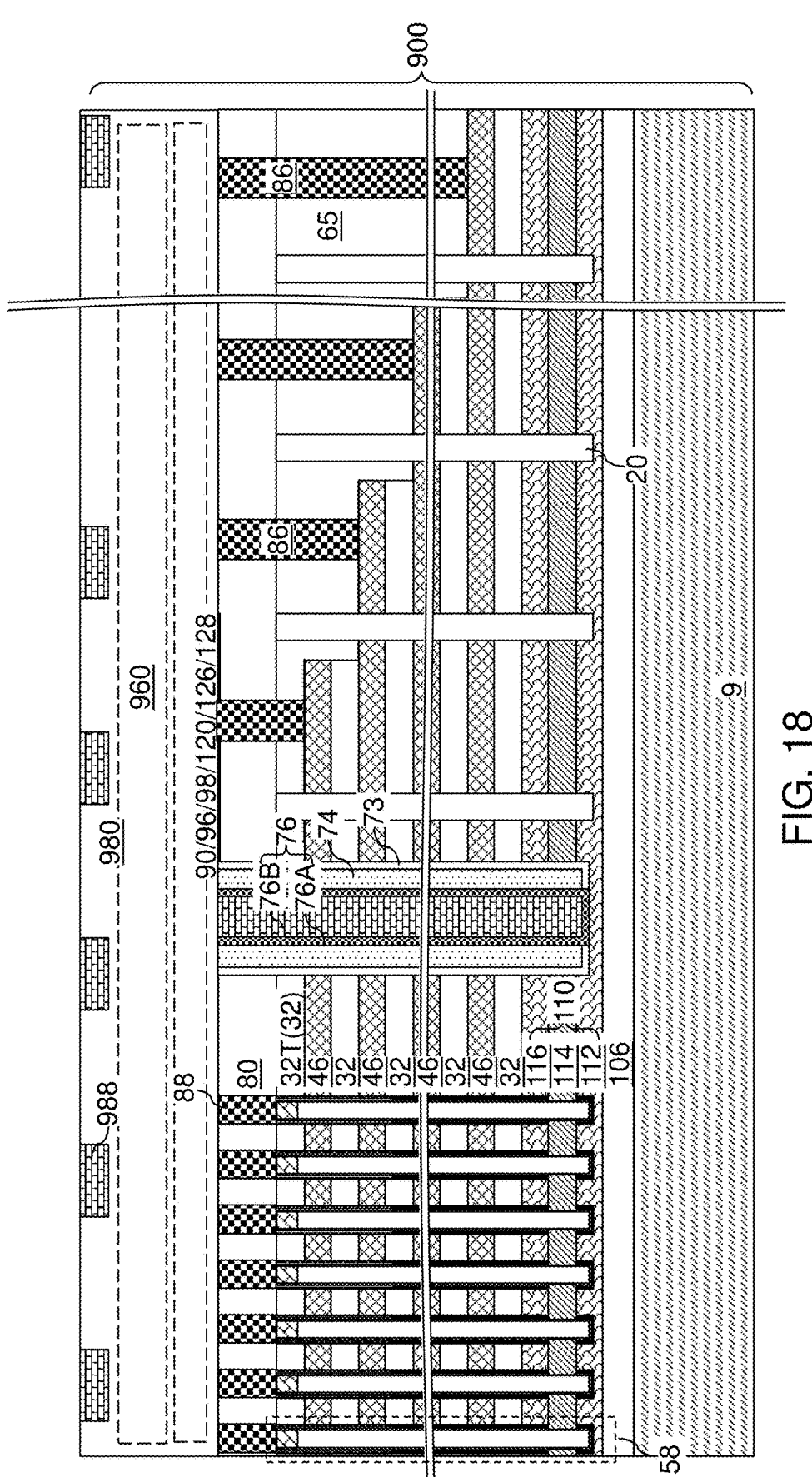
FIG. 18 is a vertical cross-sectional view of the first exemplary structure after formation of a memory die according to the first embodiment of the present disclosure.

Referring to FIG. 18, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding the bit lines 128, which are a subset of the memory-side metal interconnect structures 980.

Metal bonding pads, which are herein referred to as memory-side bonding pads 988, may be formed at the topmost level of the memory-side dielectric material layers 960. The memory-side bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor channel 60; a two-dimensional array of drain contact via structures 88 electrically connected to a respective one of the vertical semiconductor channels 60; and a two-dimensional array of layer contact via structures 86 electrically connected to a respective one of the electrically conductive layers 46, a subset of which functions as word lines for the three-dimensional memory array.

Thus, a memory die 900 comprises a memory array, memory-side metal interconnect structures 980, and memory-side bonding pads 988 embedded within memory-side dielectric material layers 960. The memory die 900 comprises a memory device, which may comprise a three-dimensional memory array including an alternating stack of insulating layers 32 and electrically conductive layers 46, and further comprises a two-dimensional array of NAND strings (e.g., the memory opening fill structures 58) vertically extending through the alternating stack (32, 46). In one embodiment, the electrically conductive layers 46 comprise word lines of the two-dimensional array of NAND strings. In one embodiment, the memory-side metal interconnect structures 980 comprise the bit lines 128 for the two-dimensional array of NAND strings.

Figure 19:
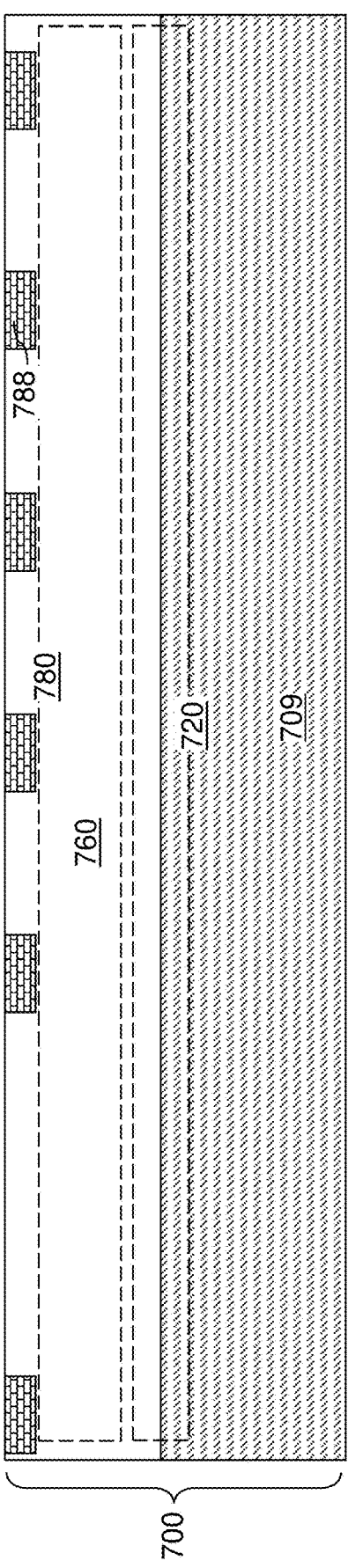
FIG. 19 is a vertical cross-sectional view of a logic die according to the first embodiment of the present disclosure.

Referring to FIG. 19, a logic die 700 is provided. The logic die 700 comprises a peripheral circuit 720 that is formed on a logic-side substrate 709. According to an aspect of the present disclosure, the peripheral circuit 720 can be configured to control operation of the memory array within the memory die 900. For example, the peripheral circuit 720 may comprise word line driver regions, bit line driver regions, sense amplifier regions, input/output buffer regions, etc. Logic-side metal interconnect structures 780 embedded within logic-side dielectric material layers 760 can be formed over the peripheral circuit 720. The logic die 700 comprises logic-side bonding pads 788 embedded within logic-side dielectric material layers 760.

Figure 20:
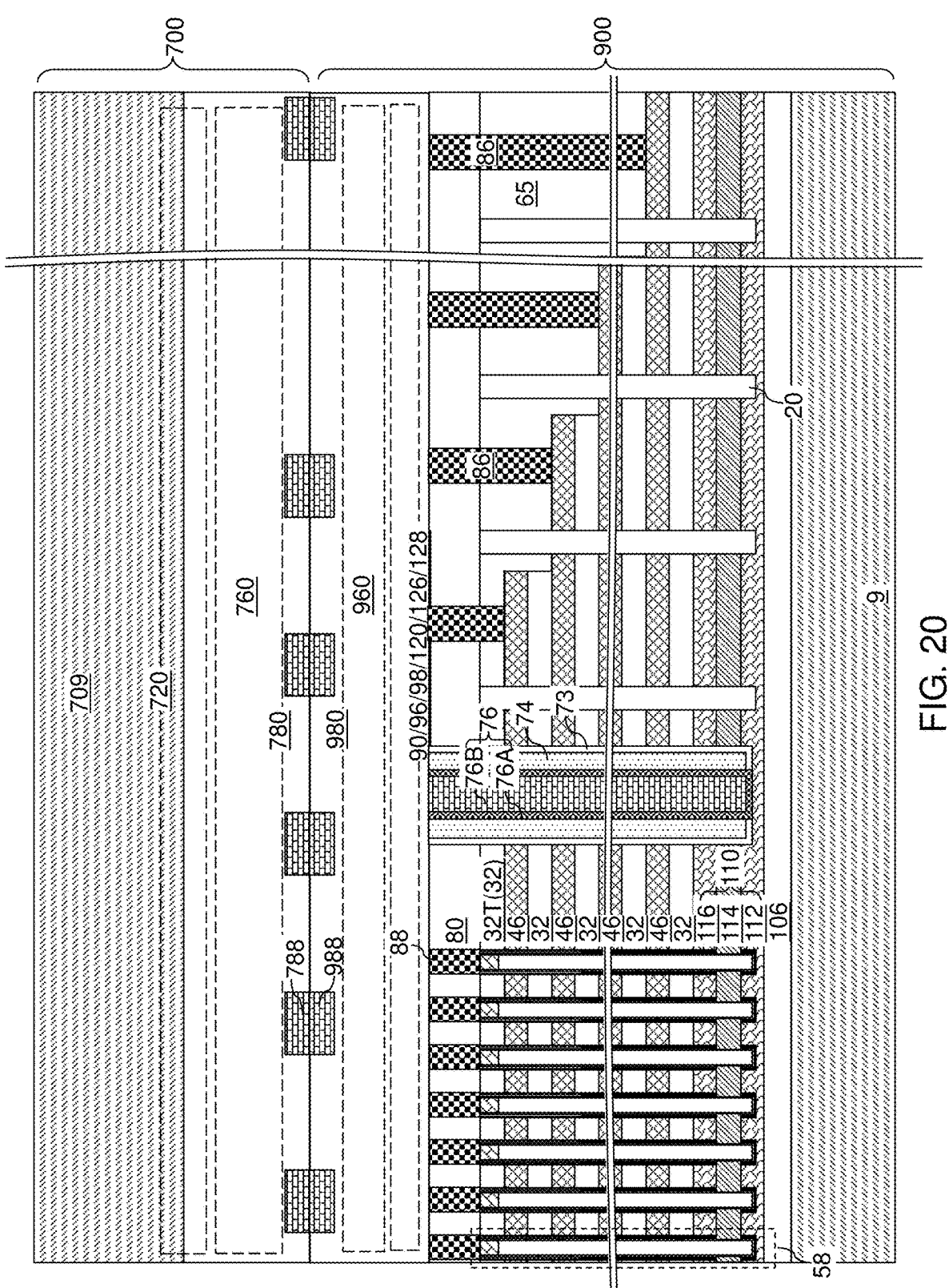
FIG. 20 is a vertical cross-sectional view of the first exemplary structure after formation of a bonded assembly of the memory die and the logic die according to the first embodiment of the present disclosure.

Referring to FIG. 20, a bonded assembly can be formed by bonding a logic die 700 with the memory die 900. The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 21:
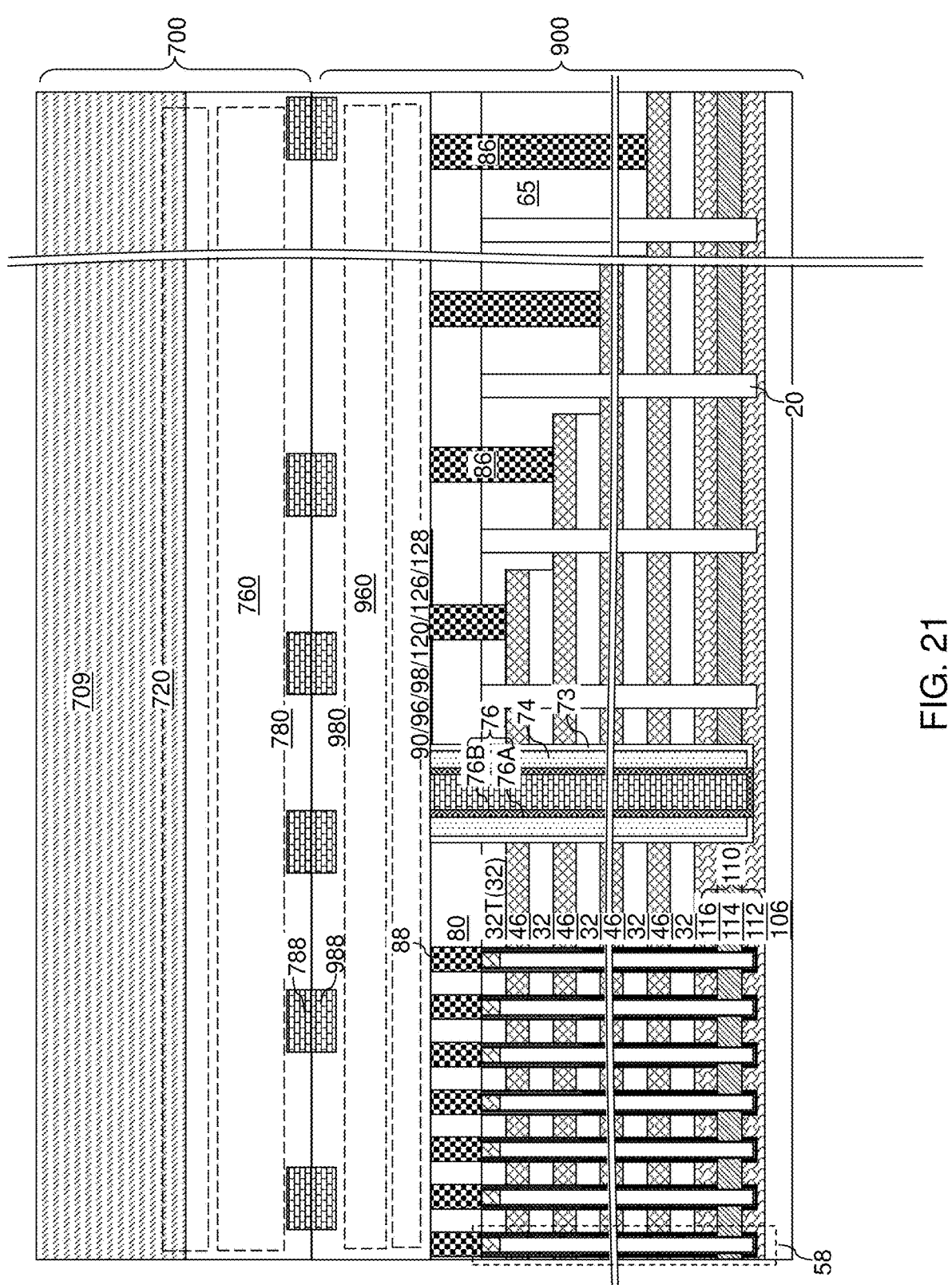
FIG. 21 is a vertical cross-sectional view of the first exemplary structure after removal of a carrier substrate from the memory die according to the first embodiment of the present disclosure.

Referring to FIG. 21, the carrier substrate 9 may optionally be removed, for example, by grinding, polishing, cleaving, an isotropic etch process, and/or an anisotropic etch process. If a polishing process such as a chemical mechanical polishing process is employed to remove the carrier substrate 9, the stopper insulating layer 106 may be subsequently employed as a polishing stopper material layer. If an etch process such as a wet etch process is employed to remove the carrier substrate 9, the stopper insulating layer 106 may be subsequently employed as an etch stop material layer. Optional electrical contacts may be formed on the bottom side of the bonded assembly of the memory die 900 and the logic die 700.

Figure 22:
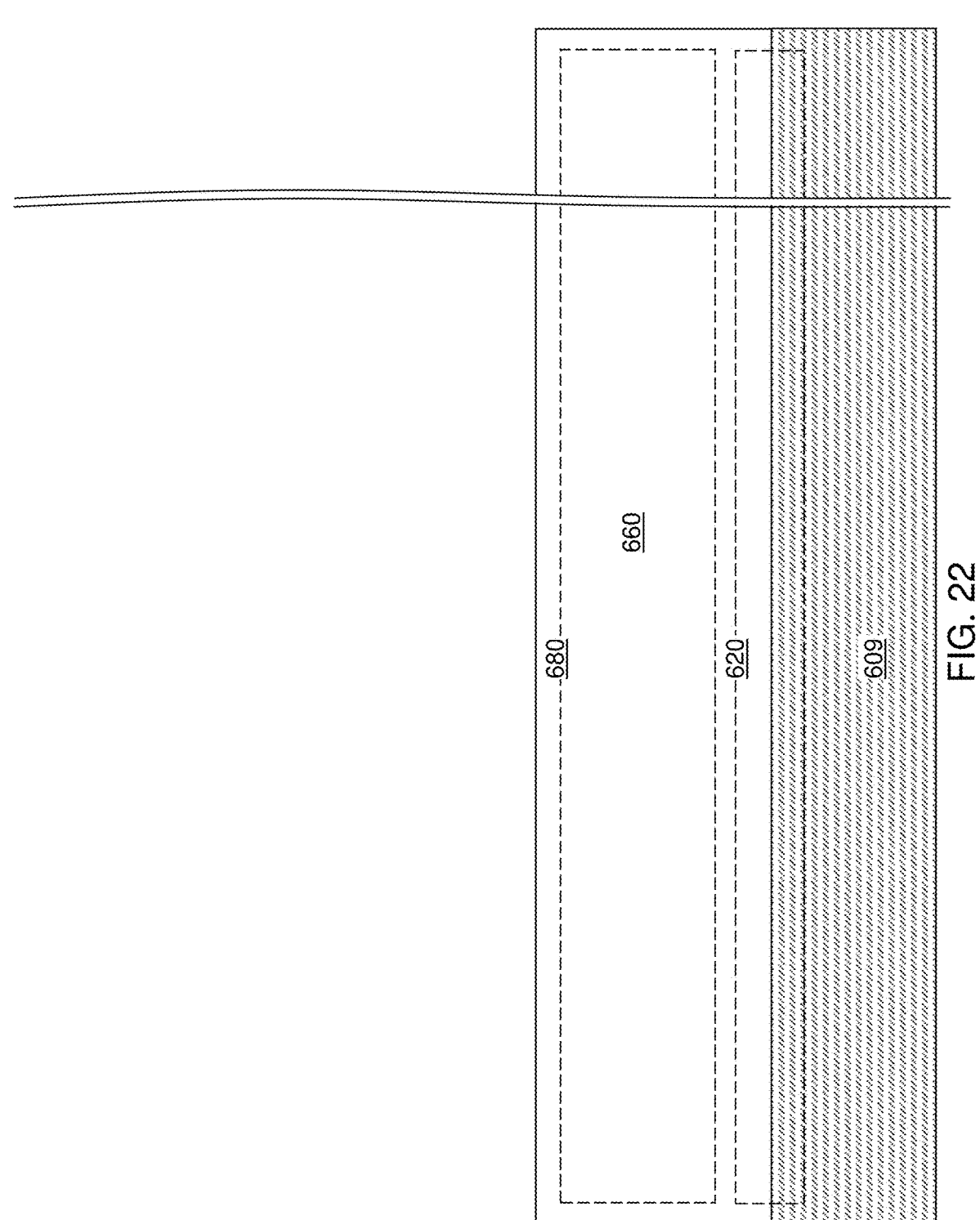
FIG. 22 is a vertical cross-sectional view of a first alternative configuration of the first exemplary structure.

FIG. 22 illustrates a first alternative configuration of the first exemplary structure according to an alternative embodiment. The alternative configuration of the first exemplary structure can be provided by forming semiconductor devices 620 comprising a peripheral circuit for controlling operation of a three-dimensional memory device on a semiconductor substrate 609, by forming metal interconnect structures 680 embedded in dielectric material layers 660 over the semiconductor devices 620. In other words, the combination of the semiconductor substrate 609, the semiconductor devices 620, the dielectric material layers 660, and the metal interconnect structures 680 can be employed in lieu of the carrier substrate 9 and the stopper insulating layer 106.

Figure 23:
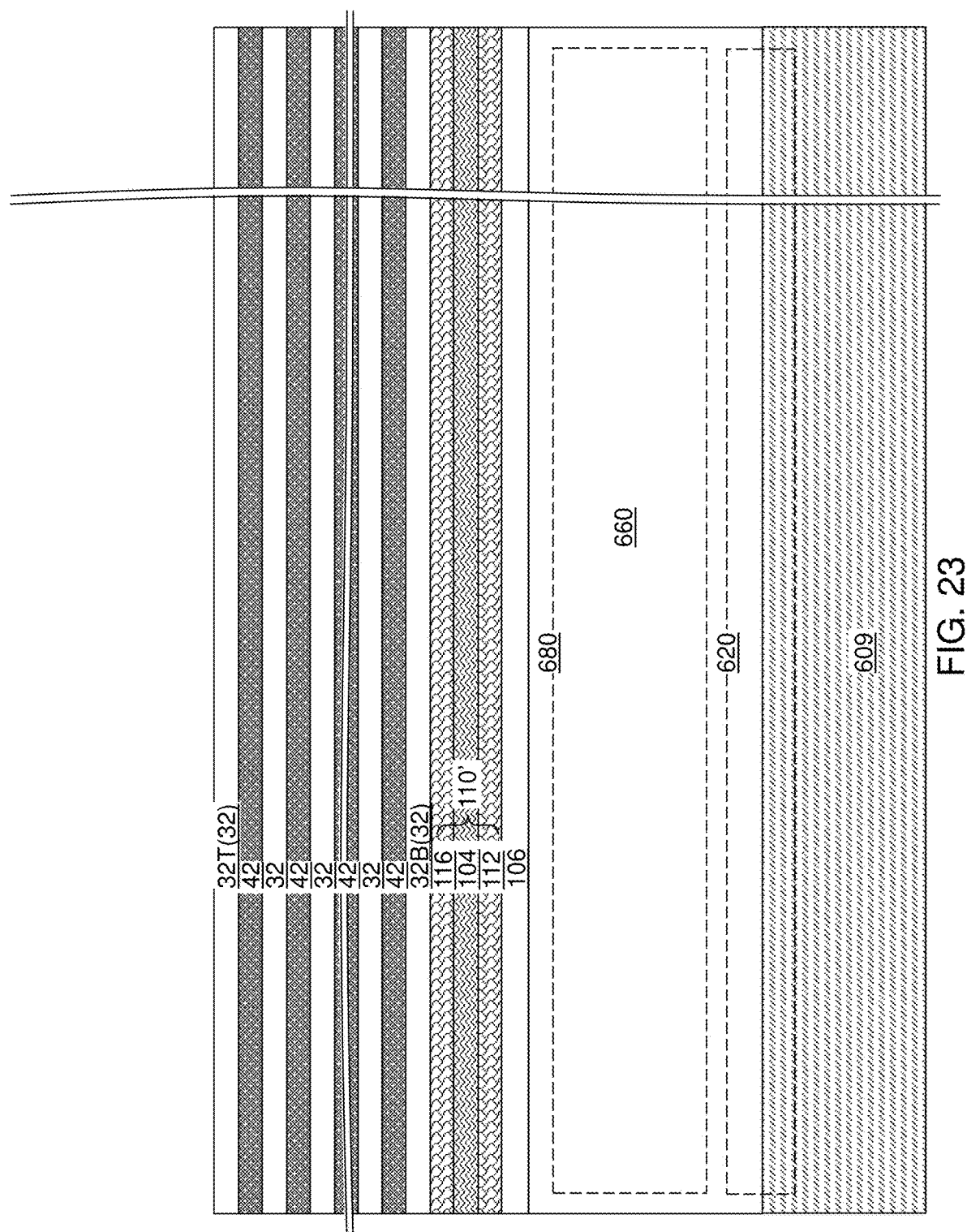
FIG. 23 is a vertical cross-sectional view of the first alternative configuration of the first exemplary structure after formation of an alternating stack of insulating layers and sacrificial material layers according to the first embodiment of the present disclosure.

Referring to FIG. 23, the processing steps described with reference to FIG. 1 can be performed to form the in-process source-level material layers 110' and the alternating stack (32, 42) over the metal interconnect structures 680 and the dielectric material layers 660.

Figure 24:
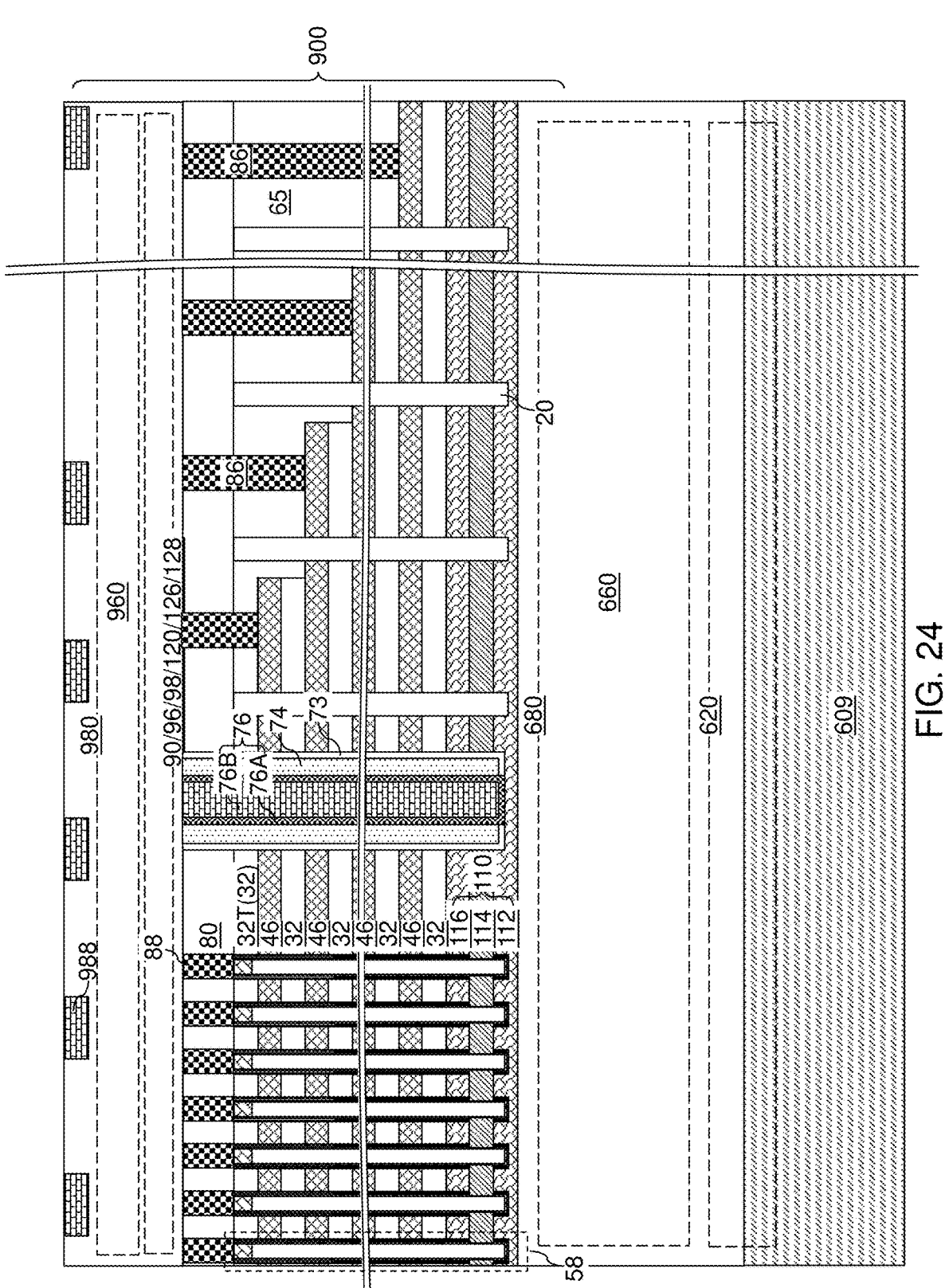
FIG. 24 is a vertical cross-sectional view of the first alternative configuration of the first exemplary structure after formation of a memory die according to the first embodiment of the present disclosure.

Referring to FIG. 24, the processing steps described with reference to FIGS. 2-18 can be performed to provide the memory die 900, which optionally be bonded to a logic die 700. In case the memory die of FIG. 24 is bonded to a logic die 700, the semiconductor devices 620 may comprise a first subset of a peripheral circuit for controlling operation of a three-dimensional memory device, and the logic die 700 may comprise a second subset of the peripheral circuit for controlling operation of a three-dimensional memory device.

Figure 25:
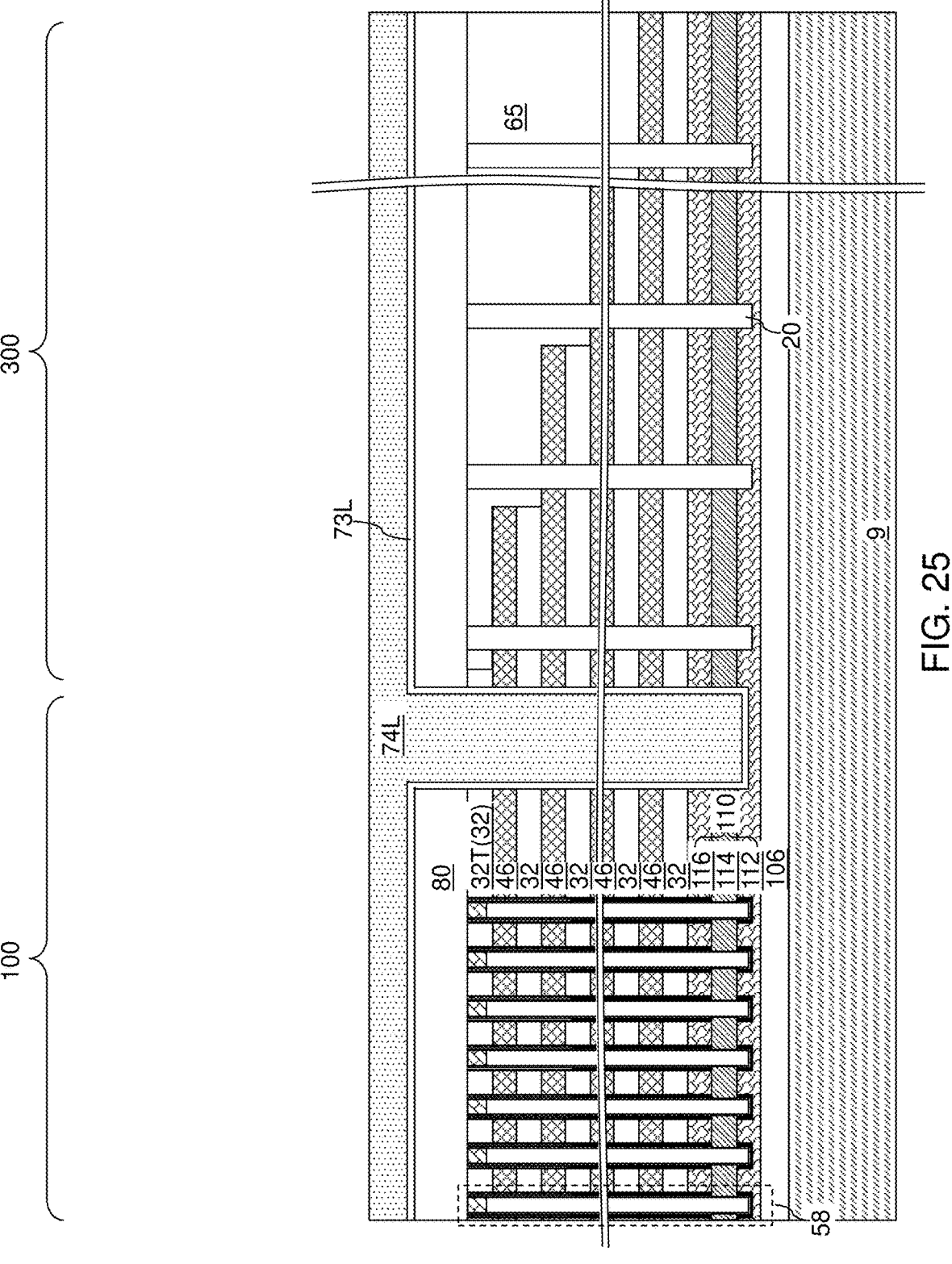
FIG. 25 is a vertical cross-sectional view of a second alternative configuration of the first exemplary structure after formation of an optional insulating liner layer and a phosphorus-doped silicate glass layer according to the first embodiment of the present disclosure.

Referring to FIG. 25, a second alternative configuration of the first exemplary structure can be derived from the first exemplary structure illustrated in FIG. 13 by increasing the thickness of the phosphorus-doped silicate glass layer 74L such that the phosphorus-doped silicate glass layer 74L fills each of the lateral isolation trenches 79. In some embodiments, an airgap may be formed in the phosphorus-doped silicate glass layer 74L. Generally, the thickness of the phosphorus-doped silicate glass layer 74L can be greater than one half of the width of each lateral isolation trench 79.

Figure 26:
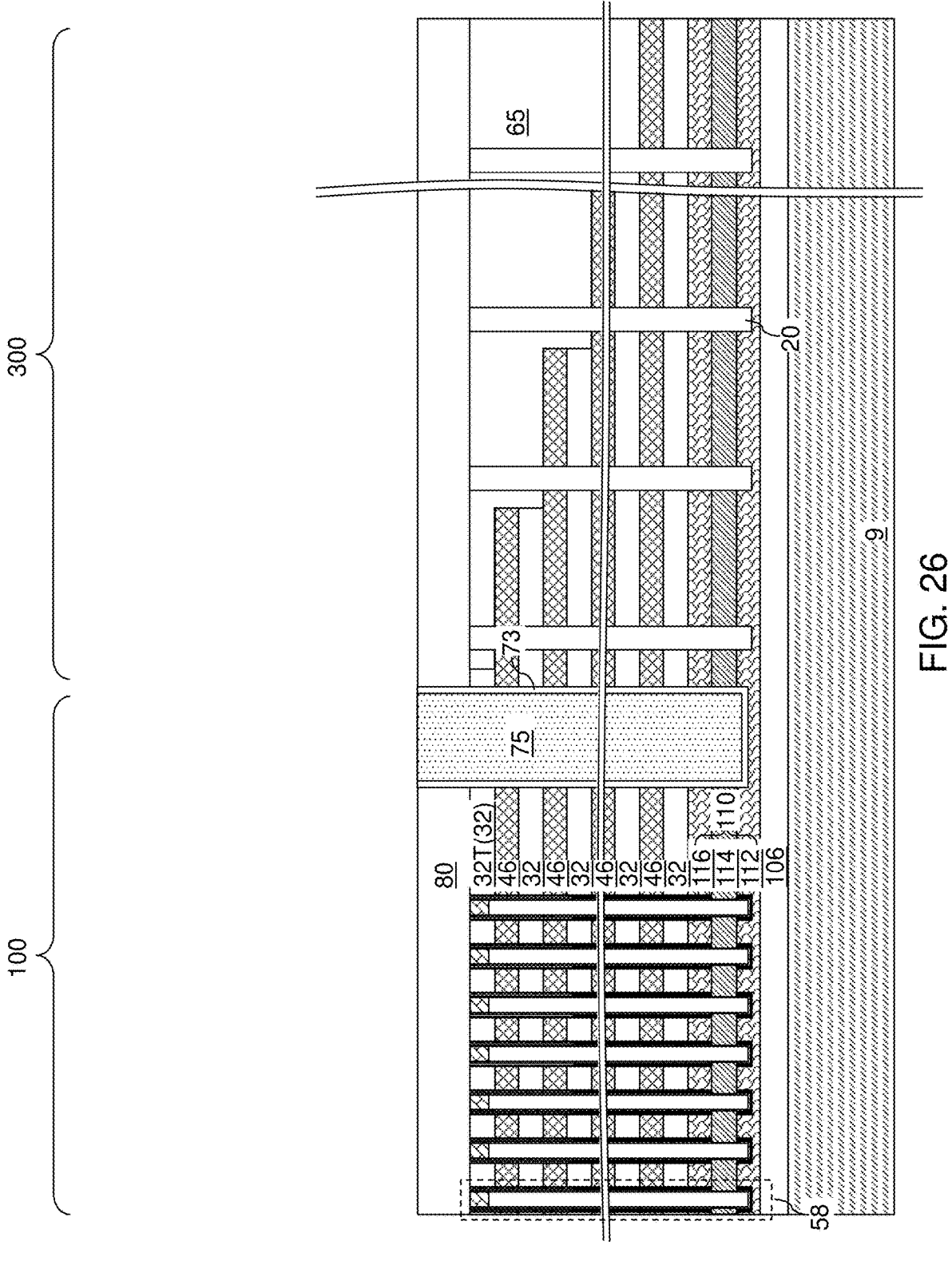
FIG. 26 is a vertical cross-sectional view of the second alternative configuration of the first exemplary structure after formation of an insulating liner and a phosphorus-doped silicate glass fill structure in each lateral isolation trench according to the first embodiment of the present disclosure.

Referring to FIG. 26, an anisotropic etch process can be performed to remove horizontally-extending portions of the phosphorus-doped silicate glass layer 74L and the optional insulating liner layer 73L from above the horizontal plane including the top surface of the contact-level dielectric layer 80. Each remaining portion of the phosphorus-doped silicate glass layer 74L located within a respective lateral isolation trench 79 comprises a phosphorus-doped silicate glass fill structure 75. Each remaining portion of the insulating liner layer 73L (if present) located within a respective lateral isolation trench 79 comprises an insulating liner 73. An insulating liner 73 and a phosphorus-doped silicate glass fill structure 75 can be formed in each lateral isolation trench 79.

The combination of all material portions filling a lateral isolation trench 79 constitutes a lateral isolation trench fill structure (72, 75). Each lateral isolation trench fill structure (73, 75) comprises phosphorus-doped silicon oxide portions at each level of the insulating layers 32 (comprising portions of the phosphorus-doped silicate glass fill structure 75 located at levels of the insulating layers 32).

Figure 27A:
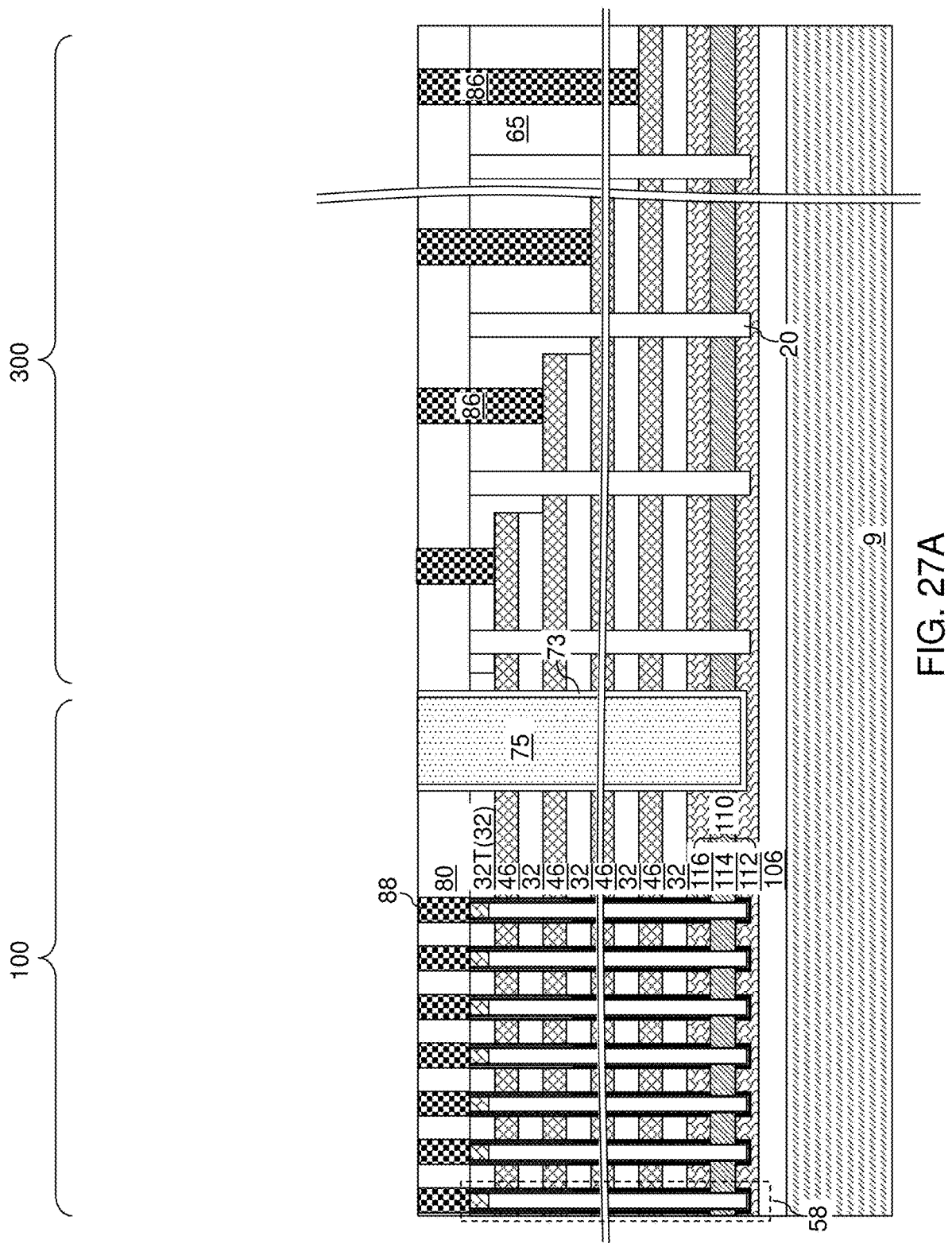
FIG. 27A is a vertical cross-sectional view of the second alternative configuration of the first exemplary structure after formation of various contact via structures according to the first embodiment of the present disclosure.
Figure 27B:
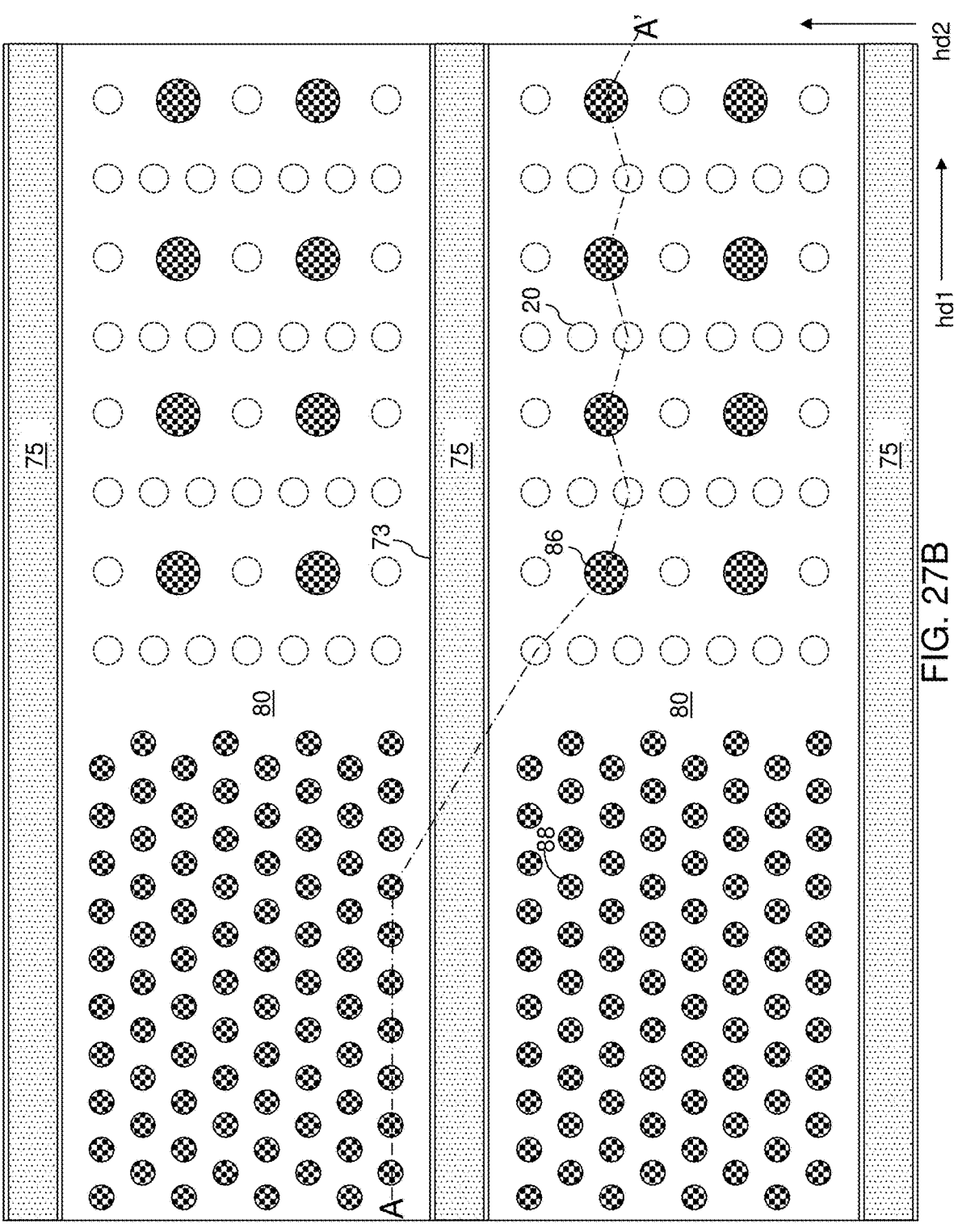
FIG. 27B is a top-down view of the first exemplary structure of FIG. 27A. The vertical plane A-A' is the cut plane of the vertical cross-sectional view of FIG. 27A.

Referring to FIGS. 27A and 27B, the processing steps described with reference to FIGS. 16A and 16B can be performed to form various contact via structures (88, 86).

Figure 28:
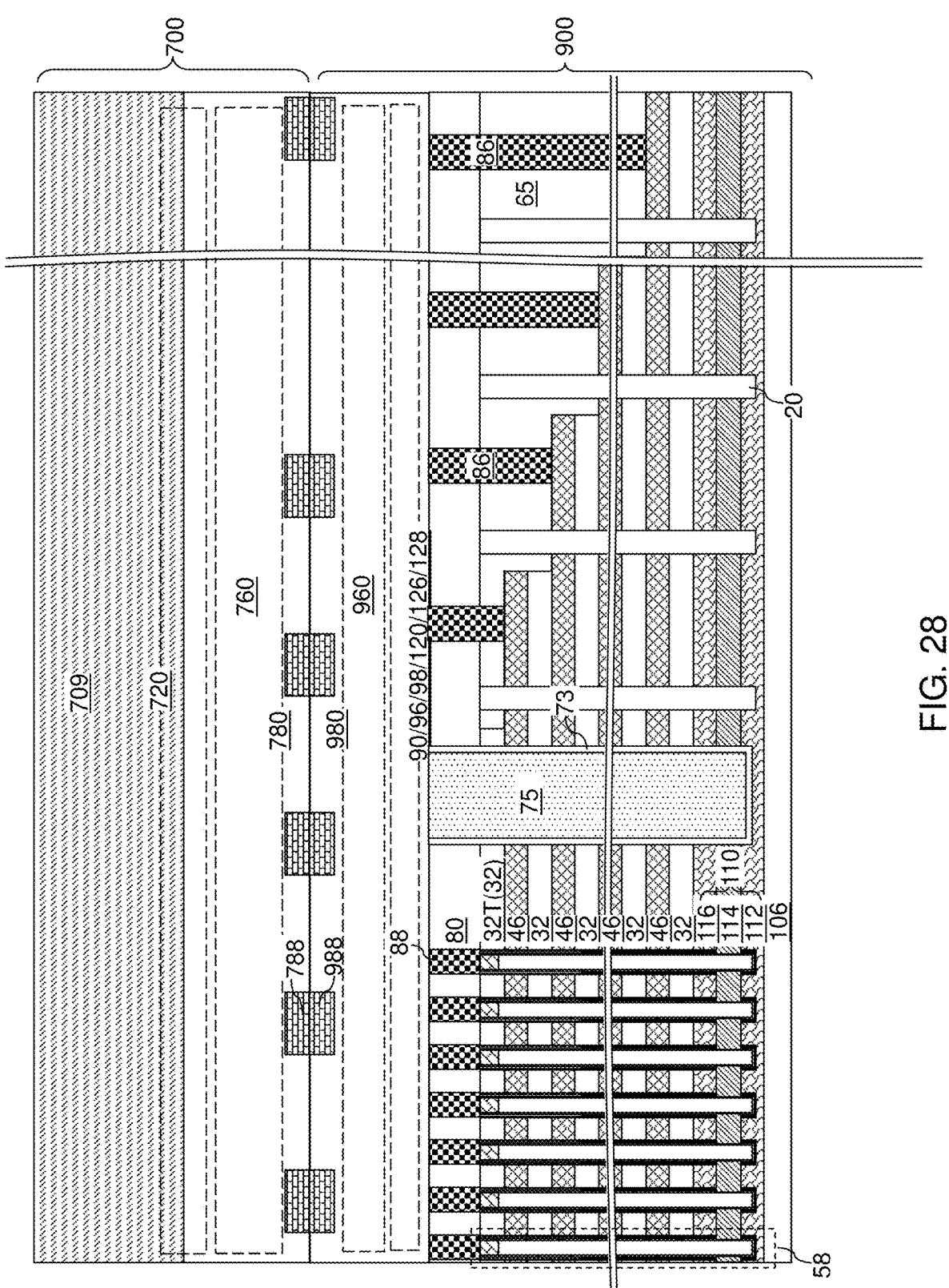
FIG. 28 is a vertical cross-sectional view of the second alternative configuration of the first exemplary structure after bonding the memory die to a logic die, removal of the carrier substrate, and formation of backside contact pads according to the first embodiment of the present disclosure.

Referring to FIG. 28, the processing steps described with reference to FIGS. 17A-28 can be performed to form a memory die 900, to bond the memory die 900 to a logic die 700, and to optionally remove the substrate 9.

Figure 29:
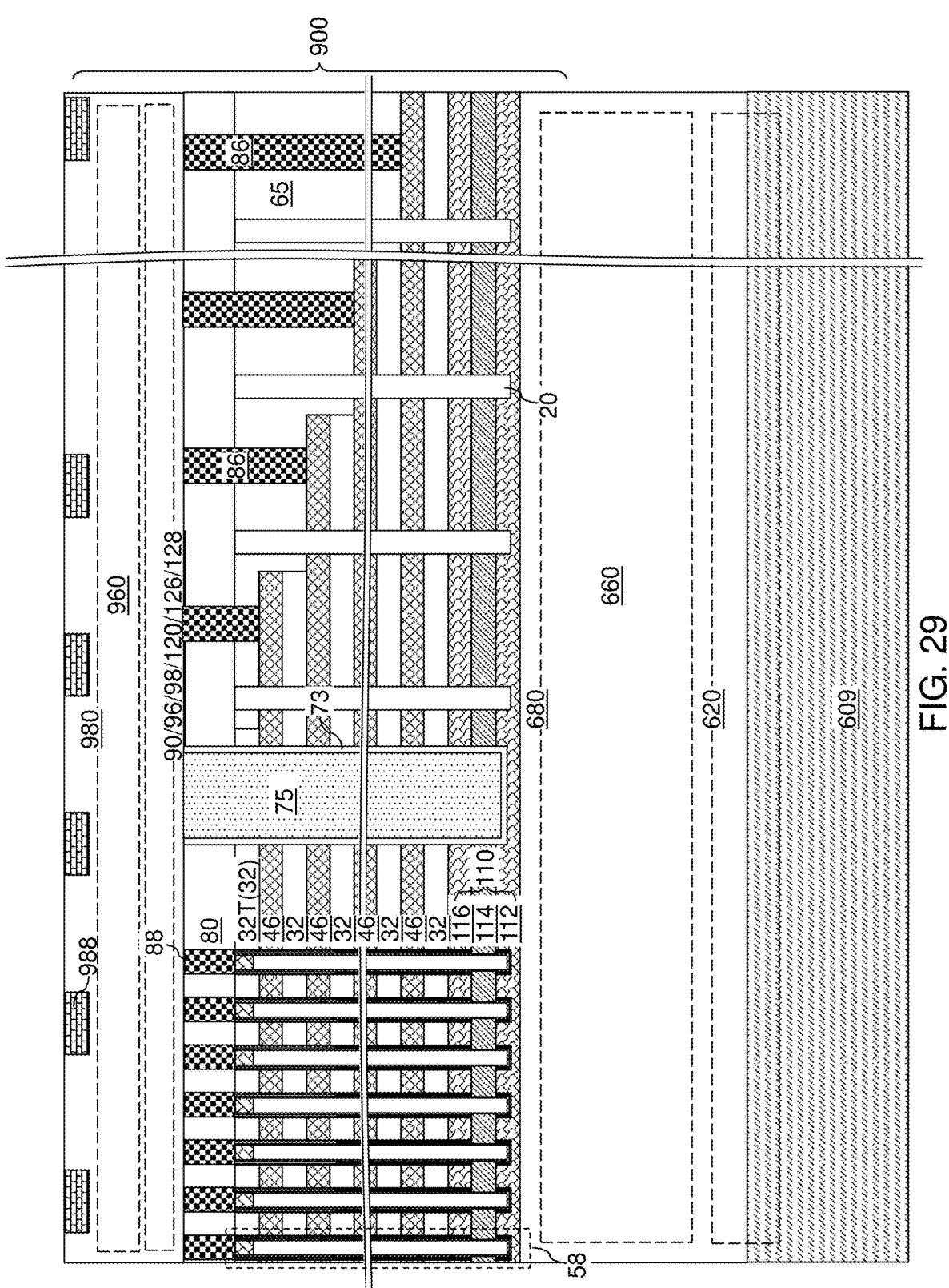
FIG. 29 is a vertical cross-sectional view of a third alternative configuration of the first exemplary structure according to the first embodiment of the present disclosure.

Referring to FIG. 29, a third alternative configuration of the first exemplary structure can be derived from the second alternative configuration of the first exemplary structure by forming semiconductor devices 620 comprising a peripheral circuit for controlling operation of a three-dimensional memory device on a semiconductor substrate 609, by forming metal interconnect structures 680 embedded in dielectric material layers 660 over the semiconductor devices 620, and then performing the processing steps described with reference to FIGS. 1-12 and 25-28B. In other words, the combination of the semiconductor substrate 609, the semiconductor devices 620, the dielectric material layers 660, and the metal interconnect structures 680 can be employed in lieu of the carrier substrate 9 and the stopper insulating layer 106.

Figure 30A:
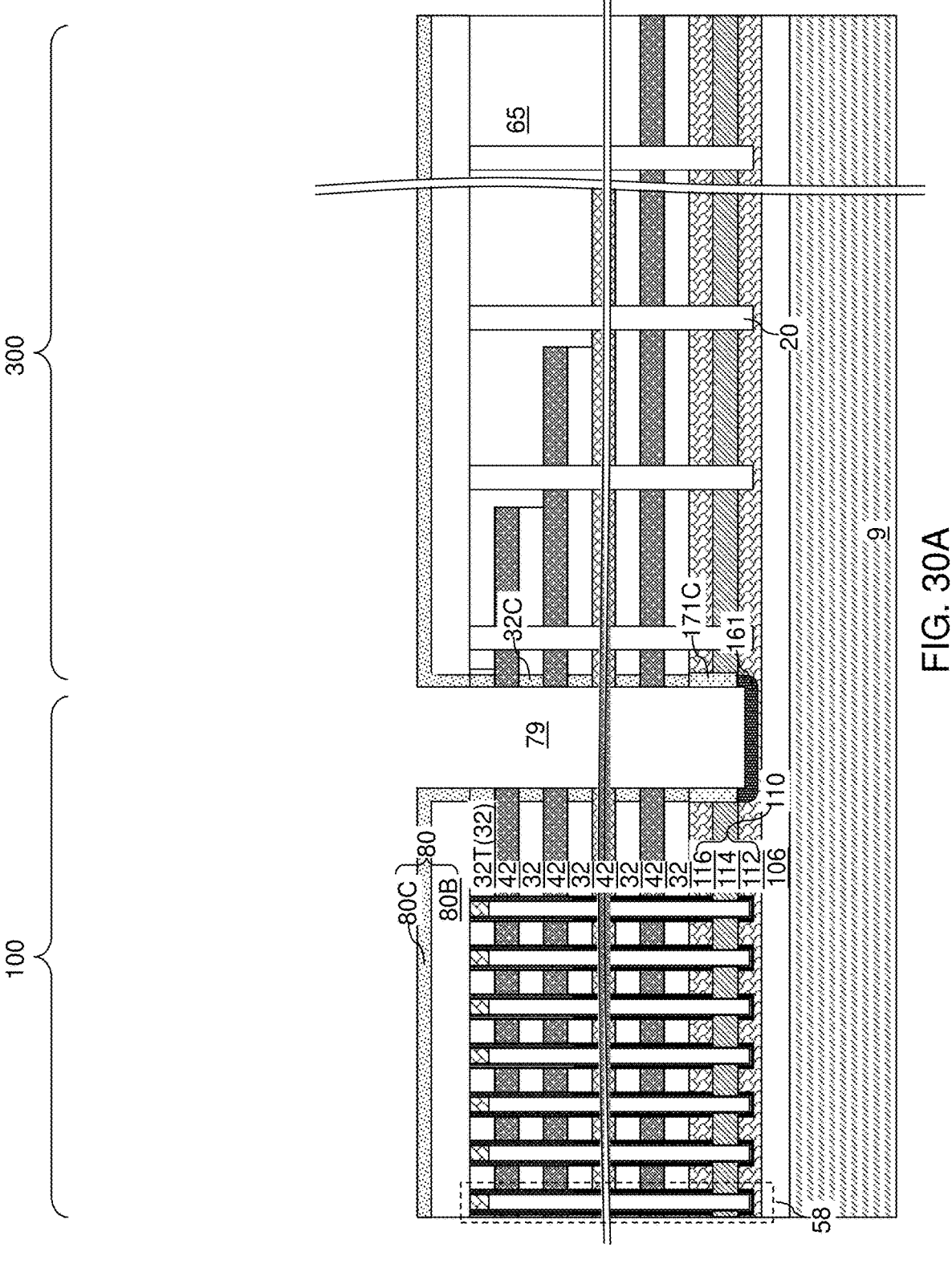
FIG. 30A is a vertical cross-sectional view of a second exemplary structure after implantation of carbon atoms around lateral isolation trenches and in upper portions of a contact-level dielectric layer according to a second embodiment of the present disclosure.
Figure 30B:
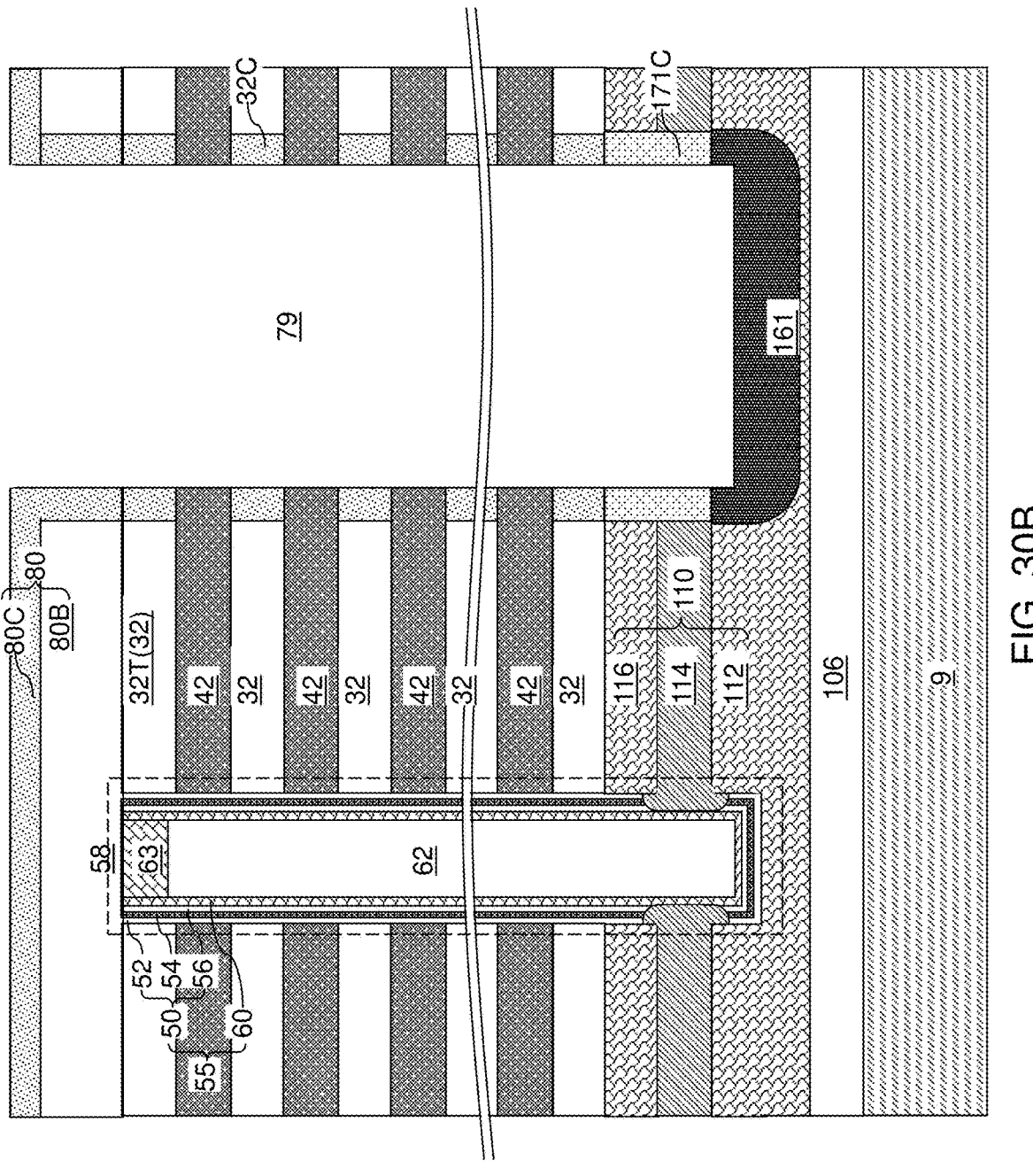
FIG. 30B is a magnified view of a region of the second exemplary structure of FIG. 30A around a lateral isolation trench and a memory opening fill structure.
Figure 30C:
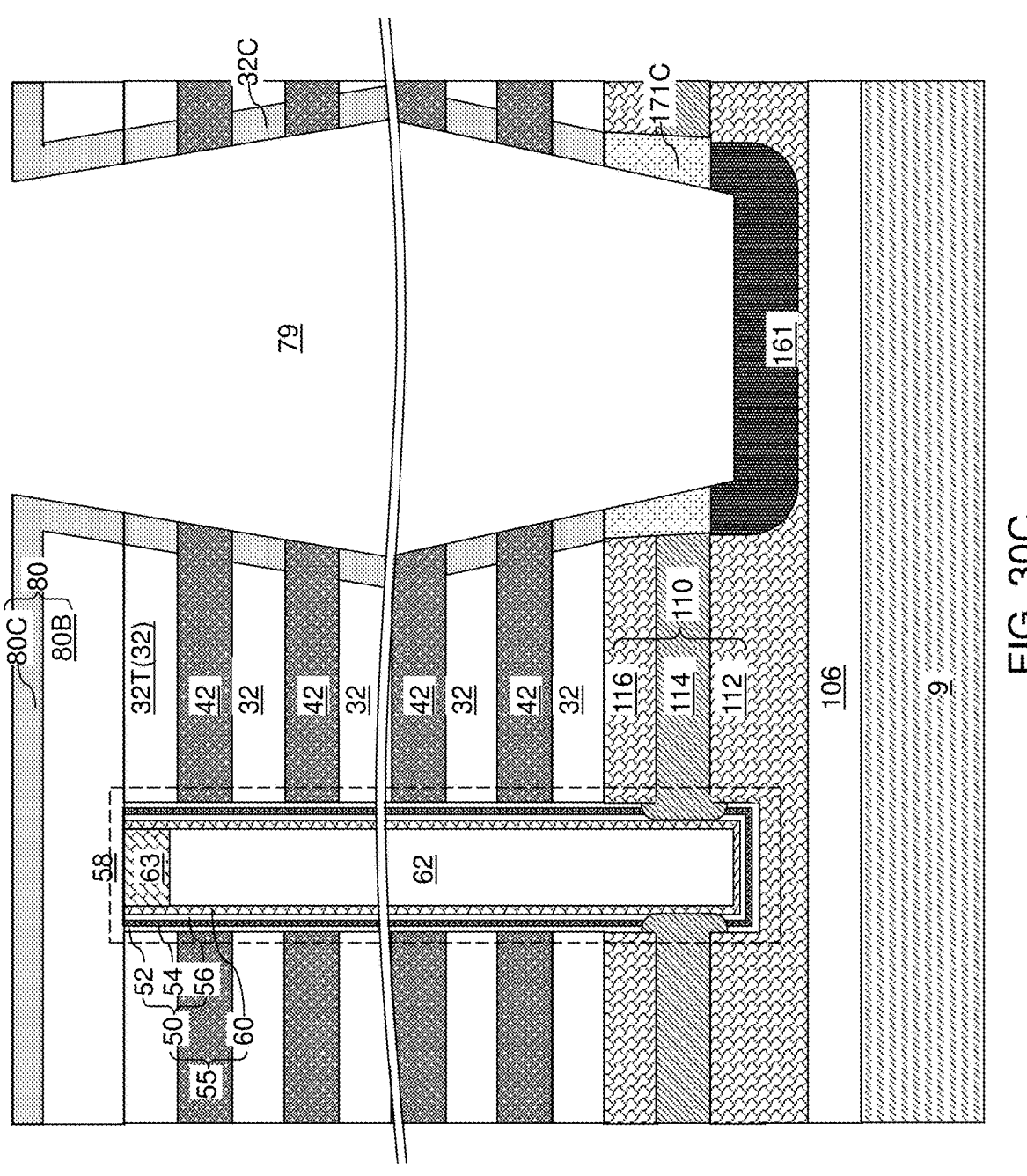
FIG. 30C is a magnified view of a region of an alternative embodiment of the second exemplary structure after the processing steps of FIG. 30A.

Referring to FIGS. 30A-30C, a second exemplary structure according to a second embodiment of the present disclosure can be derived from the first exemplary structure illustrated in FIG. 9 by optionally performing at least one angled ion implantation process that implants carbon atoms around the lateral isolation trenches 79 and in upper portions of the contact-level dielectric layer 80. FIG. 30A is a vertical cross-sectional view, FIG. 30 is a magnified view of a region of the second exemplary structure of FIG. 30A around a lateral isolation trench 79 and a memory opening fill structure 58, and FIG. 30C is a magnified view of a region of an alternative embodiment of the second exemplary structure which differs from the second exemplary structure illustrated in FIG. 30B by presence of a vertical width modulation in the lateral isolation trench 79. Generally, sidewalls of a lateral isolation trench 79 may have a straight vertical cross-sectional profile as illustrated in FIG. 30B, or may have a contoured vertical cross-sectional profile including a reverse-tapered upper portion and a tapered lower portion as illustrated in FIG. 30C. In the example illustrated in FIG. 30C, the variable width of a lateral isolation trench 79 may increase with a vertical distance from the horizontal plane including the top surface of the carrier substrate 9 in a lower portion of the lateral isolation trench 79, and may decrease with the vertical distance from the horizontal plane including the top surface of the carrier substrate 9 in an upper portion of the lateral isolation trench 79.

The at least one angled ion implantation process implants carbon atoms in the surface portions of the insulating layers 32, in the surface portions of the sacrificial material layers 42 that are proximal to the lateral isolation trench 79, in a portion of the lower source-level semiconductor layer 112 that underlines the lateral isolation trench 79, and in surface portions of the contact-level dielectric layer 80. In one embodiment, the insulating layers 32 comprise a silicon oxide material, such as undoped silicate glass. In this case, carbon-implanted portions of the insulating layers 32 comprise carbon-doped silicon oxide portions 32C. Surface portions of the source contact layer 114 and the upper source-level semiconductor layer 116 that are implanted with carbon atoms are herein referred to as carbon-doped semiconductor material portions 171C.

In one embodiment, a carbon-doped portion 161 of the at least one semiconductor material layer (such as an implanted portion of the lower source-level semiconductor layer 112) that underlies a lateral isolation trench 79 is doped with carbon atoms, and is herein referred to as a carbon-doped semiconductor material portion. In one embodiment, source-level material layers 110 doped with arsenic or phosphorus atoms, and the carbon-doped portion 171C of the at least one semiconductor material layer (such as the source-level material layers 110) can be doped with carbon atoms and arsenic or phosphorus atoms.

In one embodiment, the contact-level dielectric layer 80 overlies the alternating stacks (32, 46), and the lateral isolation trenches 79 extends through the contact-level dielectric layer 80. A carbon-doped silicon oxide portion can be formed at a level of the contact-level dielectric layer 80 around the lateral isolation trenches 79. In this case, the portion of the contact-level dielectric layer 80 that is not implanted with carbon is referred to as a base contact-level dielectric sublayer 80B that is laterally spaced from the lateral isolation trenches 79, and the carbon-implanted portion of the contact-level dielectric layer 80 comprises a carbon-doped contact-level dielectric sublayer 80C comprising carbon atoms at a higher atomic concentration than the base contact-level dielectric sublayer 80B.

The carbon-doped silicon oxide portions 32C, the carbon-doped semiconductor material portions 171C, the carbon-doped portions 161, and the carbon-doped contact-level dielectric sublayer 80C may have a respective thickness in a range from 10 nm to 200 nm, such as from 20 nm to 100 nm, and may include carbon atoms at a concentration of at least $1.0 \times 10^{16}/cm^3$, such as at an atomic percentage in a range from 0.01% to 10%, such as from 0.3% to 3%, although lesser and greater atomic percentages may also be employed.

Figure 31A:
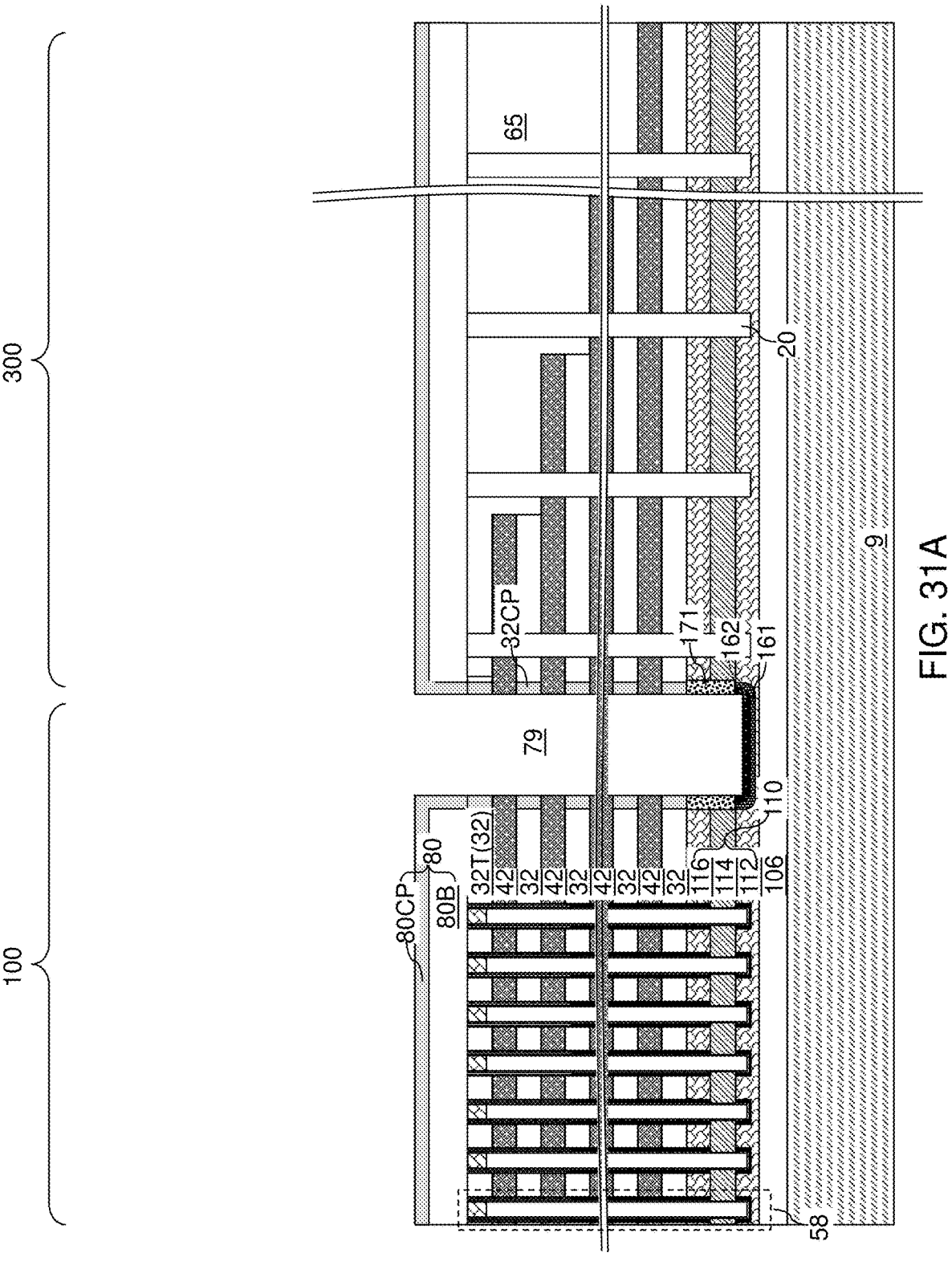
FIG. 31A is a vertical cross-sectional view of a second exemplary structure after implantation of phosphorus atoms around the lateral isolation trenches and in the upper portions of a contact-level dielectric layer according to the first embodiment of the present disclosure.
Figure 31B:
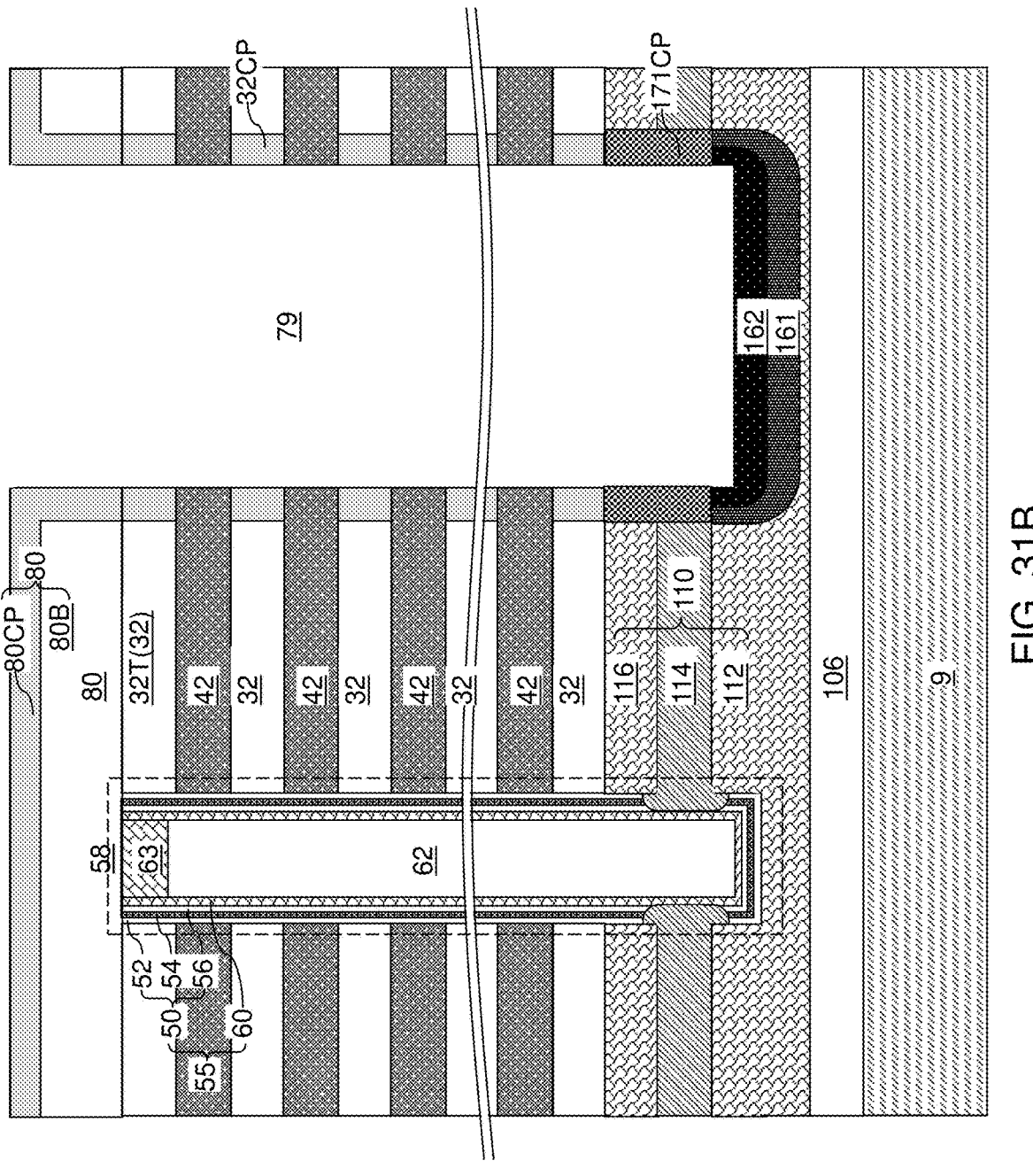
FIG. 31B is a magnified view of a region of the second exemplary structure of FIG. 31A around a lateral isolation trench and a memory opening fill structure.
Figure 31C:
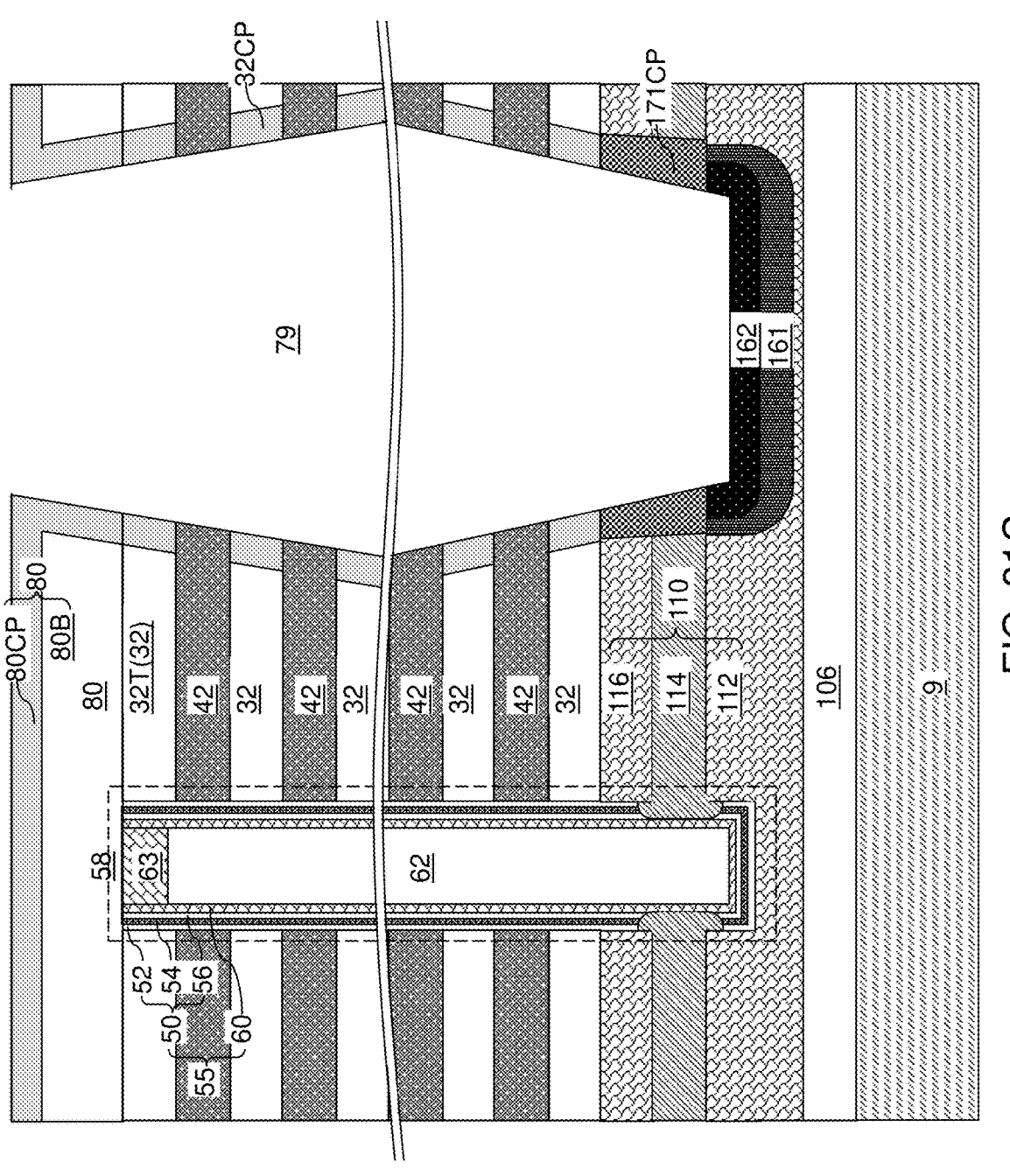
FIG. 31C is a magnified view of a region of an alternative embodiment of the second exemplary structure after the processing steps of FIG. 31A.

Referring to FIGS. 31A-31C, at least one additional angled ion implantation process can be performed to implant phosphorus atoms around the lateral isolation trenches 79 and into the carbon-doped contact-level dielectric sublayer 80C. FIG. 31B illustrates a configuration in which the lateral isolation trenches 79 have straight sidewalls, and FIG. 31C illustrates a configuration in which the lateral isolation trenches 79 have contoured sidewalls.

The at least one additional angled ion implantation process implants phosphorus atoms in the carbon-doped silicon oxide portions 32C (which are surface portions of the insulating layers 32), in an upper region of each carbon-doped portion 161, in the carbon-doped contact-level dielectric sublayer 80C, and in the carbon-doped semiconductor material portions 171C. In one embodiment, the insulating layers 32 comprise a silicon oxide material such as undoped silicate glass, and the carbon-doped silicon oxide portions 32C can be converted into carbon-and-phosphorus-doped silicon oxide portions 32CP, which may also be referred to as doped silicon oxide portions. The carbon-doped semiconductor material portions 171C are converted into carbon-and-phosphorus-doped semiconductor material portion 171CP.

An upper region of each carbon-doped portion 161 of the at least one semiconductor material layer (such as an implanted portion of the lower source-level semiconductor layer 112) that underlies a respective lateral isolation trench 79 is additionally doped with phosphorus atoms, and is converted into a carbon-and-phosphorus-doped portion 162, or as a carbon-and-phosphorus-doped semiconductor material portion. The ion implanted regions may be activated by an activation anneal, such as an anneal at a temperature of 900 to 1100 degrees Celsius.

Without wishing to be bound by a particular theory, it is believed that the carbon-and-phosphorus-doped silicon portion 162 may reduce the number of crystalline defects, such as dislocations, located in single crystalline silicon or polysilicon below the lateral isolation trenches 79 compared to heavily arsenic doped silicon regions located below the lateral isolation trenches 79. Such defects may be generated due to crystallization mismatch between arsenic and boron doped silicon regions during thermal processing of the memory device, especially if the source-level material layers 110 are omitted and a p-type silicon substrate 9 is located directly below the lateral isolation trenches 79. In this case, a p-n junction is formed between the p-type silicon substrate 9 and n-type arsenic doped silicon source regions formed in the p-type silicon substrate 9 by arsenic ion implantation through the lateral isolation trenches 79. The reduction of the defects may result in a lower leakage current in the silicon material (e.g., at the source region) located below the lateral isolation trenches 79.

In one embodiment, the contact-level dielectric layer 80 overlies the alternating stacks (32, 46), and the lateral isolation trenches 79 extends through the contact-level dielectric layer 80. A carbon-and-phosphorus-doped silicon oxide portion can be formed at a level of the contact-level dielectric layer 80 around the lateral isolation trenches 79. In this case, the base contact-level dielectric sublayer 80B is not implanted with carbon atoms or phosphorus atoms, and the portion of the contact-level dielectric layer 80 that is implanted with carbon atoms and with phosphorus atoms comprises a carbon-and-phosphorus-doped contact-level dielectric sublayer 80CP comprising carbon atoms at a higher atomic concentration than the base contact-level dielectric sublayer 80B and comprising phosphorus atoms at a higher atomic concentration than the base contact-level dielectric sublayer 80B.

The carbon-and-phosphorus-doped silicon oxide portions 32CP, the carbon-and-phosphorus-doped semiconductor material portions 171CP, the carbon-and-phosphorus-doped portions 162, and the carbon-and-phosphorus-doped contact-level dielectric sublayer 80CP may have a respective thickness in a range from 10 nm to 200 nm, such as from 20 nm to 100 nm, and may include phosphorus atoms at a concentration of at least $1.0 \times 10^{16}/cm^3$, such as at an atomic percentage in a range from 0.01% to 15%, such as from 2% to 10%, and/or from 4% to 8%, although lesser and greater atomic percentages may also be employed.

Generally, phosphorus-doped silicon oxide portions (such as the carbon-and-phosphorus-doped silicon oxide portions 32CP) can be formed around each lateral isolation trench 79 at each level of the insulating layers 32. In one embodiment, the phosphorus-doped silicon oxide portions comprise phosphorus-implanted portions of the insulating layers 32. A surface portion of the at least one semiconductor material layer (such as the source-level material layers 110) that underlies a lateral isolation trench 79 is doped with carbon atoms during the at least one angled ion implantation process that implants carbon atoms, and is doped with phosphorus atoms during the at least one angled ion implantation process that implants phosphorus atoms.

In one embodiment, the insulating layers 32 comprise an undoped silicon oxide material, and the carbon-and-phosphorus-doped silicon oxide portions 32CP comprise portions of the insulating layers 32 that are proximal to the lateral isolation trenches 79. The carbon-and-phosphorus-doped silicon oxide portions 32CP have a higher atomic concentration of phosphorus and carbon atoms than portions of the insulating layers 32 that are not the carbon-and-phosphorus-doped silicon oxide portions 32CP.

In one embodiment, the carbon-and-phosphorus-doped silicon oxide portions 32CP are doped with carbon atoms at an atomic percentage of at least 0.001%. In one embodiment, the carbon-and-phosphorus-doped silicon oxide portions 32CP are located outside the lateral isolation trench 79 and are vertically spaced from each other.

Figure 32A:
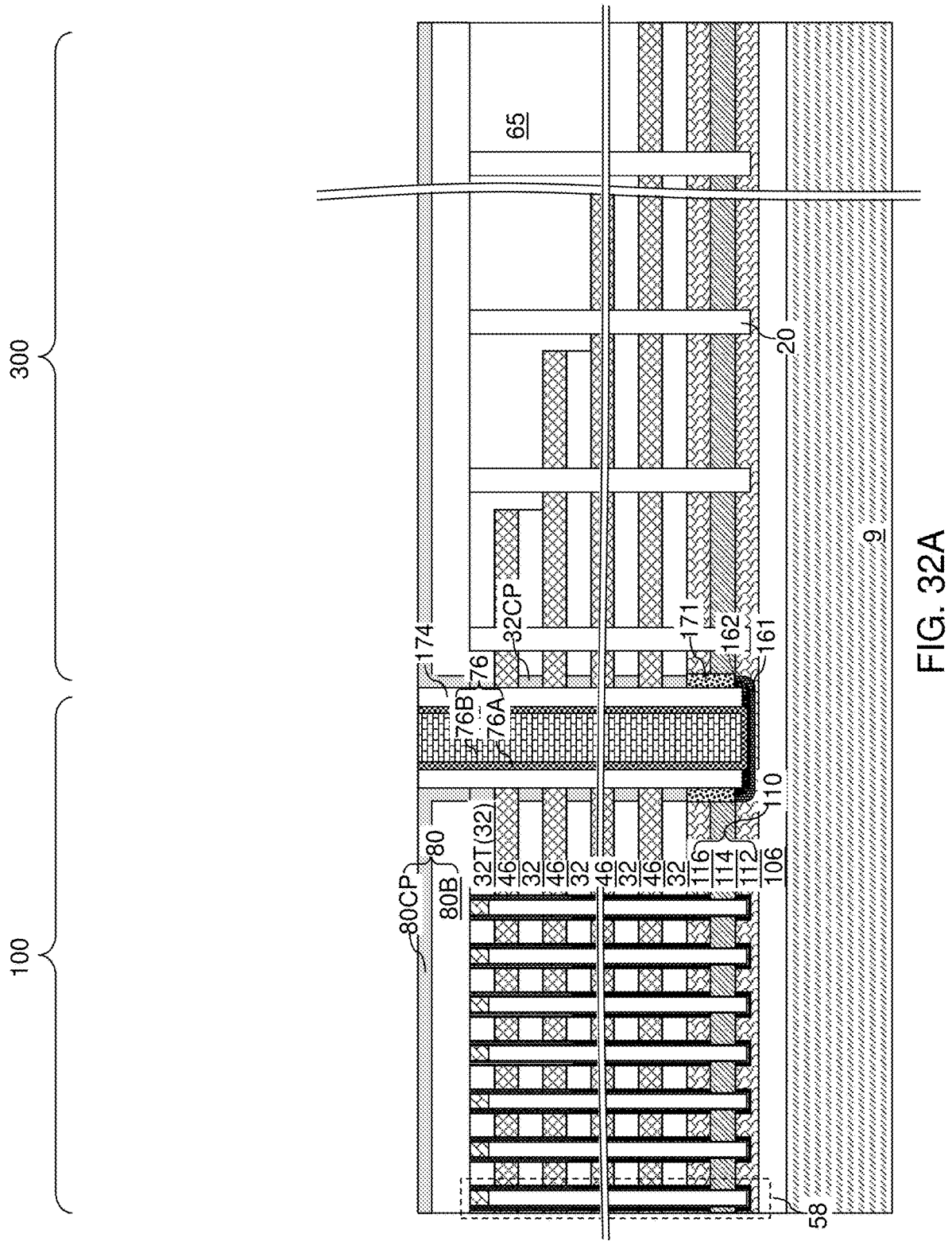
FIG. 32A is a vertical cross-sectional view of a second exemplary structure after formation of lateral isolation trench fill structures according to the first embodiment of the present disclosure.
Figure 32B:
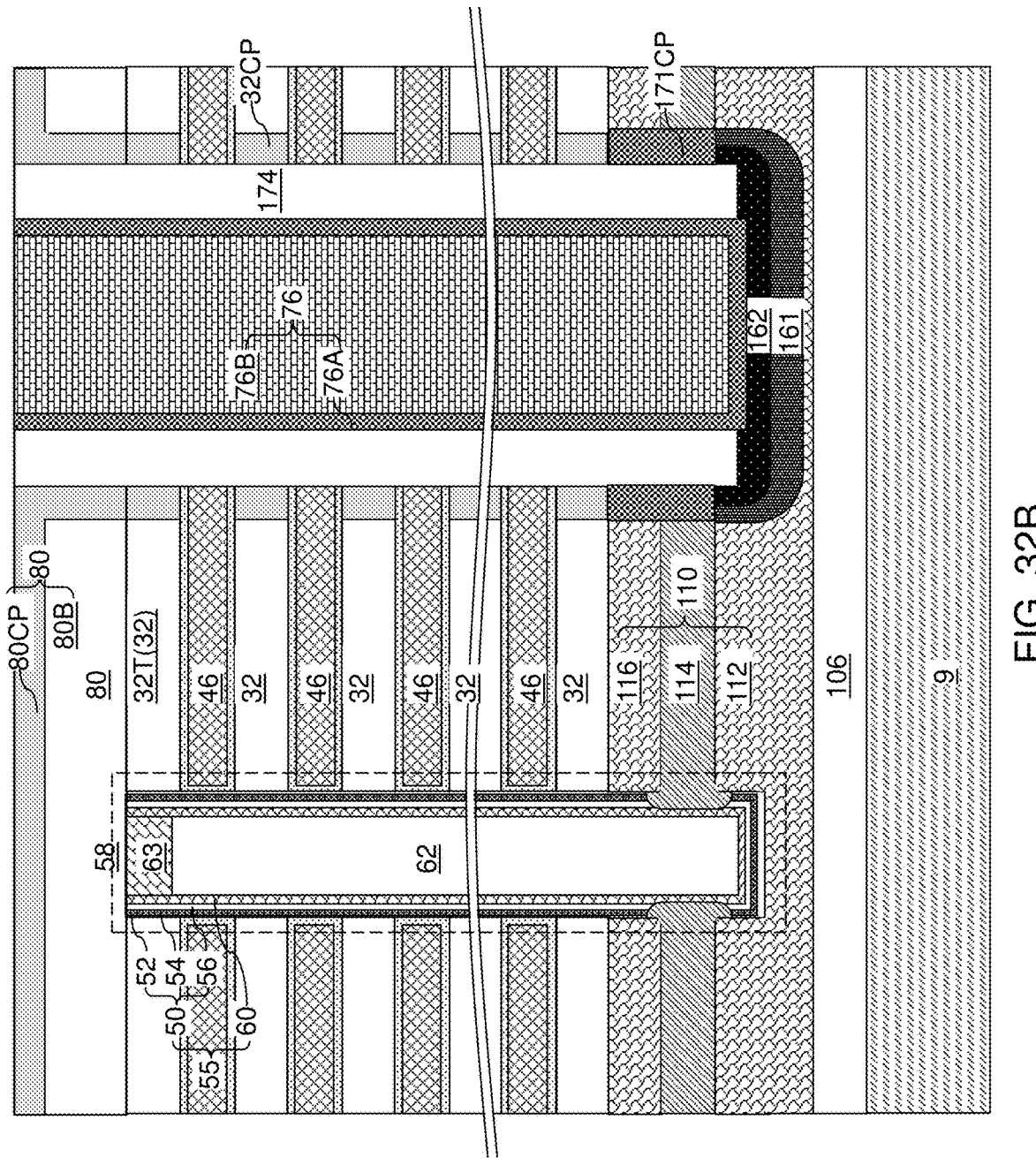
FIG. 32B is a magnified view of a region of the second exemplary structure of FIG. 32A around a lateral isolation trench and a memory opening fill structure.
Figure 32C:
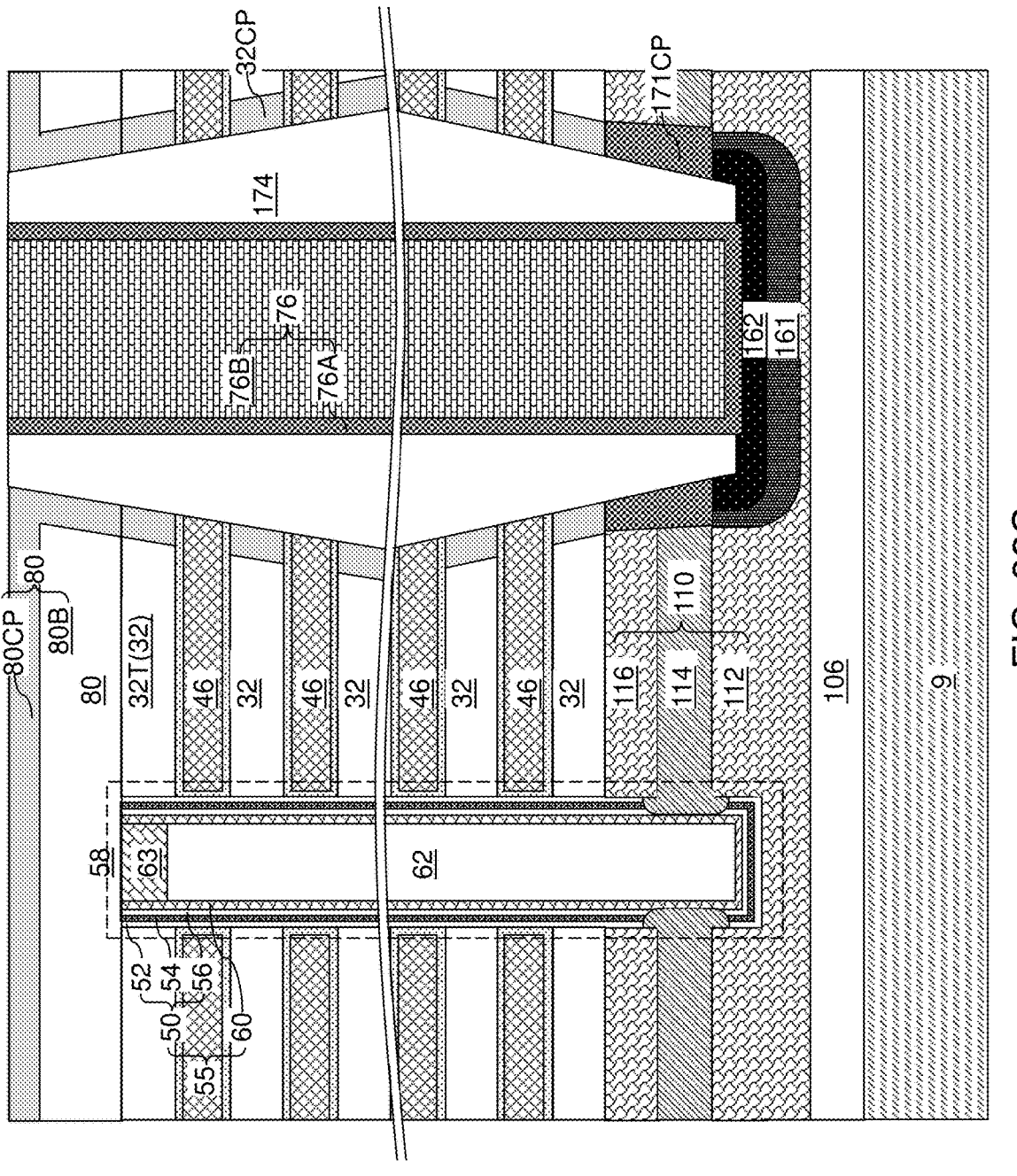
FIG. 32C is a magnified view of a region of an alternative embodiment of the second exemplary structure after the processing steps of FIG. 32A.

Referring to FIGS. 32A-32C, the sacrificial material layers 42 are replaced with the electrically conductive layers 42, as described above with respect to FIGS. 10-12. Then, an insulating spacer material layer can be conformally deposited by a conformal deposition process such as a chemical vapor deposition process. The insulating spacer material layer may comprise undoped silicate glass, or may comprise a phosphorus-doped silicate glass material that may be employed for the phosphorus-doped silicate glass layer 74L as described above. The thickness of the insulating spacer material layer is less than one half of the width of each lateral isolation trench 79. An anisotropic etch process can be performed to remove horizontally-extending portions of the insulating spacer material layer. Each remaining vertically-extending portion of the insulating spacer material layer constitutes an insulating spacer 174. The insulating spacer 174 may comprise undoped silicate glass, or phosphosilicate glass including phosphorus atoms.

The conductive fill structure 76 described above is then formed over the insulating spacer 174 as described above. The combination of all material portions filling a lateral isolation trench 79 constitutes a lateral isolation trench fill structure (174, 76). In one embodiment, each lateral isolation trench fill structure (174, 76) comprises a conductive fill structure 76 that is formed within and is laterally surrounded by the phosphorus-doped silicon oxide portions (such as the carbon-and-phosphorus-doped silicon oxide portions 32CP), and is electrically connected to the at least one semiconductor material layer (such as the source-level material layers 110).

Figure 33A:
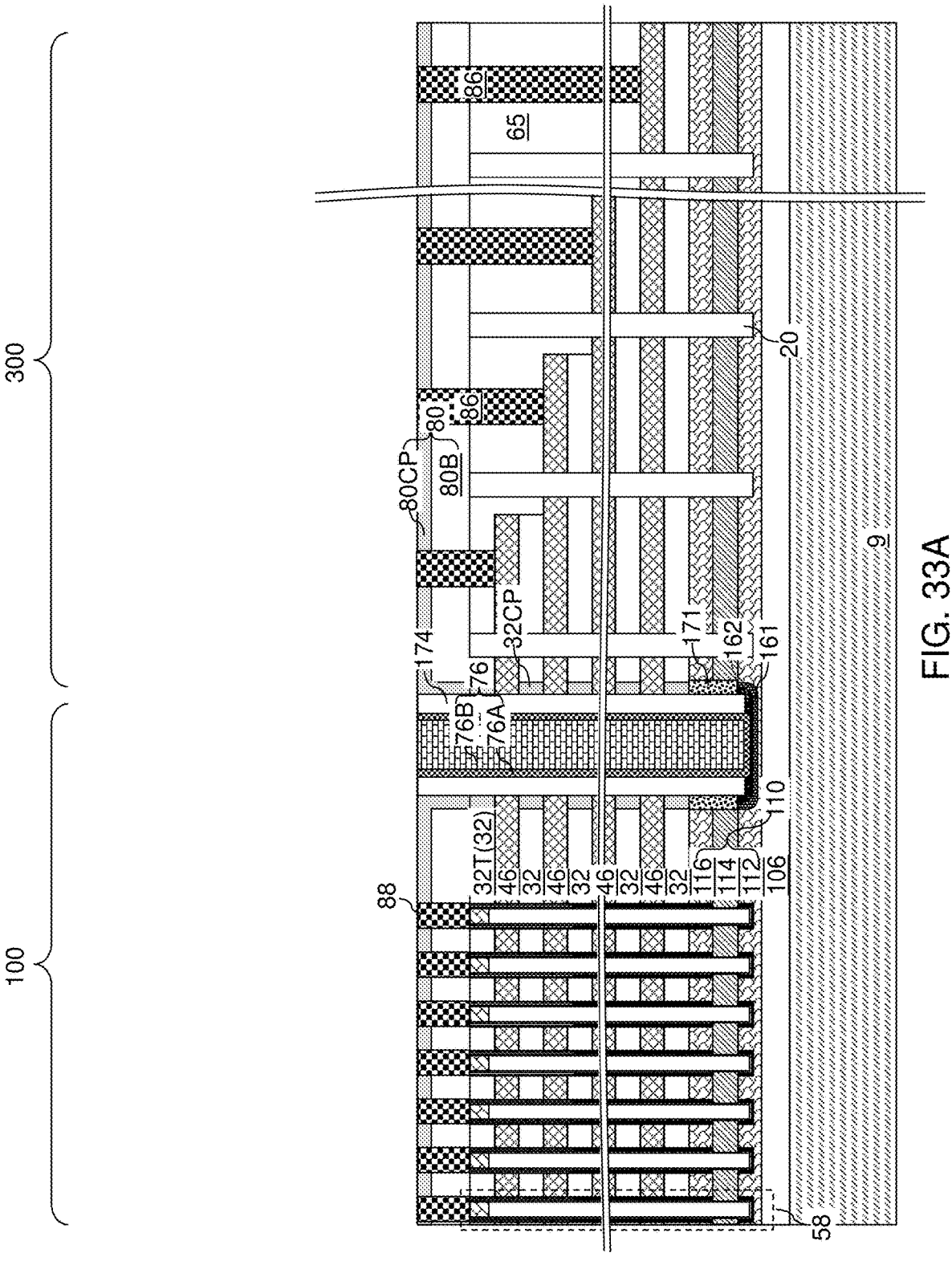
FIG. 33A is a vertical cross-sectional view of the second exemplary structure after formation of after formation of various contact via structures according to the first embodiment of the present disclosure.
Figure 33B:
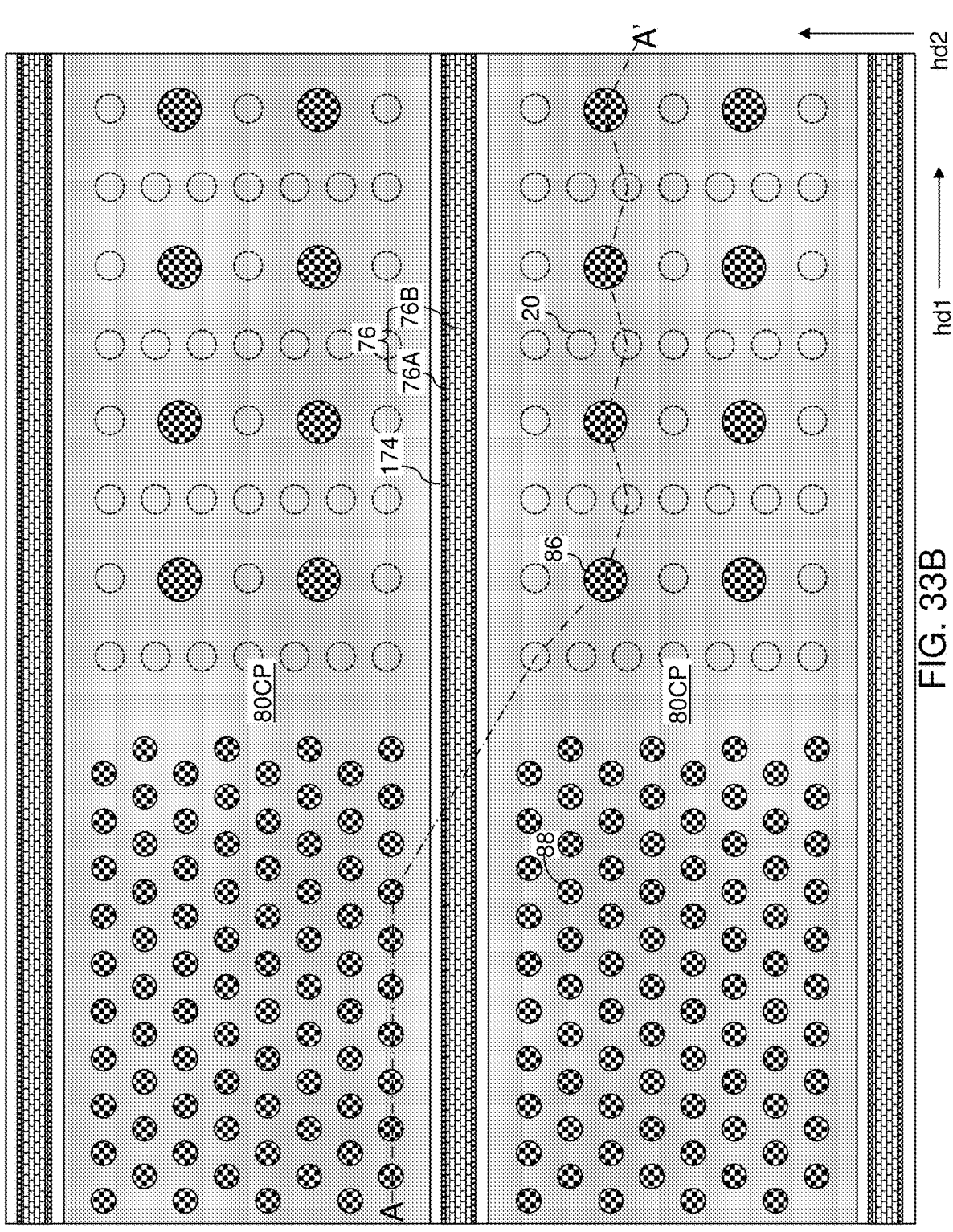
FIG. 33B is a top-down view of the second exemplary structure of FIG. 33A. The vertical plane A-A' is the cut plane of the vertical cross-sectional view of FIG. 33A.

Referring to FIGS. 33A and 33B, the processing steps described with reference to FIGS. 16A and 16B can be performed to form various contact via structures (88, 86).

Figure 34:
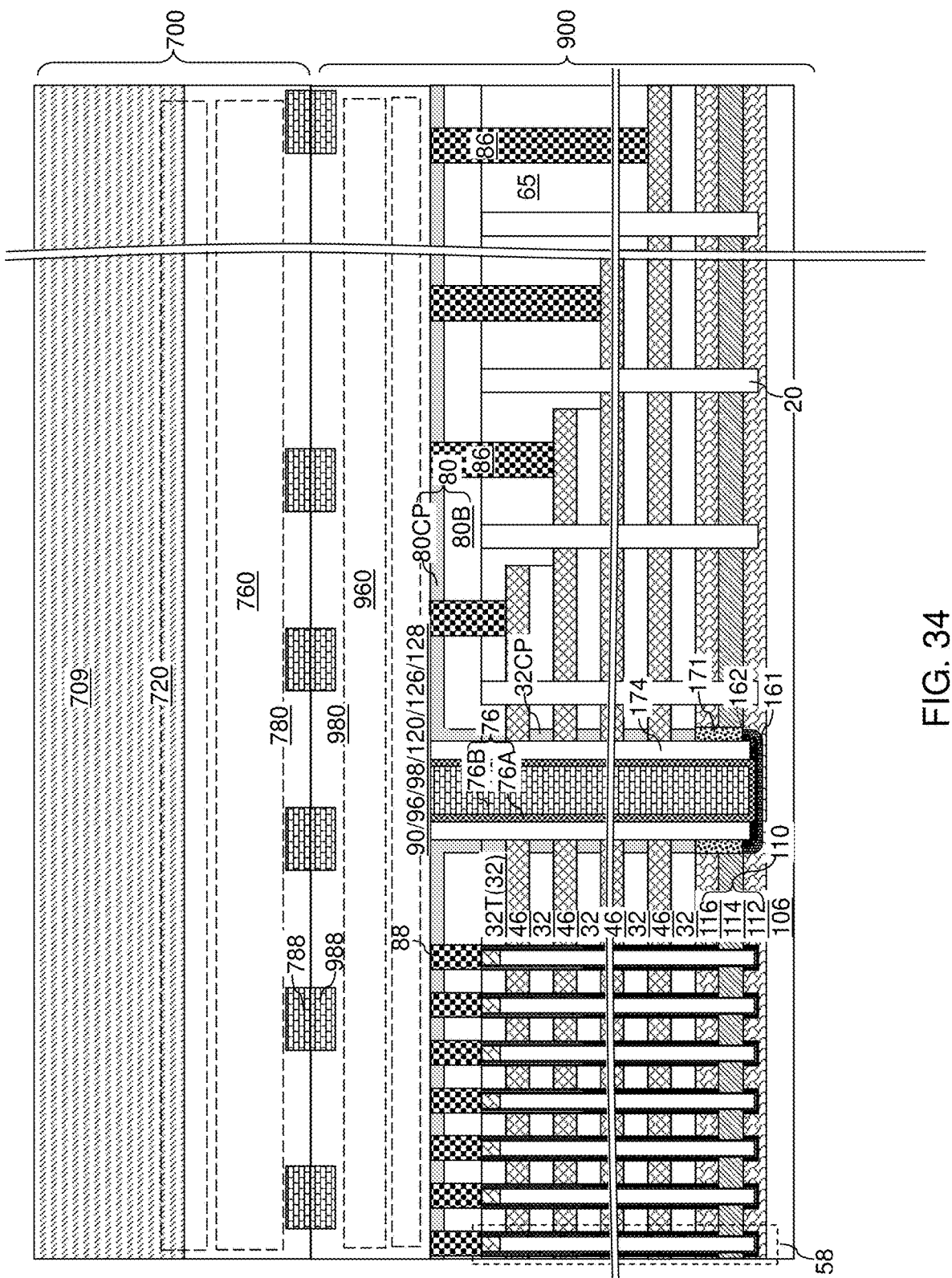
FIG. 34 is a vertical cross-sectional view of the second exemplary structure after bonding a memory die to a logic die, removal of a carrier substrate, and formation of backside contact pads according to the first embodiment of the present disclosure.

Referring to FIG. 34, the processing steps described with reference to FIGS. 17A-28 can be performed to form a memory die 900 and to bond the memory die 900 to a logic die 700.

Figure 35:
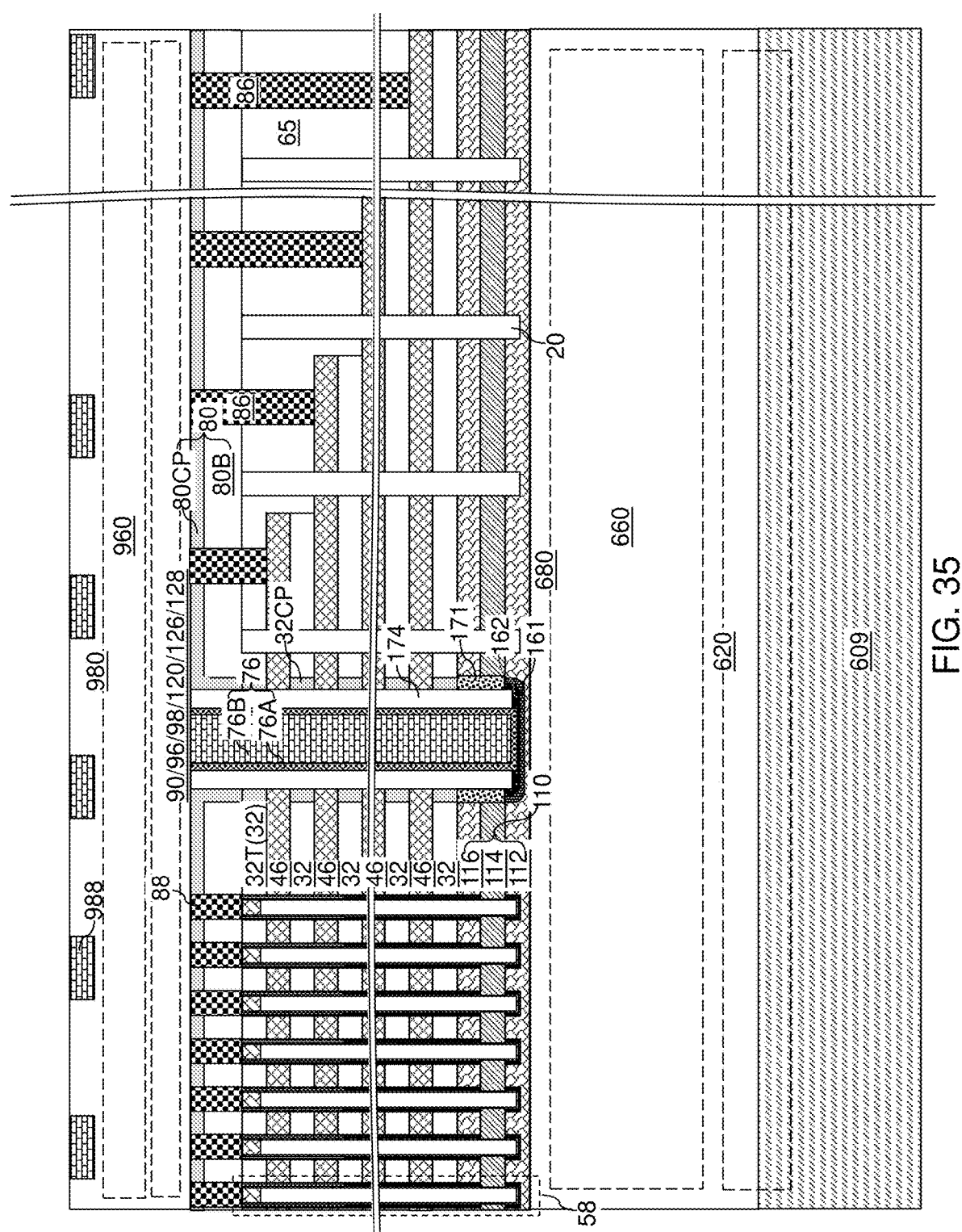
FIG. 35 is a vertical cross-sectional view of an alternative embodiment of the second exemplary structure.

Referring to FIG. 35, an alternative configuration of the second exemplary structure can be derived from the second exemplary structure by forming semiconductor devices 620 comprising a peripheral circuit for controlling operation of a three-dimensional memory device on a semiconductor substrate 609, by forming metal interconnect structures 680 embedded in dielectric material layers 660 over the semiconductor devices 620, and then performing the processing steps described with reference to FIGS. 1-9 and 30A-33B. In other words, the combination of the semiconductor substrate 609, the semiconductor devices 620, the dielectric material layers 660, and the metal interconnect structures 680 can be employed in lieu of the carrier substrate 9 and the stopper insulating layer 106.

Referring to all drawings and according to various embodiments of the present disclosure, a three-dimensional memory device comprises: a pair of alternating stacks (32, 46) of insulating layers 32 and electrically conductive layers 46 which are laterally spaced from each other by a lateral isolation trench 79; memory openings 49 vertically extending through a respective alternating stack (32, 46) in the pair of alternating stacks (32, 46); memory opening fill structures 58 located in a respective one of the memory openings 49 and comprising a respective vertical semiconductor channel 50 and a respective vertical stack of memory elements (e.g., portions of the memory film); and a lateral isolation trench fill structure {(73, 74, 76), (73, 75), (174, 76)} located in the lateral isolation trench 79, wherein phosphorus-doped silicon oxide portions (74, 75, 32CP) are located within or on sidewalls of the lateral isolation trench 79 at levels of the insulating layers 32.

In the second embodiment, the vertical semiconductor channel 60 comprises p-type silicon (e.g., boron doped polysilicon); and a n-type silicon source region 162 doped with phosphorus atoms is located below the lateral isolation trench fill structure (174, 76). In the second embodiment, the n-type silicon source region 162 is also doped with carbon atoms. In the second embodiment, the phosphorus-doped silicon oxide portions 32CP are located on the sidewalls of the lateral isolation trench 79.

In one embodiment, the three-dimensional memory device further comprises a contact-level dielectric layer 80 overlying the alternating stacks (32, 46). The lateral isolation trench 79 extends through the contact-level dielectric layer 80; and an additional phosphorus-doped silicon oxide portion is located at a level of the contact-level dielectric layer 80 within or around the lateral isolation trench 79. In the second embodiment, the contact-level dielectric layer 80 comprises: a base contact-level dielectric sublayer 80B that is laterally spaced from the lateral isolation trench fill structure {(73, 74, 76), (73, 75), (174, 76)}; and a doped contact-level dielectric sublayer 80CP overlying the base contact-level dielectric sublayer 80B and comprising phosphorus atoms at a higher atomic concentration than the base contact-level dielectric sublayer 80B.

In one embodiment, the insulating layers 32 comprise a silicon oxide material; and the phosphorus-doped silicon oxide portions (74, 75, 32CP) comprise portions of the insulating layers 32 that are proximal to the lateral isolation trench fill structure {(73, 74, 76), (73, 75), (174, 76)}. In one embodiment, the phosphorus-doped silicon oxide portions (74, 75, 32CP) have a higher atomic concentration of phosphorus atoms than portions of the insulating layers 32 that are located adjacent to the phosphorus-doped silicon oxide portions (74, 75, 32CP). In the second embodiment, the phosphorus-doped silicon oxide portions 32CP are located outside the lateral isolation trench 79 and are vertically spaced from each other.

In one embodiment, the phosphorus-doped silicon oxide portions (74, 75, 32CP) are doped with carbon atoms at an atomic percentage of at least 0.001%.

In the first embodiment, the phosphorus-doped silicon oxide portions (74, 75) are located within the lateral isolation trench 79. The phosphorus-doped silicon oxide portions (74, 75) are portions of a single continuous insulating structure (74, 75) located in the lateral isolation trench 79 and vertically extending from bottommost layers of the pair of alternating stacks (32, 46) to topmost layers of the alternating stacks (32, 46). In one embodiment, the lateral isolation trench fill structure {(73, 74, 76), (73, 75), (174, 76)} comprises an insulating spacer (74, 174) and a conductive fill structure 76.

The various embodiments of the present disclosure can be employed to provide a phosphorus-doped silicate glass material within or around each lateral isolation trench 79 between neighboring pairs of alternating stacks of insulating layers 32 and electrically conductive layers 46. The phosphorus atoms in the phosphorus-doped silicate glass material can function as effective mobile-ion capture atoms that captures mobile ions that diffuse into the phosphorus-doped silicate glass material. For example, fluorine atoms or chlorine atoms that diffuse out of electrically conductive layers 46 or out of the conductive fill structures 76 can be effectively captured by the phosphorus atoms. Therefore, damage caused by the mobile ions to the outer blocking dielectric 44 and/or penetration of the mobile ions into the memory opening fill structures 58 (especially the memory opening fill structures located adjacent to the lateral isolation trenches 79) may be reduced or avoided. This improves the data retention of the memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A three-dimensional memory device, comprising:
a pair of alternating stacks of insulating layers and electrically conductive layers, wherein the pair of alternating stacks are laterally spaced from each other by a lateral isolation trench;
memory openings vertically extending through a respective alternating stack of the pair of alternating stacks;
memory opening fill structures located in a respective one of the memory openings and comprising a respective vertical semiconductor channel and a respective vertical stack of memory elements;
a lateral isolation trench fill structure located in the lateral isolation trench, wherein phosphorus-doped silicon oxide portions are located within or on sidewalls of the lateral isolation trench at levels of the insulating layers; and
further comprising at least one feature selected from:
(a) the phosphorus-doped silicon oxide portions are doped with carbon atoms at an atomic percentage of at least 0.001%; or
(b) the phosphorus-doped silicon oxide portions are located within the lateral isolation trench; or
(c) the lateral isolation trench fill structure comprises an insulating spacer and a conductive fill structure.

2. The three-dimensional memory device of claim 1, wherein the at least one feature comprises the feature (a).

3. The three-dimensional memory device of claim 1, wherein the at least one feature comprises the feature (b).

4. The three-dimensional memory device of claim 3, wherein the phosphorus-doped silicon oxide portions comprise portions of a single continuous insulating structure located in the lateral isolation trench and vertically extending from bottommost layers of the pair of alternating stacks to topmost layers of the alternating stacks.

5. The three-dimensional memory device of claim 1, wherein the at least one feature comprises the feature (c).

6. A three-dimensional memory device, comprising:
a pair of alternating stacks of insulating layers and electrically conductive layers, wherein the pair of alternating stacks are laterally spaced from each other by a lateral isolation trench;
memory openings vertically extending through a respective alternating stack of the pair of alternating stacks;
memory opening fill structures located in a respective one of the memory openings and comprising a respective vertical semiconductor channel and a respective vertical stack of memory elements; and
a lateral isolation trench fill structure located in the lateral isolation trench, wherein phosphorus-doped silicon oxide portions are located within or on sidewalls of the lateral isolation trench at levels of the insulating layers;
wherein:
the vertical semiconductor channel comprises p-type silicon;
a n-type silicon source region doped with phosphorus atoms is located below the lateral isolation trench fill structure; and
the n-type silicon source region is also doped with carbon atoms.

7. The three-dimensional memory device of claim 6, further comprising a carbon doped silicon region located below the n-type silicon source region.

8. A three-dimensional memory device, comprising:
a pair of alternating stacks of insulating layers and electrically conductive layers, wherein the pair of alternating stacks are laterally spaced from each other by a lateral isolation trench;
memory openings vertically extending through a respective alternating stack of the pair of alternating stacks;
memory opening fill structures located in a respective one of the memory openings and comprising a respective vertical semiconductor channel and a respective vertical stack of memory elements;

a lateral isolation trench fill structure located in the lateral isolation trench, wherein phosphorus-doped silicon oxide portions are located within or on sidewalls of the lateral isolation trench at levels of the insulating layers, wherein the phosphorus-doped silicon oxide portions are located on the sidewalls of the lateral isolation trench; and a contact-level dielectric layer overlying the alternating stacks, wherein:

the lateral isolation trench extends through the contact-level dielectric layer; and an additional phosphorus-doped silicon oxide portion is located at a level of the contact-level dielectric layer within or around the lateral isolation trench.

9. The three-dimensional memory device of claim 8, wherein the contact-level dielectric layer comprises:

a base contact-level dielectric sublayer that is laterally spaced from the lateral isolation trench fill structure; and a doped contact-level dielectric sublayer overlying the base contact-level dielectric sublayer and comprising phosphorus atoms at a higher atomic concentration than the base contact-level dielectric sublayer.

10. A three-dimensional memory device, comprising:

a pair of alternating stacks of insulating layers and electrically conductive layers, wherein the pair of alternating stacks are laterally spaced from each other by a lateral isolation trench;

memory openings vertically extending through a respective alternating stack of the pair of alternating stacks;

memory opening fill structures located in a respective one of the memory openings and comprising a respective vertical semiconductor channel and a respective vertical stack of memory elements; and a lateral isolation trench fill structure located in the lateral isolation trench, wherein phosphorus-doped silicon oxide portions are located within or on sidewalls of the lateral isolation trench at levels of the insulating layers;

wherein:

the phosphorus-doped silicon oxide portions are located on the sidewalls of the lateral isolation trench;

the insulating layers comprise a silicon oxide material; and the phosphorus-doped silicon oxide portions comprise portions of the insulating layers that are proximal to the lateral isolation trench fill structure.

11. The three-dimensional memory device of claim 10, wherein the phosphorus-doped silicon oxide portions have a higher atomic concentration of phosphorus atoms than portions of the insulating layers located adjacent to the phosphorus-doped silicon oxide portions.

12. The three-dimensional memory device of claim 10, wherein the phosphorus-doped silicon oxide portions are located outside the lateral isolation trench and are vertically spaced from each other.

13. A method of forming a three-dimensional memory device, comprising:

forming two alternating stacks of insulating layers and electrically conductive layers, wherein the two alternating stacks are laterally spaced from each other by a lateral isolation trench, forming memory openings through each of the two alternating stacks;

forming memory opening fill structures comprising a respective vertical semiconductor channel and a respective vertical stack of memory elements in the respective memory openings;

forming phosphorus-doped silicon oxide portions within or on sidewalls of the lateral isolation trench at levels of the insulating layers; and forming a lateral isolation trench fill structure in the lateral isolation trench; and further comprising at least one feature selected from:

(d) the insulating layers comprise silicon oxide; and the step of forming the phosphorus-doped silicon oxide portions on sidewalls of the lateral isolation trench comprises performing at least one ion implantation process that implants phosphorous atoms into surface portions of the insulating layers that are proximal to the lateral isolation trench, wherein the phosphorus-doped silicon oxide portions comprise implanted portions of the insulating layers; or (e) the step of forming the phosphorus-doped silicon oxide portions within the lateral isolation trench comprises depositing a phosphorus-doped silicate glass spacer at least in a peripheral region of the lateral isolation trench, wherein the phosphorus-doped silicon oxide portions comprise portions of the phosphorus-doped silicate glass spacer; or (f) the lateral isolation trench fill structure comprises a conductive fill structure that is formed within and is laterally surrounded by the phosphorus-doped silicon oxide portions.

14. The method of claim 13, wherein the at least one feature comprises the feature (d).

15. The method of claim 14, further comprising performing at least one additional ion implantation process that implants carbon atoms into the phosphorus-doped silicon oxide portions.

16. The method of claim 15, wherein a surface portion of the at least one semiconductor material that underlies the lateral isolation trench is doped with the phosphorus atoms during the at least one ion implantation process and is doped with the carbon atoms during the at least one additional ion implantation process.

17. The method of claim 13, wherein the at least one feature comprises the feature (e).

18. The method of claim 13, wherein the at least one feature comprises the feature (f).

* * * * *